US010191373B2

(12) United States Patent
Hatakeyama et al.

(10) Patent No.: US 10,191,373 B2
(45) Date of Patent: Jan. 29, 2019

(54) METHOD FOR PRODUCING POLYMER

(71) Applicant: Shin-Etsu Chemical Co., Ltd., Tokyo (JP)

(72) Inventors: Jun Hatakeyama, Joetsu (JP); Teppei Adachi, Joetsu (JP); Kenji Funatsu, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 39 days.

(21) Appl. No.: 15/383,797

(22) Filed: Dec. 19, 2016

(65) Prior Publication Data
US 2017/0097567 A1    Apr. 6, 2017

Related U.S. Application Data

(63) Continuation-in-part of application No. 15/015,554, filed on Feb. 4, 2016.

(30) Foreign Application Priority Data

Feb. 5, 2015    (JP) ................................. 2015-021331

(51) Int. Cl.
G03F 7/039    (2006.01)
C08F 220/18    (2006.01)
C08F 220/28    (2006.01)
G03F 7/004    (2006.01)
G03F 7/16    (2006.01)
C08F 228/02    (2006.01)
G03F 7/038    (2006.01)

(52) U.S. Cl.
CPC .......... *G03F 7/0397* (2013.01); *C08F 220/18* (2013.01); *C08F 220/28* (2013.01); *C08F 228/02* (2013.01); *G03F 7/0045* (2013.01); *G03F 7/0046* (2013.01); *G03F 7/0382* (2013.01); *G03F 7/168* (2013.01); *C08F 2220/1833* (2013.01); *C08F 2220/281* (2013.01); *C08F 2220/282* (2013.01)

(58) Field of Classification Search
CPC .... C08F 236/02; C08F 220/28; C08F 228/02; G03F 7/0382; G03F 7/168; G03F 7/30; G03F 7/20
See application file for complete search history.

(56) References Cited

U.S. PATENT DOCUMENTS

| | | | |
|---|---|---|---|
| 7,482,108 B2 | 1/2009 | Matsumaru et al. |
| 7,569,326 B2 | 8/2009 | Ohsawa et al. |
| 7,812,105 B2 | 10/2010 | Nagai et al. |
| 7,897,821 B2 | 3/2011 | Nagai et al. |
| 7,932,334 B2 | 4/2011 | Ando et al. |
| 2006/0078821 A1 | 4/2006 | Shimizu et al. |
| 2012/0183904 A1 | 7/2012 | Sagehashi et al. |
| 2012/0264054 A1 | 10/2012 | Yamaguchi |
| 2013/0224660 A1 | 8/2013 | Ohashi et al. |
| 2013/0260313 A1 | 10/2013 | Allen et al. |
| 2013/0260319 A1 | 10/2013 | Arai et al. |

FOREIGN PATENT DOCUMENTS

| | | |
|---|---|---|
| JP | 2006-45311 A | 2/2006 |
| JP | 2006-178317 A | 7/2006 |
| JP | 2006-343704 A | 12/2006 |
| JP | 2007-197718 A | 8/2007 |
| JP | 2008-133448 A | 6/2008 |
| JP | 2011-168698 A | 9/2011 |
| JP | 2012-173438 A | 9/2012 |
| JP | 2013-80685 A | 5/2013 |
| JP | 5548473 B2 | 7/2014 |
| WO | 2006/121096 A1 | 11/2006 |

OTHER PUBLICATIONS

Office Action dated Sep. 19, 2017, issued in counterpart Japanese Application No. 2015-021331, with English machine translation. (9 pages).
Kishikawa et al., "Assessment of trade-off between resist resolution and sensitivity for optimization of hyper-NA immersion lithography", Proc. of SPIE, 2007, vol. 6520, pp. 65203L-1-65203L-9, (9 pages).
Non-Final Office Action dated Sep. 29, 2016, issued in U.S. Appl. No. 15/015,554 (26 pages).

*Primary Examiner* — Cynthia Hamilton
(74) *Attorney, Agent, or Firm* — Westerman, Hattori, Daniels & Adrian, LLP

(57) ABSTRACT

A polymer comprising recurring units having an acid generator bound to the backbone, and recurring units having an optionally acid labile group-substituted carboxyl group and/or recurring units having an optionally acid labile group-substituted hydroxyl group is obtained by polymerizing corresponding monomers in a solution of a non-polymerizable compound containing a nitrogen atom to which an acid labile group is bound. This prevents deprotection reaction of the acid labile group in the case of positive resist-forming polymer or crosslinking reaction in the case of negative resist-forming polymer.

7 Claims, No Drawings

METHOD FOR PRODUCING POLYMER

CROSS-REFERENCE TO RELATED APPLICATION

This application is a continuation-in-part of copending application Ser. No. 15/015,554 filed on Feb. 4, 2016, which claims priority under 35 U.S.C. § 119(a) on Patent Application No. 2015-021331 filed in Japan on Feb. 5, 2015, the entire contents of which are hereby incorporated by reference.

TECHNICAL FIELD

This invention relates to a method for producing a polymer, especially a polymer having an acid generator bound to its backbone.

BACKGROUND ART

To meet the demand for higher integration density and operating speed of LSIs, the effort to reduce the pattern rule is in rapid progress. The wide-spreading flash memory market and the demand for increased storage capacities drive forward the miniaturization technology. As the advanced miniaturization technology, manufacturing of microelectronic devices at the 65-nm node by the ArF lithography has been implemented in a mass scale. Manufacturing of 45-nm node devices by the next generation ArF immersion lithography is approaching to the verge of high-volume application. The candidates for the next generation 32-nm node include ultra-high NA lens immersion lithography using a liquid having a higher refractive index than water in combination with a high refractive index lens and a high refractive index resist film, extreme ultraviolet (EUV) lithography of 13.5 nm wavelength, and double patterning version of the ArF lithography, on which active research efforts have been made.

With respect to high-energy radiation of very short wavelength such as EB or X-ray, hydrocarbons and similar light elements used in resist materials have little absorption. Then resist materials based on polyhydroxystyrene composed mainly of hydrocarbon are under consideration.

The exposure system for mask manufacturing made a transition from the laser beam exposure system to the EB exposure system to increase the accuracy of line width. Since a further size reduction became possible by increasing the accelerating voltage of the electron gun in the EB exposure system, the accelerating voltage increased from 10 kV to 30 kV and reached 50 kV in the current mainstream system, with a voltage of 100 kV being under investigation.

As the accelerating voltage increases, a lowering of sensitivity of resist film becomes of concern. As the accelerating voltage increases, the influence of forward scattering in a resist film becomes so reduced that the contrast of electron image writing energy is improved to ameliorate resolution and dimensional control. However, electrons can pass straightforward through the resist film so that the resist film becomes less sensitive. Since the mask exposure tool is designed for exposure by direct continuous writing, a lowering of sensitivity of resist film leads to an undesirably reduced throughput. Due to a need for higher sensitivity, chemically amplified resist compositions are studied.

As the feature size reduces, image blurs due to acid diffusion become a problem. To insure resolution for fine patterns with a size of 45 nm et seq., not only an improvement in dissolution contrast is important as previously reported, but control of acid diffusion is also important as reported in Non-Patent Document 1.

The addition of an acid generator capable of generating a bulky acid is an effective means for suppressing acid diffusion. There was proposed a polymer comprising recurring units derived from an onium salt having a polymerizable olefin as the acid generator. Patent Document 1 discloses a sulfonium salt having polymerizable olefin capable of generating a specific sulfonic acid and a similar iodonium salt. Patent Documents 2 to 5 disclose a sulfonium salt having sulfonic acid directly bound to the backbone.

If the onium salt having polymerizable olefin is decomposed during polymerization, it generates an acid, with which deprotection of the acid labile group on the acid labile group-bearing recurring unit takes place. If deprotection reaction occurs during polymerization, the unexposed region of the positive resist film using the polymer is also dissolved in alkaline developer, failing to form a pattern. As means for suppressing deprotection reaction during polymerization, Patent Document 6 proposes to add a basic compound to a polymerization solution prior to polymerization reaction.

CITATION LIST

Patent Document 1: JP-A 2006-045311 (U.S. Pat. No. 7,482,108)
Patent Document 2: JP-A 2006-178317
Patent Document 3: WO 2006/121096
Patent Document 4: JP-A 2007-197718
Patent Document 5: JP-A 2008-133448 (U.S. Pat. No. 7,569,326)
Patent Document 6: JP 5548473
Non-Patent Document 1: SPIE Vol. 6520 65203L-1 (2007)

SUMMARY OF INVENTION

An object of the present invention is to provide a method for producing a polymer having an acid generator (in the form of an onium salt having polymerizable olefin) bound to its backbone, an acid labile group, and optionally an adhesive group (typically lactone), which can be synthesized in a consistent and reproducible manner in the sense that neither the acid labile group nor the adhesive group is decomposed even when the acid generator generates an acid during polymerization.

On copolymerization of an onium salt having polymerizable olefin with an olefin having a carboxyl or hydroxyl group substituted with an acid labile group, if decomposition of the onium salt occurs even in a limited slight amount, elimination of the acid labile group occurs. When a polymer having undergone elimination of the acid labile group is used as a positive tone resist material, the expected resolution performance is not obtainable. Similarly, on copolymerization of an onium salt having polymerizable olefin with an olefin having a carboxyl or hydroxyl group not substituted with an acid labile group, if the hydroxyl group is crosslinkable with the aid of acid, crosslinking reaction takes place during polymerization. When a polymer having undergone crosslinking reaction is used as a negative tone resist material, the expected resolution performance is not obtainable.

Effective means for preventing photo-decomposition of the onium salt during polymerization includes shielding of the reactor from light and to carry out polymerization under illumination of a yellow fluorescent lamp, LED or organic EL with light of wavelength 400 nm or shorter being cut off. In particular, since the illumination of an LED or organic EL lamp with light of wavelength 400 nm or shorter cut off is not the yellow illumination produced by the yellow fluorescent lamp, colors inclusive of yellow can be distinguished, leading to ease of working. However, there is a possibility that decomposition of the onium salt also occurs by heat, and/or a trace of acid is present in the onium salt as an impurity. In such a situation, even when polymerization is carried out under the UV-shielded environment, the heat during polymerization can induce deprotection of the acid labile group or crosslinking of the crosslinkable hydroxyl group.

Patent Document 6 describes polymerization of a monomer solution to which a basic compound has been added. Even when the acid generator bound to the polymer backbone is decomposed to generate an acid, the acid is neutralized with the basic compound. This prevents decomposition of the acid labile group on the polymer (for positive tone resist) during polymerization. However, a resist composition comprising the polymer obtained from this method lacks long-term storage stability. Also, the polymerization procedure with the basic compound added can prevent decomposition of the acid labile group to some extent even when the onium salt is photo-decomposed. However, when recurring units having lactone are copolymerized, there is a possibility that the lactone is decomposed with the basic compound.

The inventors have found that for producing a polymer having an acid generator (in the form of an onium salt having polymerizable olefin) bound to its backbone, an acid labile group, and optionally an adhesive group (typically lactone), in a consistent and reproducible manner in the sense that neither the acid labile group nor the adhesive group is decomposed even when a slight amount of the acid generator is decomposed to generate an acid during polymerization, it is effective to polymerize monomers in a solution to which a non-polymerizable compound containing at least one nitrogen atom to which at least one acid labile group is bound has been added. Then a polymer having an acid generator (in the form of an onium salt having polymerizable olefin) bound to its backbone can be produced without a potential risk of reaction of the acid labile group or crosslinking group during polymerization. A resist material featuring suppressed acid diffusion and minimized edge roughness is available in a consistent manner.

Accordingly, in one aspect, the invention provides a method for producing a polymer comprising recurring units having an acid generator bound to the backbone, comprising polymerizing monomers corresponding to the recurring units in a solution of a non-polymerizable compound containing at least one nitrogen atom to which at least one acid labile group is bound.

In a preferred embodiment, the non-polymerizable compound has the formula (A) or (B).

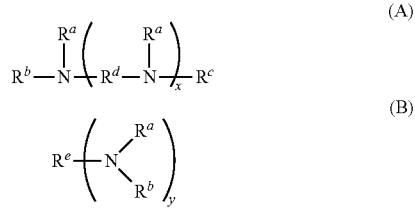

Herein $R^a$ is an acid labile group; $R^b$ and $R^c$ are each independently hydrogen, an acid labile group, hydroxyl, a straight, branched or cyclic $C_1$-$C_{20}$, alkoxy, straight, branched or cyclic $C_2$-$C_{20}$ alkoxycarbonyl, straight, branched or cyclic $C_1$-$C_{20}$ alkyl, $C_6$-$C_{20}$, aryl, $C_2$-$C_{20}$ heterocyclic, or straight, branched or cyclic $C_2$-$C_{20}$ alkenyl group, in which at least one carbon-bonded hydrogen atom may be substituted by halogen, hydroxyl, carboxyl, alkoxy, alkoxycarbonyl, acyl, acyloxy, thiol, carbonyl, amino, sulfone, sulfonamide, glycidyl, isocyanate, thioisocyanate, lactone ring, lactam ring, acid anhydride or substituted or unsubstituted boronic acid, and in which at least one carbon atom may be replaced by an ester, ether, thioether, amide or sulfonyl group, or $R^b$ and $R^c$ may bond together to form a ring; $R^d$ is a single bond or divalent organic group; $R^e$ is a y-valent organic group; x is an integer of 0 to 4, and y is 3 or 4.

In a preferred embodiment, the recurring units having an acid generator bound to the backbone are units of at least one type selected from recurring units having the formulae (1) to (3).

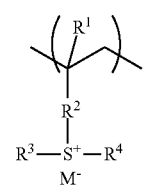

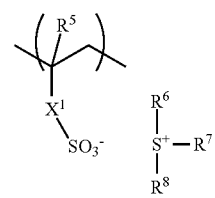

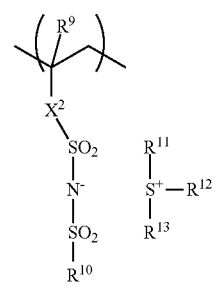

Herein $R^1$, $R^5$ and $R^9$ are each independently hydrogen or methyl. $R^2$ is a single bond, phenylene, —O—R— or —C(=O)—$Y^0$—R—, wherein $Y^0$ is oxygen or NH, and R is a straight, branched or cyclic $C_1$-$C_6$ alkylene, straight, branched or cyclic $C_2$-$C_6$ alkenylene, or phenylene group, which may contain a carbonyl (—CO—), ester (—COO—), ether (—O—), sulfonic acid ester (—OS(O$_2$)—), sulfonamide (—NH—S(O$_2$)—) or hydroxyl moiety. $R^3$, $R^4$, $R^6$, $R^7$, $R^8$, $R^{11}$, $R^{12}$ and $R^{13}$ are each independently a straight, branched or cyclic $C_1$-$C_{12}$ alkyl group which may contain a carbonyl, ester or ether moiety, or a $C_6$-$C_{12}$ aryl, $C_7$-$C_{20}$, aralkyl, or thiophenyl group. $X^1$ and $X^2$ are each independently a single bond, methylene, ethylene, phenylene, fluorinated phenylene, —O—$R^{14}$—, or —C(=O)—$Z^1$—$R^{14}$—, wherein $Z^1$ is oxygen or NH, and $R^{14}$ is a straight, branched or cyclic $C_1$-$C_6$ alkylene, alkenylene, or phenylene group, which may contain a carbonyl, ester, ether, sulfonic acid ester, sulfonamide or hydroxyl moiety, or which may be fluorinated. $R^{10}$ is a $C_1$-$C_4$ fluoroalkyl or $C_6$-$C_{10}$ fluoroaryl group. $M^-$ is a non-nucleophilic counter ion.

In a preferred embodiment, the polymer further comprises recurring units of at least one selected from recurring units having a carboxyl group optionally substituted with an acid labile group and recurring units having a hydroxyl group optionally substituted with an acid labile group.

In a preferred embodiment, the recurring units having a carboxyl group optionally substituted with an acid labile group and the recurring units having a hydroxyl group optionally substituted with an acid labile group have the following formulae (4) and (5), respectively.

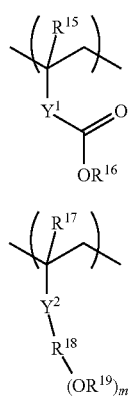

Herein $R^{15}$ and $R^{17}$ are each independently hydrogen or methyl. $R^{16}$ and $R^{19}$ are each independently hydrogen or an acid labile group. $Y^1$ is a single bond, phenylene, naphthylene or —C(=O)—O—$R^{20}$—, wherein $R^{20}$ is a straight, branched or cyclic $C_1$-$C_{10}$ alkylene group which may contain an ether, ester, lactone ring or hydroxyl moiety, or phenylene or naphthylene group. $Y^2$ is a single bond, a phenylene or naphthylene group which may have a nitro, cyano or halogen moiety, or —C(=O)—O—$R^{21}$—, —C(=O)—NH—$R^{21}$—, —O—$R^{21}$—, or —S—$R^{21}$—, wherein $R^{21}$ is a straight, branched or cyclic $C_1$-$C_{10}$ alkylene group which may contain an ether, ester, lactone ring or hydroxyl moiety, or a phenylene or naphthylene group which may contain a straight, branched or cyclic $C_1$-$C_6$ alkyl, $C_2$-$C_6$ alkenyl, $C_6$-$C_{10}$ aryl, alkoxy, acyl, acyloxy, alkoxycarbonyl, nitro, cyano or halogen moiety. $R^{18}$ is a single bond, or a straight, branched or cyclic, $C_1$-$C_{16}$, di- to pentavalent, aliphatic hydrocarbon group or phenylene group, which may contain an ether or ester moiety, and m is an integer of 1 to 4.

In a preferred embodiment, the polymerization is carried out under such illumination that the quantity of light of wavelength up to 400 nm is 0.05 mW/cm² or less.

In a preferred embodiment, the illumination is provided by yellow lamps, LED lamps or organic EL lamps.

In another aspect, the invention provides the invention provides a polymer obtained by the method defined above.

In another aspect, the invention provides a chemically amplified resist composition comprising the polymer defined above, an organic solvent, and optionally a basic compound and/or surfactant.

In a further aspect, the invention provides a pattern forming process comprising the steps of applying the resist composition onto a substrate, baking, exposing to high-energy radiation, and developing in a developer. Typically, the high-energy radiation is i-line, KrF excimer laser, ArF excimer laser, EB, or soft x-ray of wavelength in the range of 3 to 15 nm.

Advantageous Effects of Invention

The inventive polymer is obtained from polymerization of monomers in a solution of the non-polymerizable compound containing a nitrogen atom to which an acid labile group is bound. Even when a slight amount of the acid generator is decomposed during polymerization or a trace amount of acid impurity is present in the acid generator, this polymerization procedure inhibits concomitant deprotection reaction of the acid labile group in the case of a positive resist-forming polymer, or concomitant crosslinking reaction during polymerization in the case of a negative resist-forming polymer. The polymer is formulated into a resist composition featuring minimized edge roughness. The resist composition comprising the polymer may be used not only in the lithography for forming semiconductor circuits, but also in the formation of mask circuit patterns, micromachines, and thin-film magnetic head circuits.

DESCRIPTION OF EMBODIMENTS

As used herein, the singular forms "a," "an" and "the" include plural referents unless the context clearly dictates otherwise. "Optional" or "optionally" means that the subsequently described event or circumstances may or may not occur, and that description includes instances where the event or circumstance occurs and instances where it does not. The notation (Cn-Cm) means a group containing from n to m carbon atoms per group.

The acronym "PEB" stands for post-exposure bake, "LWR" for line width roughness, "EUV" for extreme ultraviolet, and "EB" for electron beam.

Method for Producing Polymer

One embodiment of the invention is a method for producing a polymer comprising recurring units having an acid generator bound to the backbone, comprising polymerizing monomers corresponding to the recurring units in a solution of a non-polymerizable compound containing at least one nitrogen atom to which at least one acid labile group is bound.

In one preferred embodiment, the non-polymerizable compound has the formula (A) or (B).

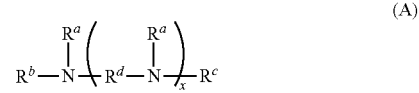

Herein $R^a$ is an acid labile group. $R^b$ and $R^c$ are each independently hydrogen, an acid labile group, hydroxyl, a straight, branched or cyclic $C_1$-$C_{20}$ alkoxy group, straight, branched or cyclic $C_2$-$C_{20}$ alkoxycarbonyl group, straight, branched or cyclic $C_1$-$C_{20}$ alkyl group, $C_6$-$C_{20}$ aryl group, $C_2$-$C_{20}$ heterocyclic group, or straight, branched or cyclic $C_2$-$C_{20}$ alkenyl group, in which at least one carbon-bonded hydrogen atom may be substituted by halogen, hydroxyl, carboxyl, alkoxy, alkoxycarbonyl, acyl, acyloxy, thiol, carbonyl, amino, sulfone, sulfonamide, glycidyl, isocyanate, thioisocyanate, lactone ring, lactam ring, acid anhydride or substituted or unsubstituted boronic acid, and in which at least one carbon atom may be replaced by an ester, ether, thioether, amide or sulfonyl group, or $R^b$ and $R^c$ may bond together to form a ring. $R^d$ is a single bond or divalent organic group. $R^e$ is a y-valent organic group, x is an integer of 0 to 4, and y is 3 or 4.

When $R^b$ and/or $R^c$ is an acid labile group, it may be identical with or different from $R^a$. The acid labile group will be described later.

JP-A 2013-064971 describes an example wherein a polymerizable compound having an acid labile group-substituted amino group is added to a monomer, and polymerization is carried out to form a polymer comprising recurring units having an acid generator bound to the main chain. The polymerizable compound, which is added to the monomer, is copolymerized as part of the base polymer. Since the polymerizable compound functions as a quencher, the resulting resist becomes lower in sensitivity. In contrast, according to the invention, a non-polymerizable compound containing nitrogen atom having at least one acid labile group bound thereto is added before polymerization is carried out. After polymerization, the non-polymerizable compound can be removed by a suitable treatment such as polymer washing or crystallization. Thus, even though the non-polymerizable compound is added to the polymerization system, the resulting resist is not reduced at all in sensitivity.

The invention is characterized in that a non-polymerizable compound containing nitrogen atom having at least one acid labile group bound thereto is added when a polymerizable acid generator is polymerized. Even when part of the polymerizable acid generator is decomposed with the aid of light or acid during the polymerization step, or even when a minor amount of acid is present as an incidental impurity of the polymerizable acid generator, the acid labile group on the non-polymerizable compound is quickly eliminated to form a basic compound, which neutralizes the acid, thus preventing deprotection reaction of acid labile groups on the polymer or crosslinking reaction of crosslinkable hydroxyl groups thereon. The acid labile group on the non-polymerizable compound has a high reactivity and is more sensitive to acid than the acid labile group on the polymer. Therefore, the reaction to form the basic compound precedes the deprotection reaction of the polymer. Also, since the non-polymerizable compound protected with an acid labile group is neutral, it does not cause decomposition of the acid generator, and in the case of the acid generator being free of acid impurity, the polymerization solution is kept neutral.

Adhesive groups such as lactone and acid anhydride are hydrolyzable with a basic compound. If a basic compound is added prior to polymerization of a polymerizable acid generator, then decomposition of the acid labile group is prevented, but decomposition of the adhesive group is possible. To inhibit hydrolytic reaction of the adhesive group, it is desirable that the polymerization solution be kept neutral. When polymerization is carried out by the inventive method, there is obtained the advantage that deprotection of the acid labile group during polymerization is prevented and decomposition of the adhesive group is prevented at the same time.

Illustrative, non-limiting examples of the compounds having formulae (A) and (B) are shown below. Notably $R^a$ and $R^b$ are as defined above.

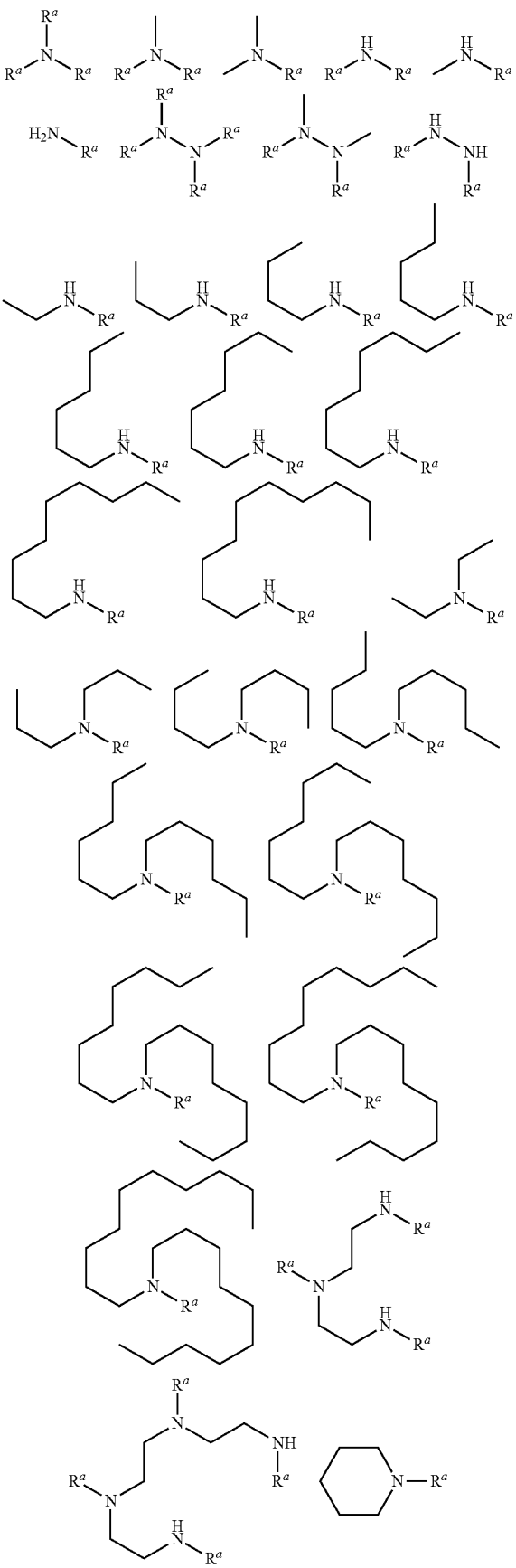

-continued
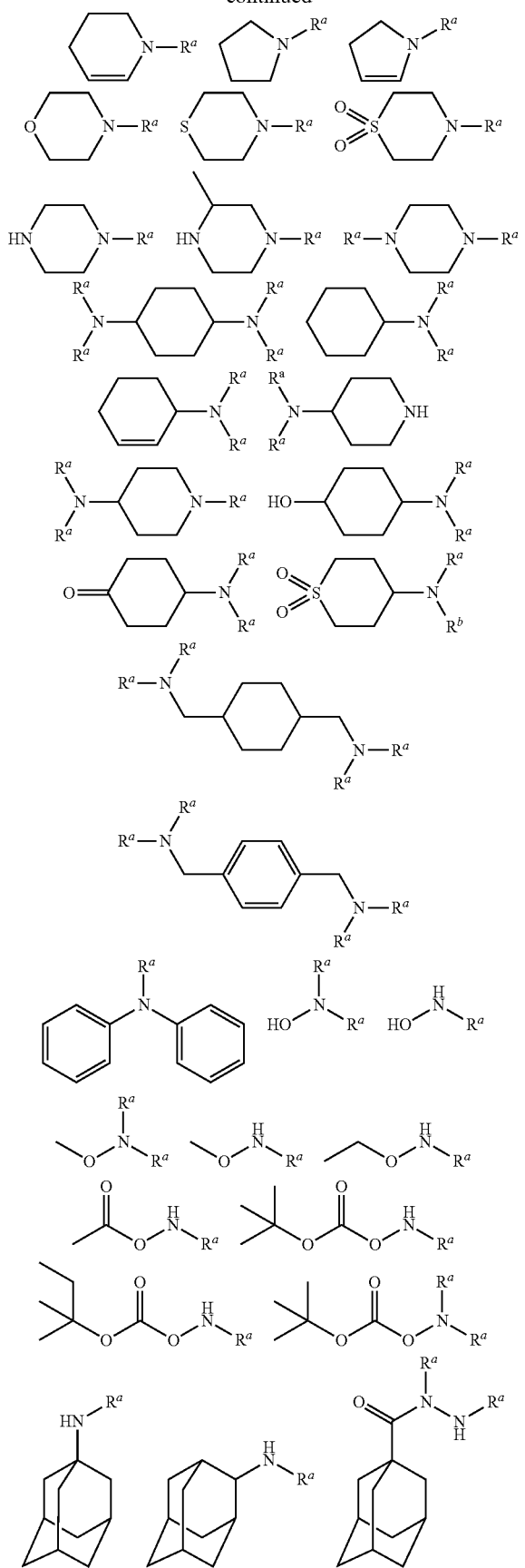
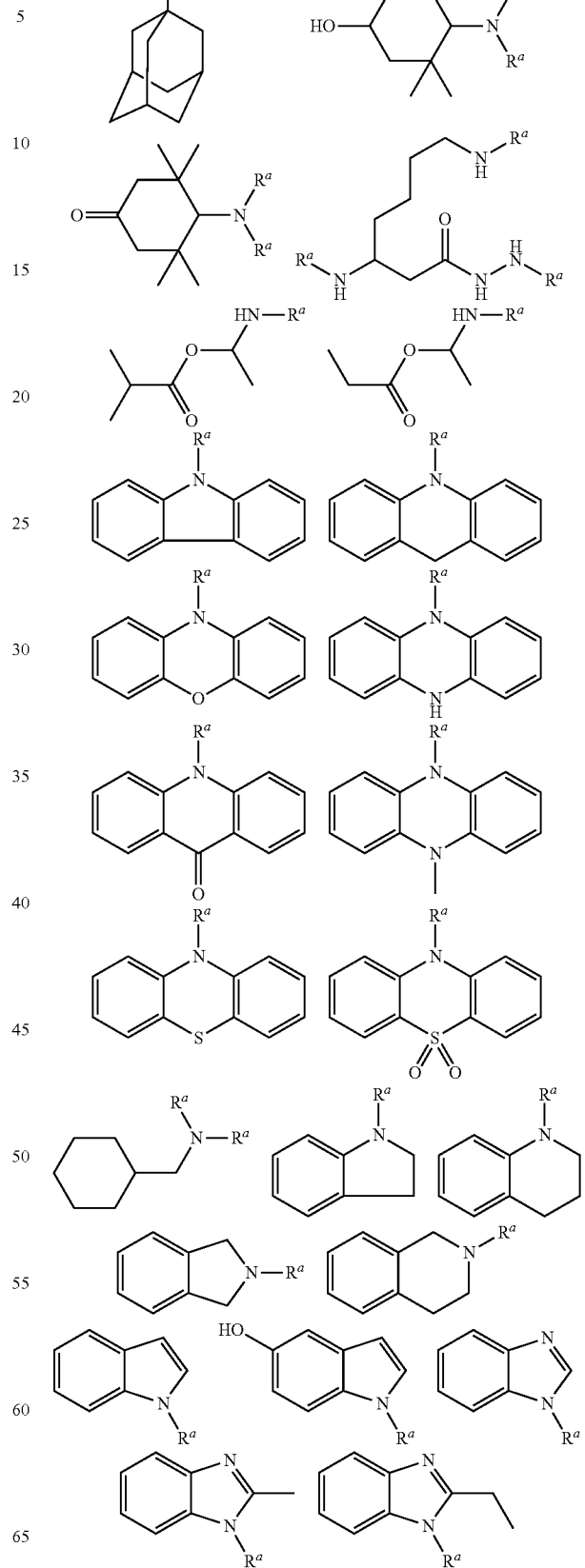

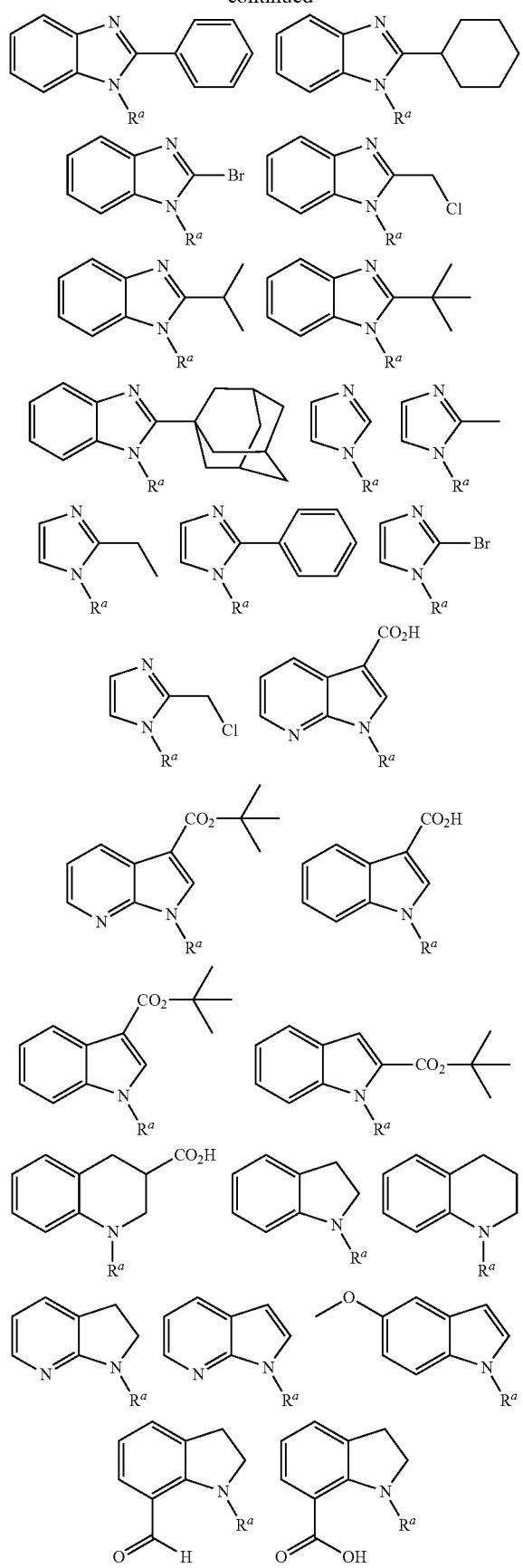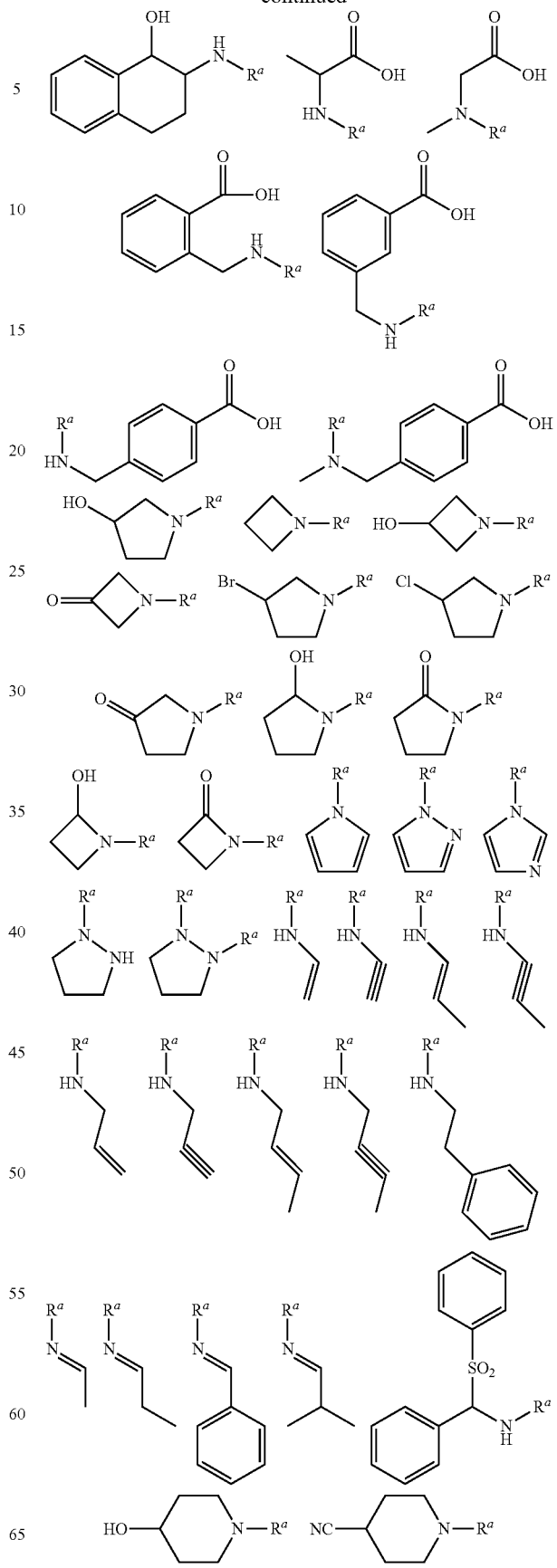

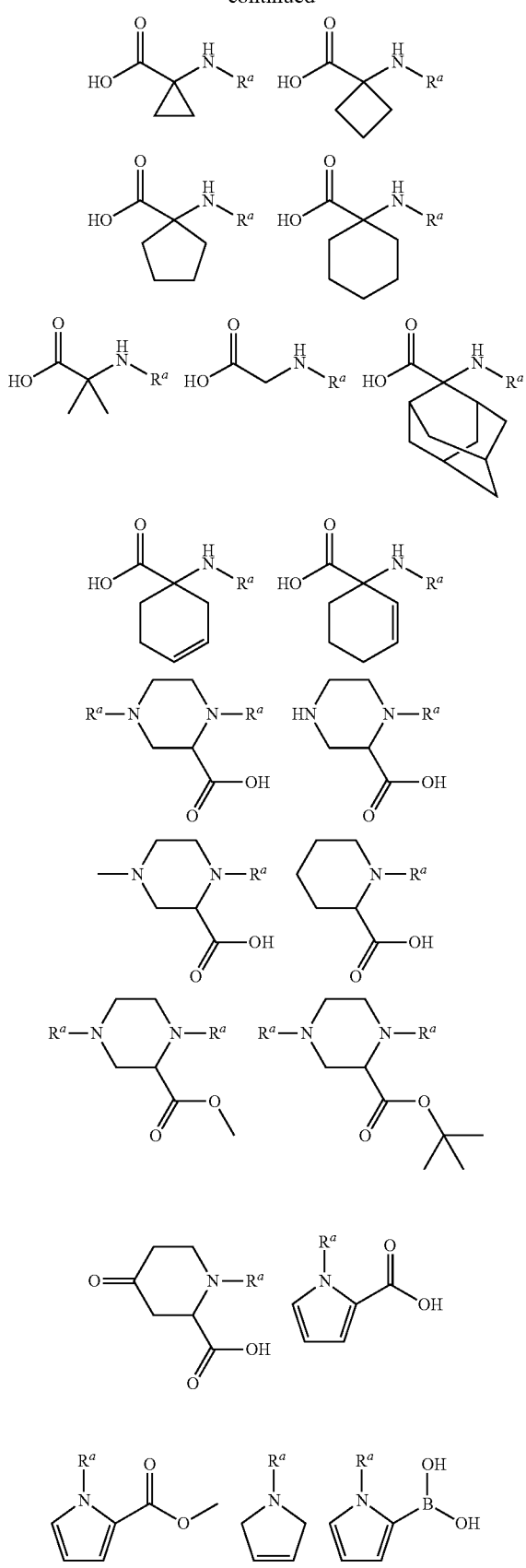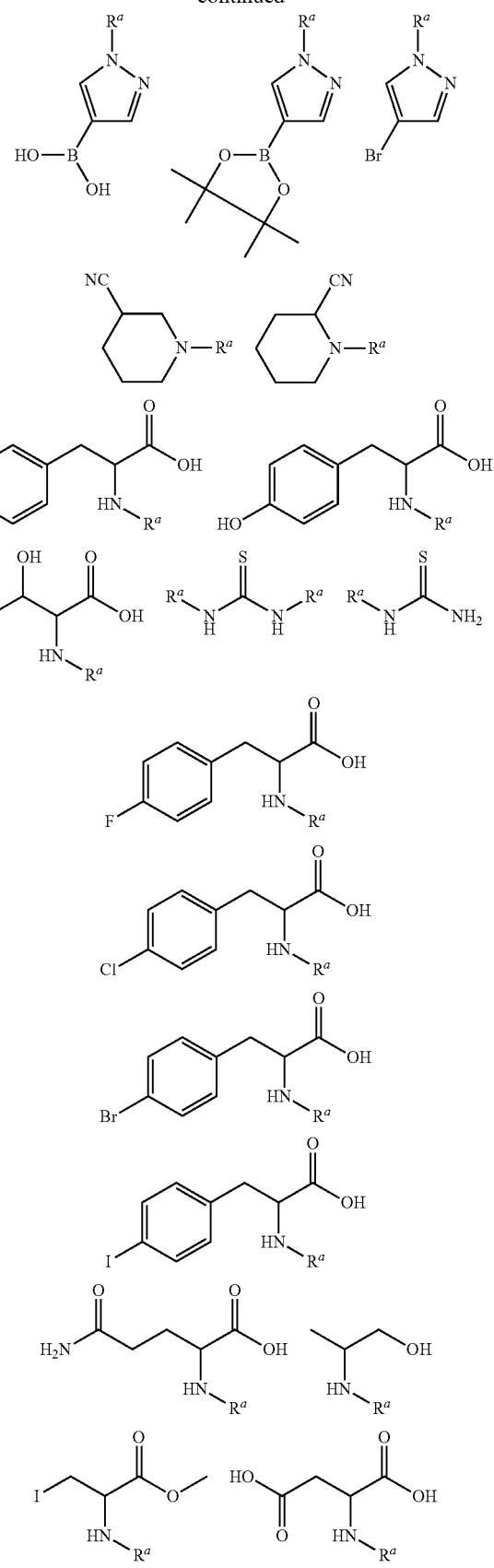

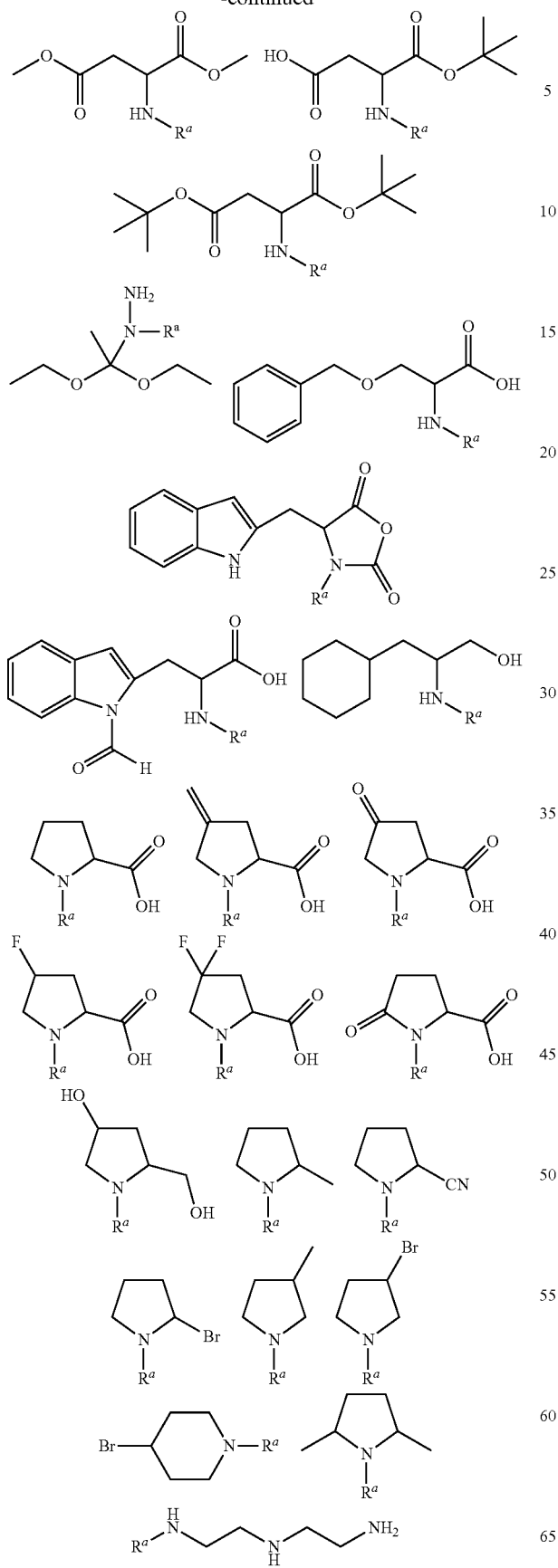
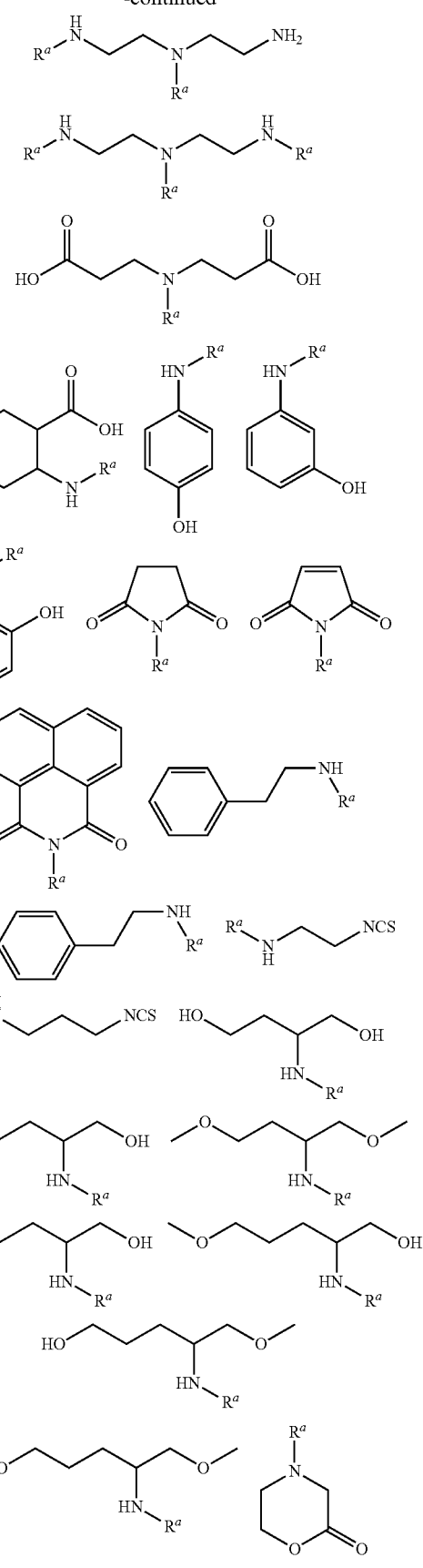

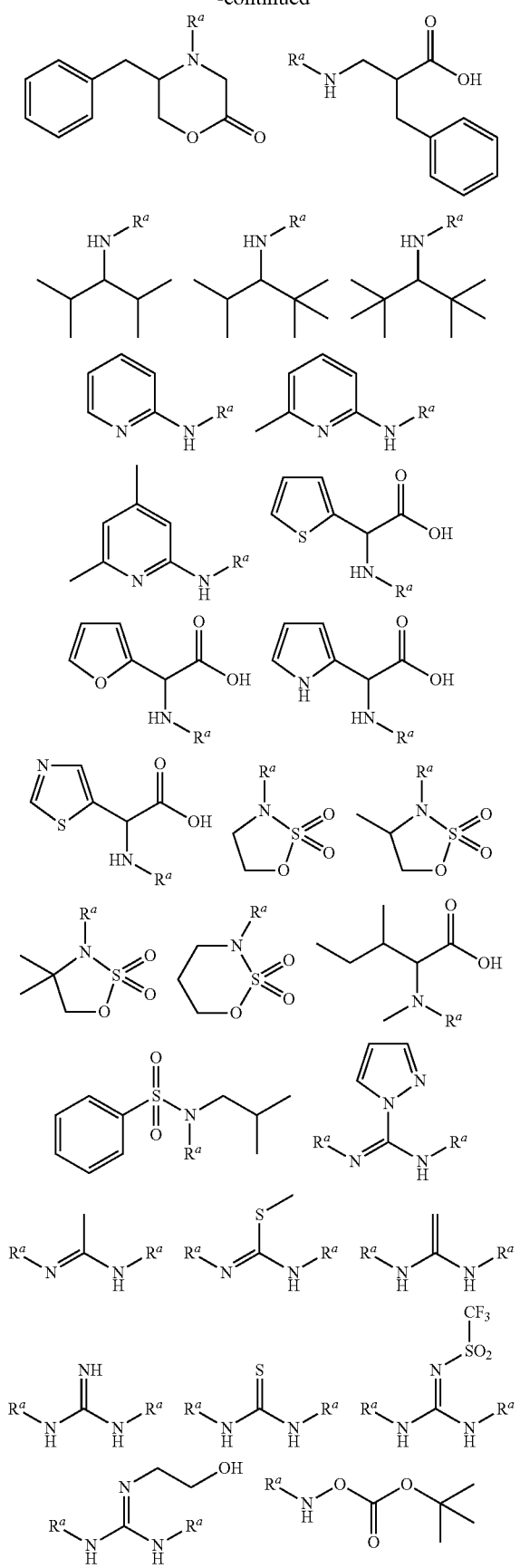
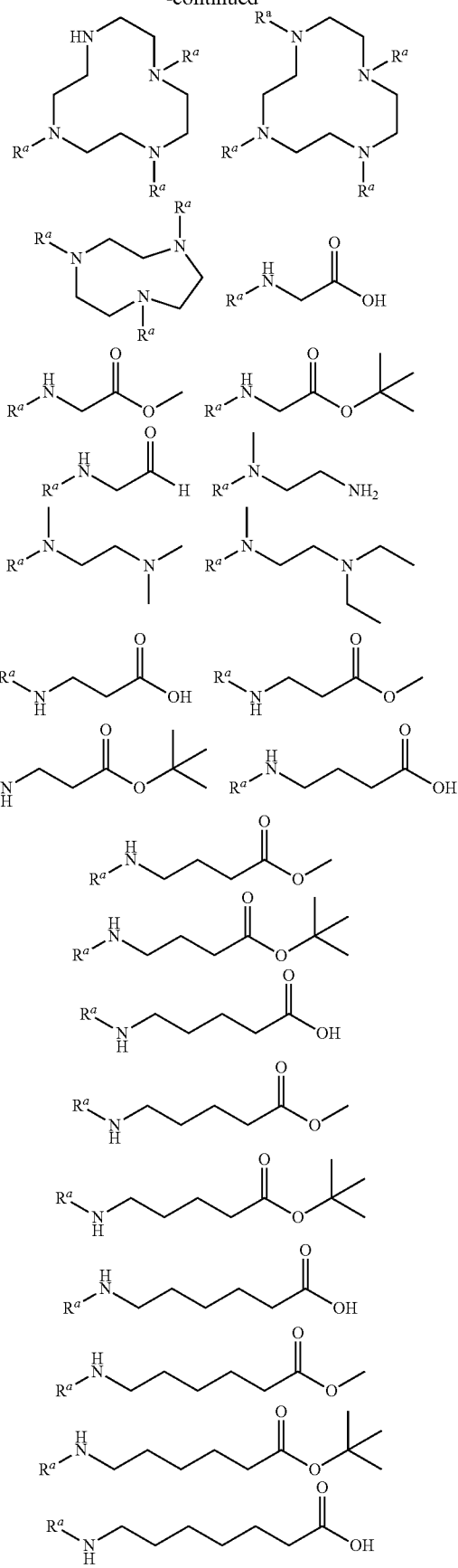

-continued
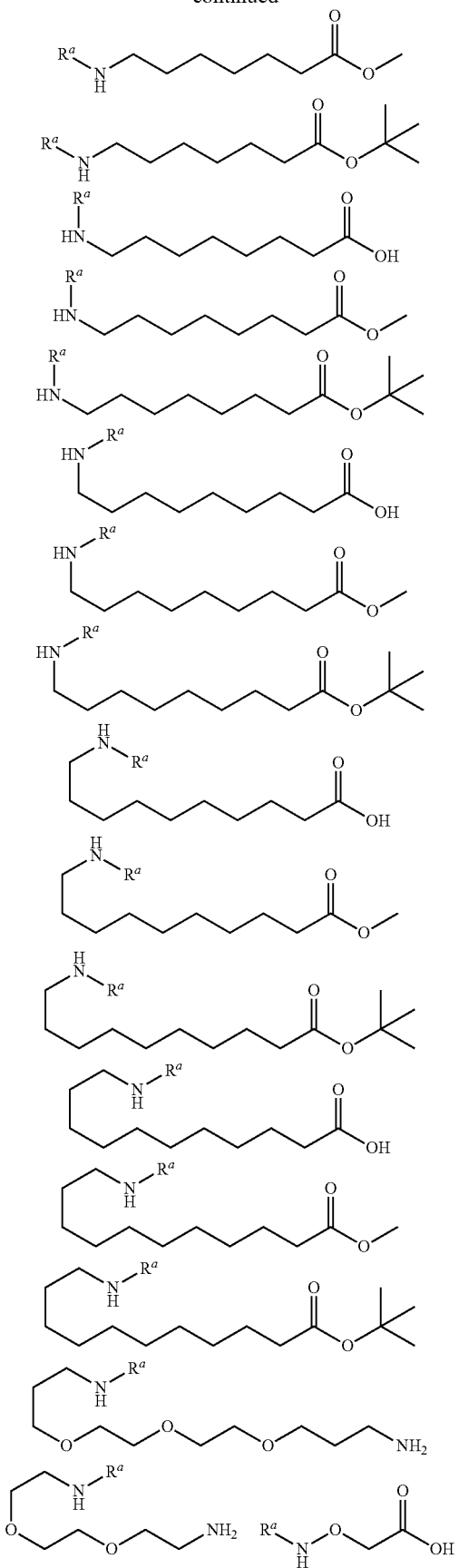
-continued
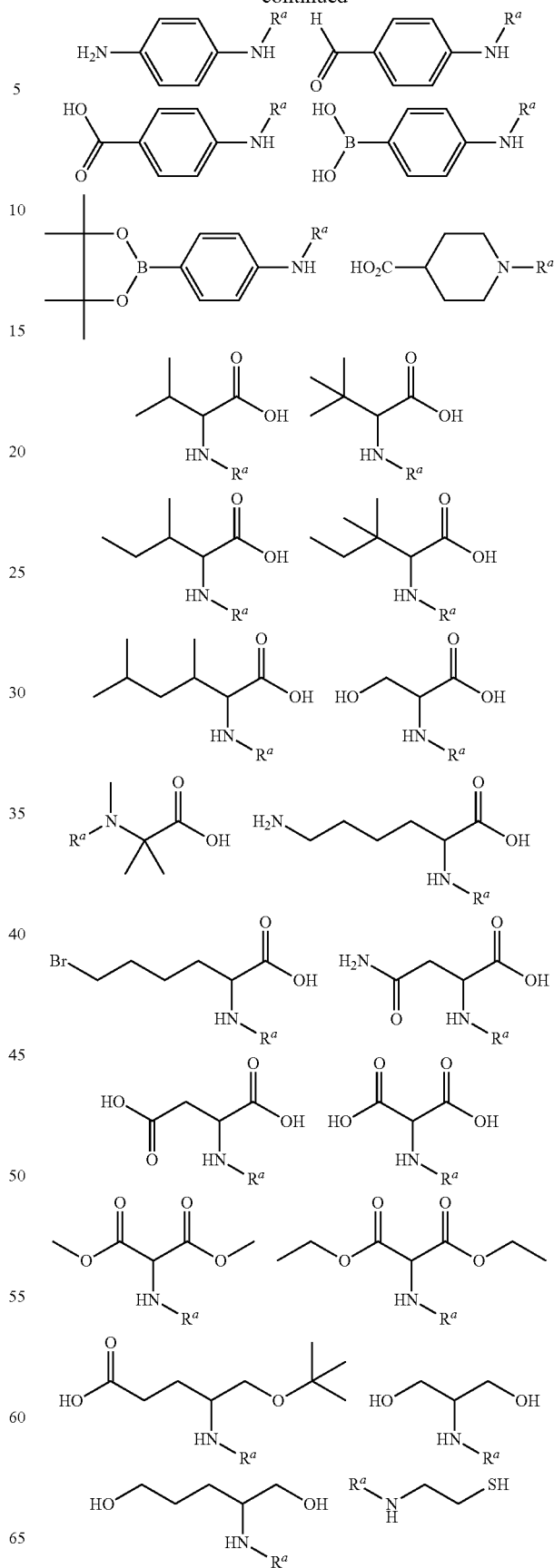

21
-continued
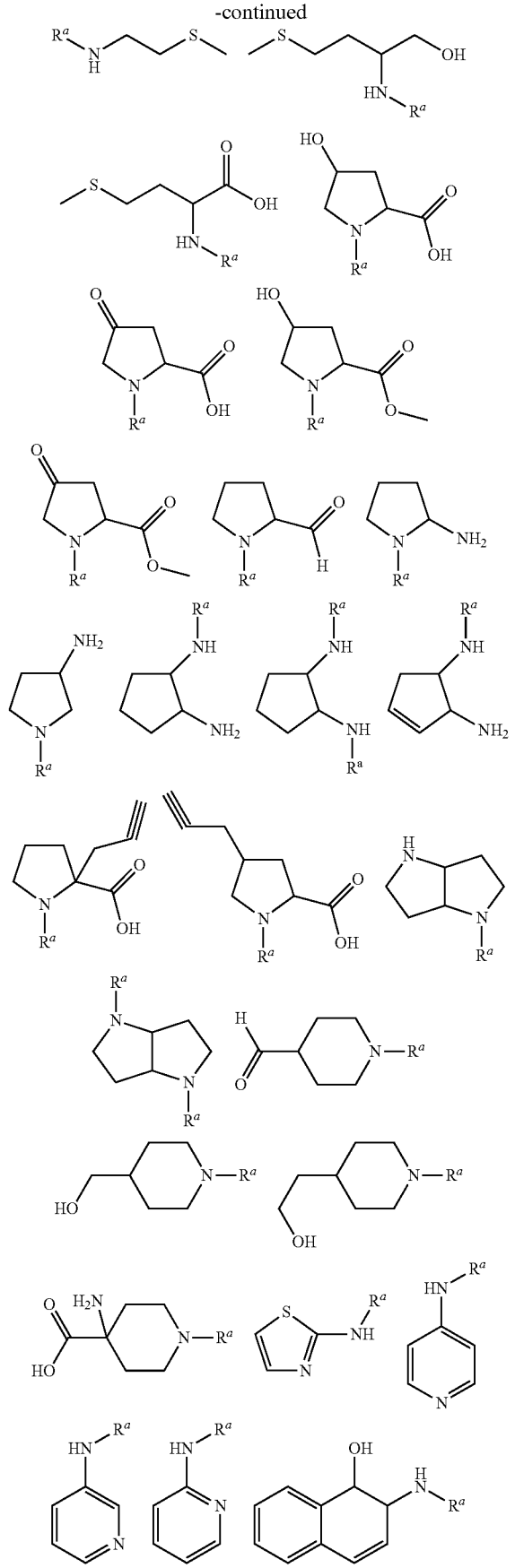
22
-continued
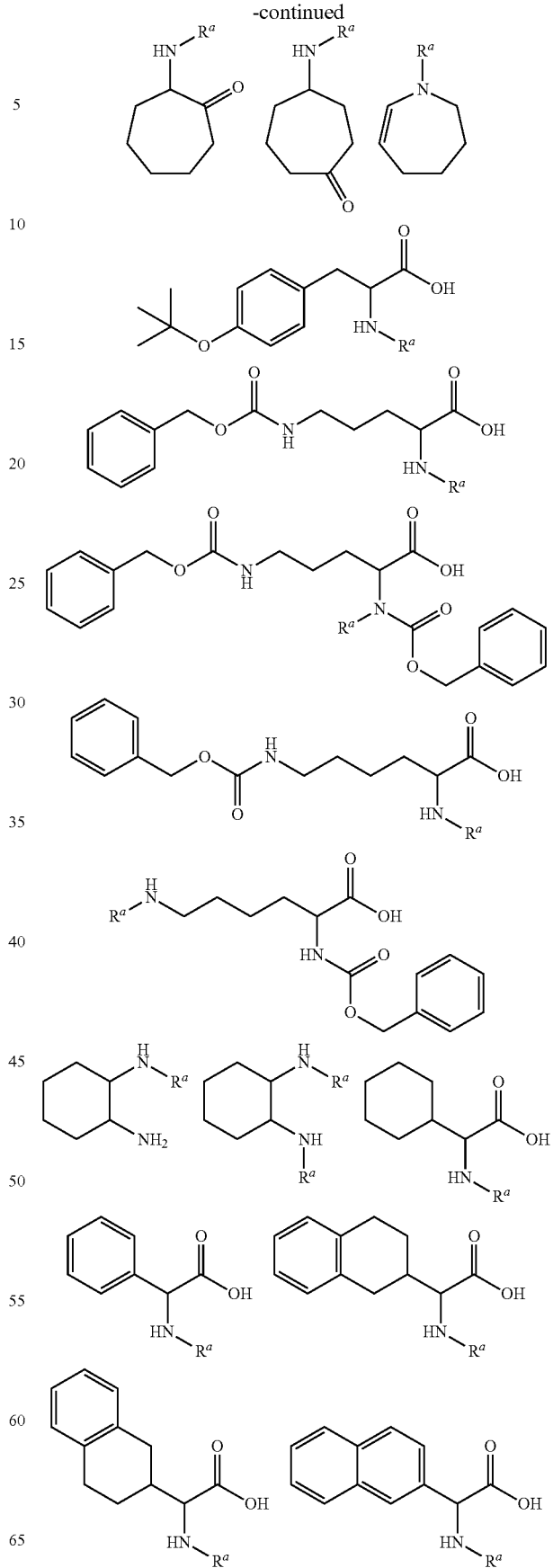

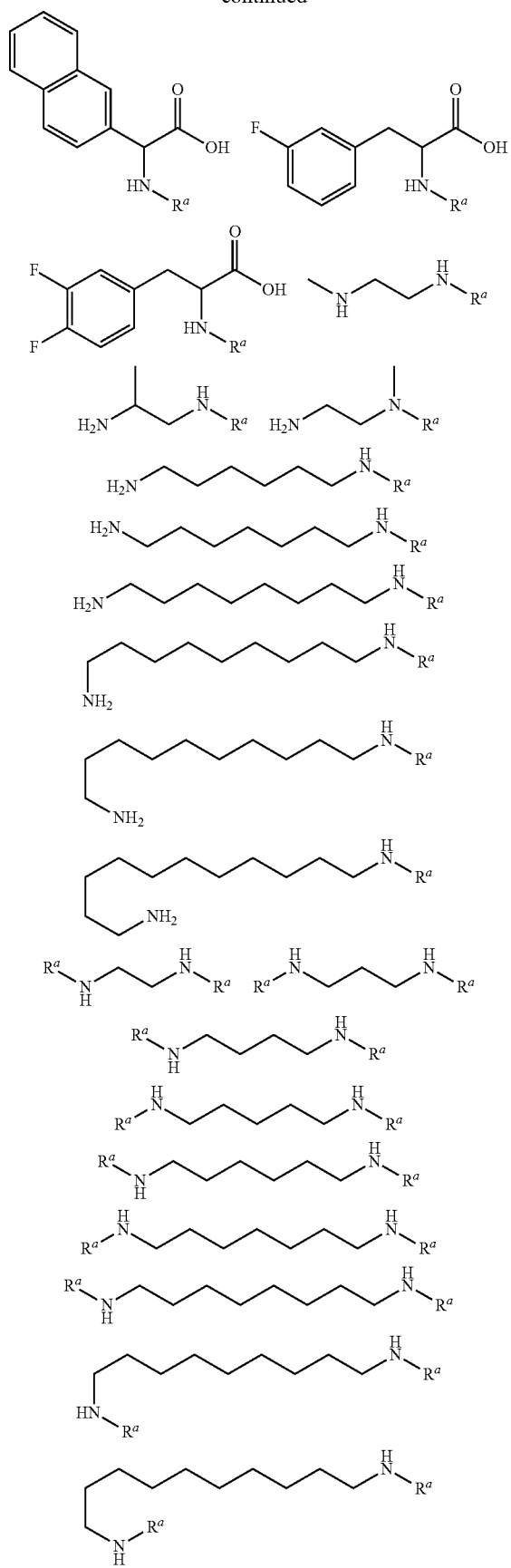
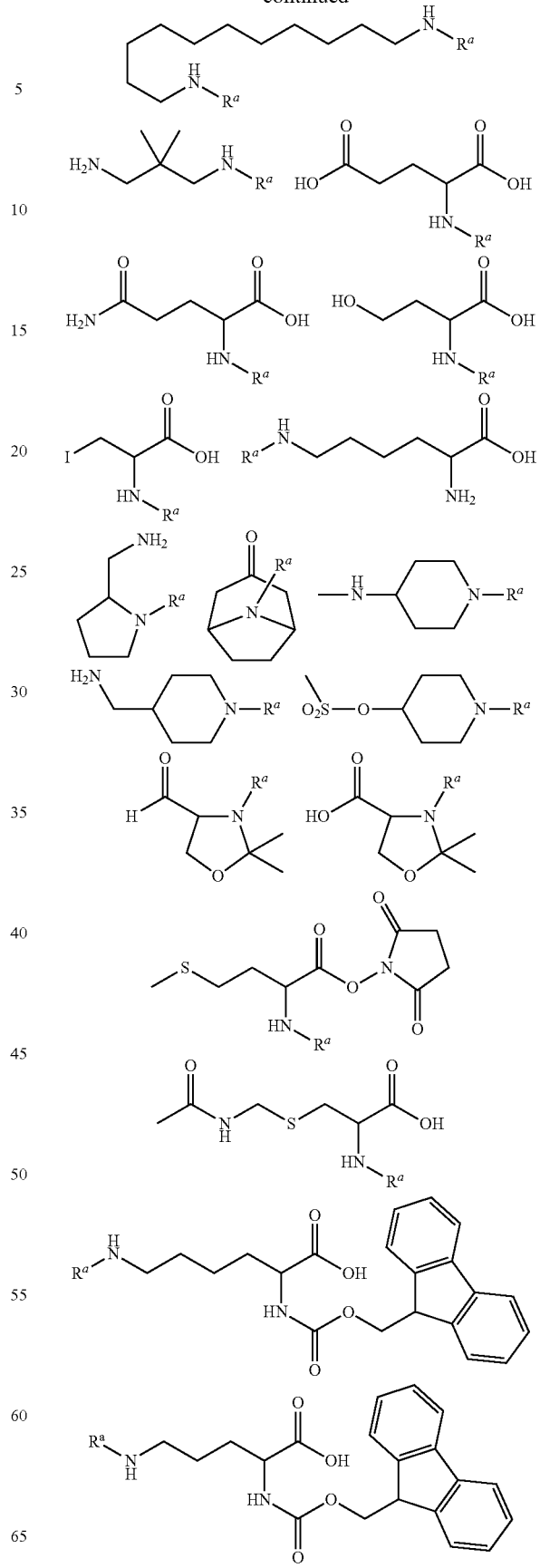

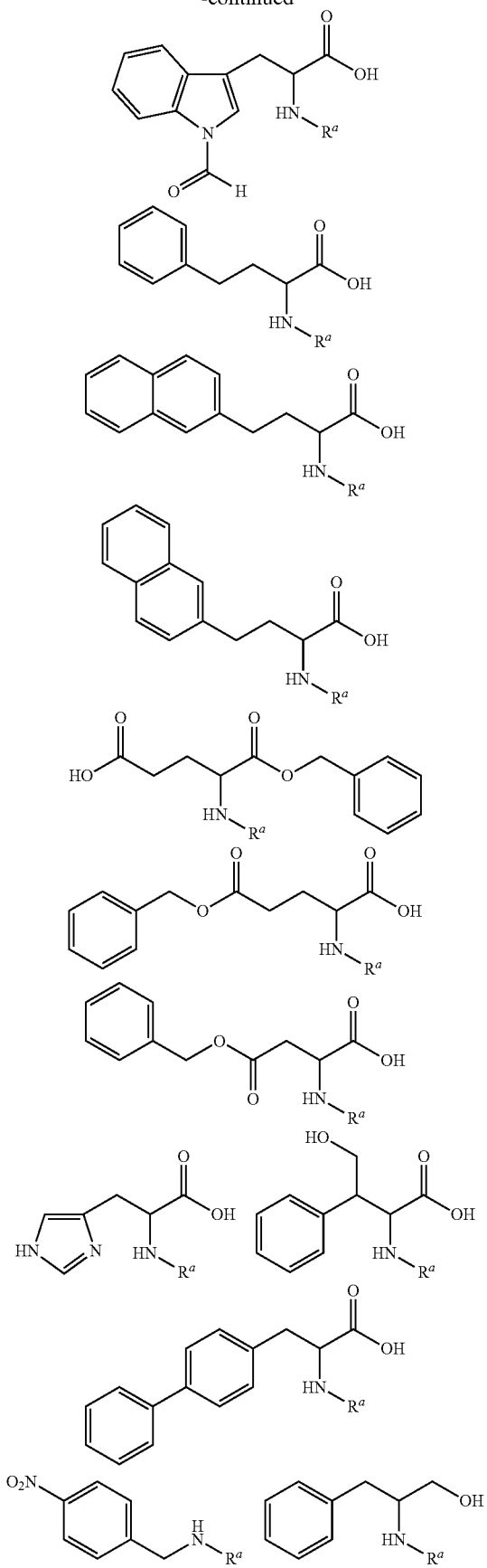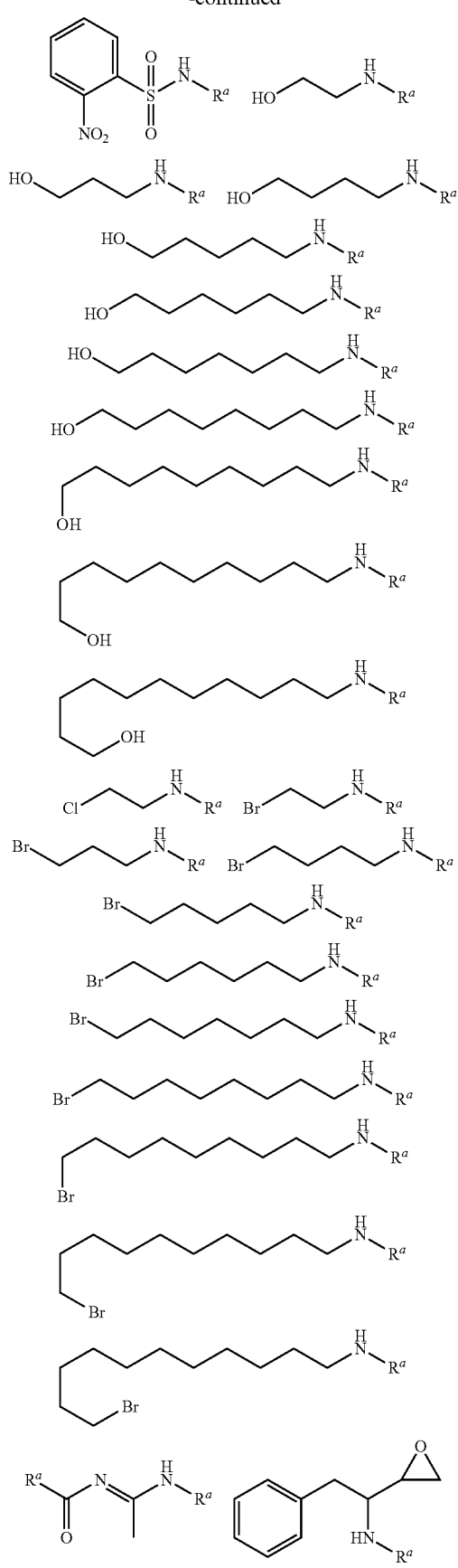

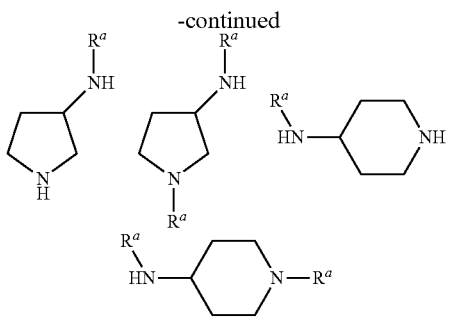

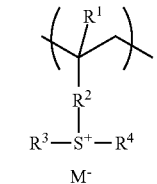

(1)

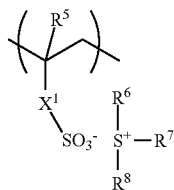

(2)

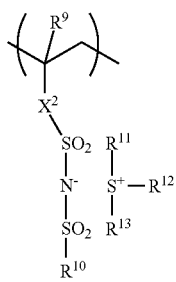

(3)

The polymerization method for producing a polymer according to the invention is effective for neutralization of an acid which is derived by decomposition of the acid generator or which is present as an impurity in the acid generator during polymerization. In the polymerization method, it is also important to prevent photo-decomposition of the acid generator. For preventing photo-decomposition of the acid generator, it is recommended to carry out polymerization reaction in a light-shielded environment or under illumination that light of wavelength up to 400 nm is cut off. The illumination that light of wavelength up to 400 nm is cut off means that the quantity of light of wavelength up to 400 nm is 0.05 mW/cm² or less, preferably 0.02 mW/cm² or less, and more preferably 0.01 mW/cm² or less.

The illumination of this type is provided by yellow lamps, LED lamps and organic EL lamps, preferably LED and organic EL lamps. In general, fluorescent lamps produce light emissions which include a fraction of wavelength up to 400 nm in a quantity of about 0.1 mW/cm². During polymerization of a monomer corresponding to a recurring unit having an acid generator bound thereto, the acid generator is decomposed with that fraction of light, and the acid labile group is deprotected with the aid of heat applied during polymerization. Such inconvenience may be avoided by using a yellow lamp which is constructed by applying a yellow laminate to the surface of a fluorescent lamp.

LED lamps and organic EL (electroluminescent) lamps produce light emissions which contain little or substantially no UV radiation. In the case of LED lamps, not only UV, but also light of wavelength 500 nm or shorter can be reduced by controlling the applied voltage, as described in JP-A 2013-080685.

The yellow lamp has the shortcoming that color discrimination is difficult under its illumination. For example, yellow marks cannot be used since they are not visible, and discrimination between blue and black marks is difficult. In the case of LED and organic EL lamps, the illumination in which a light fraction of wavelength 400 nm or shorter is completely cut off is a slightly yellowish illumination, under which color discrimination is easy, with the advantage of increased efficiency of experimentation. With LED and organic EL lamps, it is even possible that the quantity of light of wavelength up to 400 nm is 0.01 mW/cm² or less, with which little or no decomposition of the acid generator occurs during polymerization.

Polymer

The polymer obtained by the inventive method contains recurring units having an acid generator bound to the backbone. In a preferred embodiment, the recurring units having an acid generator are units of at least one type selected from recurring units having the formulae (1) to (3).

Herein $R^1$, $R^5$ and $R^9$ are each independently hydrogen or methyl. $R^2$ is a single bond, phenylene, —O—R— or —C(=O)—$Y^0$—R—, wherein $Y^0$ is oxygen or NH, and R is a straight, branched or cyclic $C_1$-$C_6$ alkylene, straight, branched or cyclic $C_2$-$C_6$ alkenylene, or phenylene group, which may contain a carbonyl (—CO—), ester (—COO—), ether (—O—), sulfonic acid ester (—OS($O_2$)—), sulfonamide (—NH—S($O_2$)—) or hydroxyl moiety. $R^3$, $R^4$, $R^6$, $R^7$, $R^8$, $R^{11}$, $R^{12}$ and $R^{13}$ are each independently a straight, branched or cyclic $C_1$-$C_{12}$ alkyl group which may contain a carbonyl, ester or ether moiety, or a $C_6$-$C_{12}$ aryl group, $C_1$-$C_{20}$ aralkyl group, or thiophenyl group. $X^1$ and $X^2$ are each independently a single bond, methylene, ethylene, phenylene, fluorinated phenylene, —O—$R^{14}$—, or —C(=O)—$Z^1$—$R^{14}$—, wherein $Z^1$ is oxygen or NH, and $R^{14}$ is a straight, branched or cyclic $C_1$-$C_6$ alkylene, alkenylene, or phenylene group, which may contain a carbonyl, ester, ether, sulfonic acid ester, sulfonamide or hydroxyl moiety, or which may be fluorinated. $R^{10}$ is a $C_1$-$C_4$ fluoroalkyl or $C_6$-$C_{10}$, fluoroaryl group. $M^-$ is a non-nucleophilic counter ion.

Examples of the monomer from which the recurring units (a1) having formula (1) are derived are shown below, but not limited thereto.

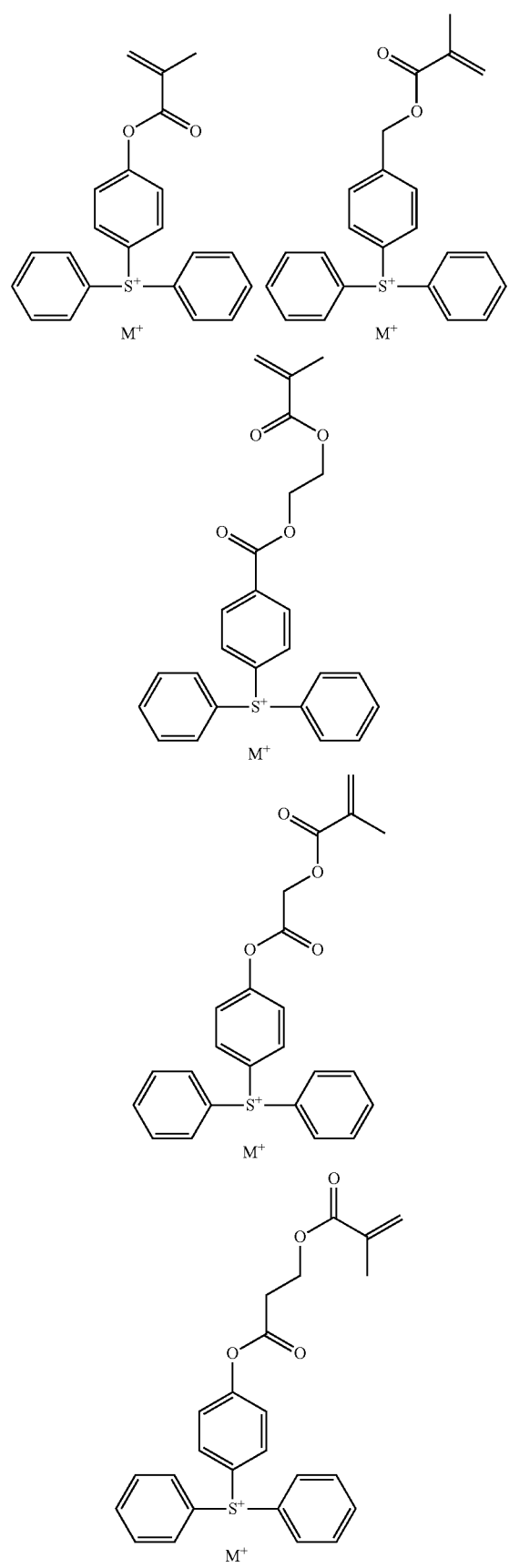
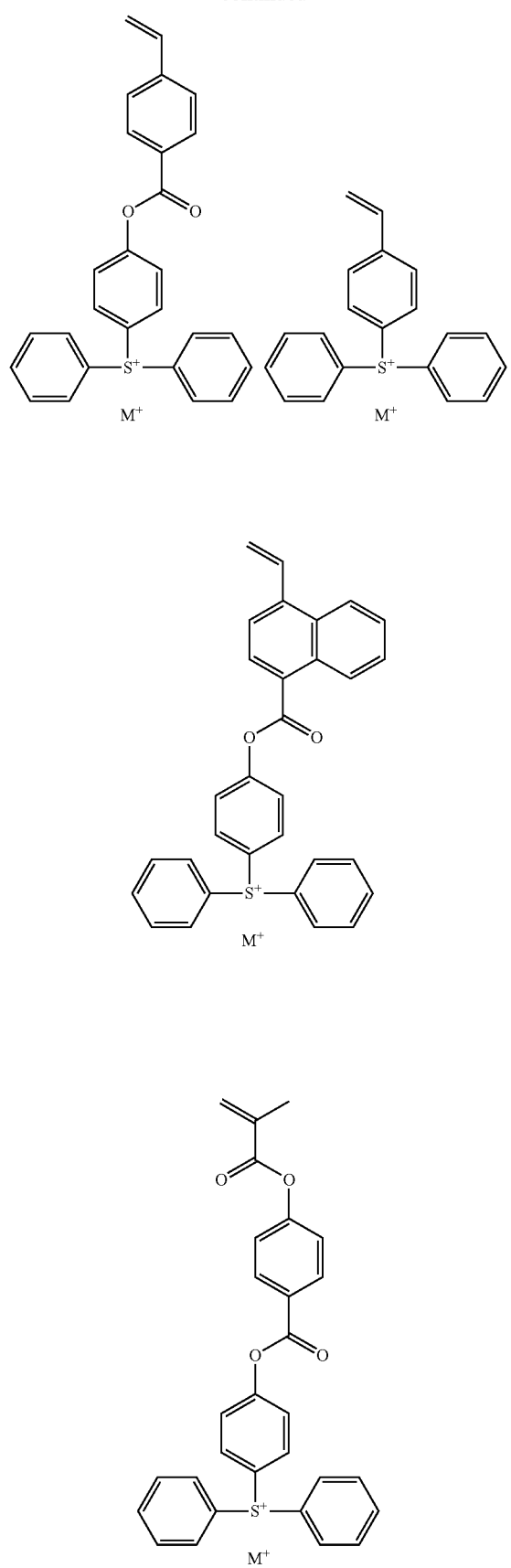

31
-continued
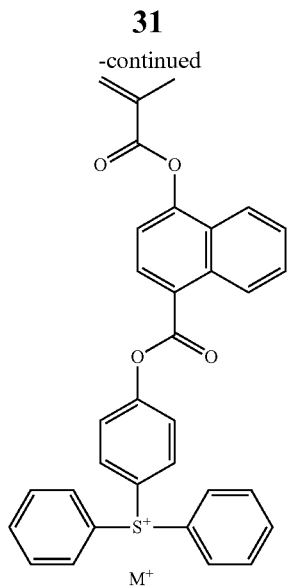
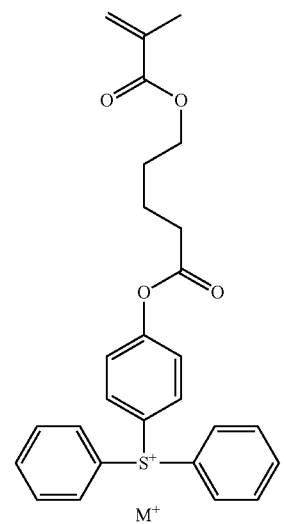
32
-continued
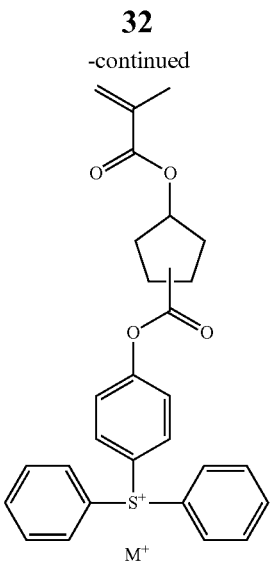
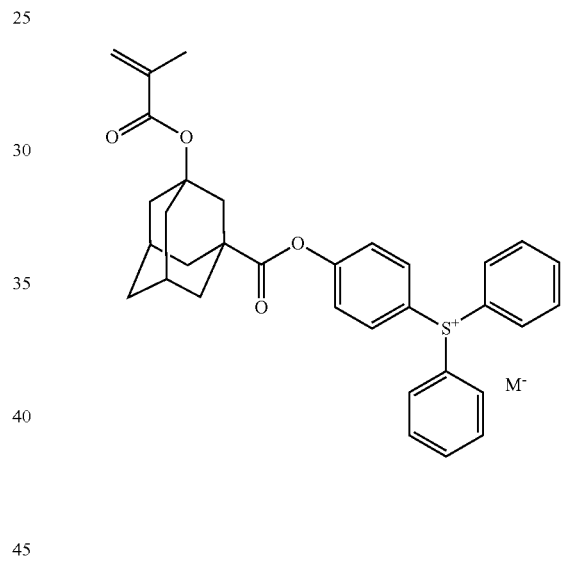
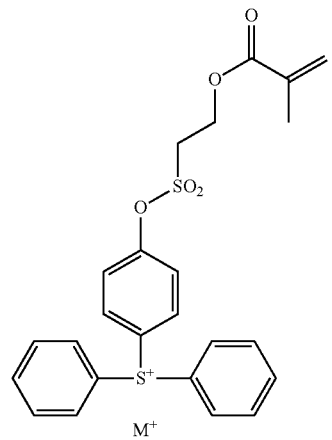

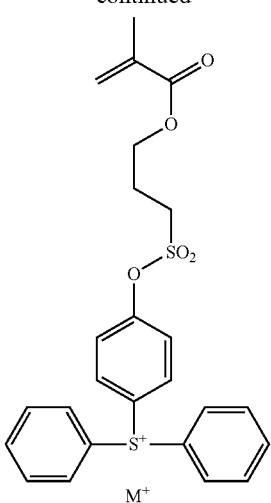
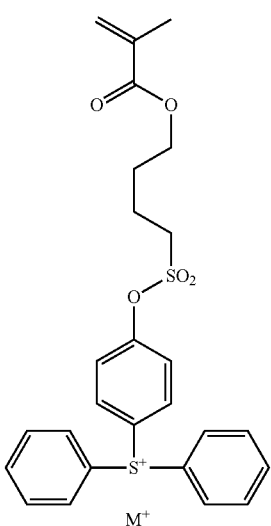
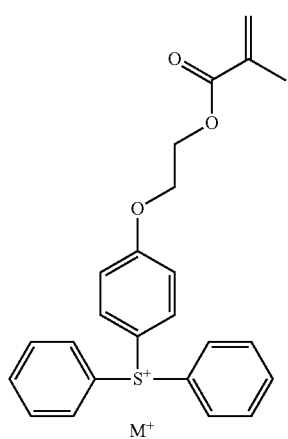
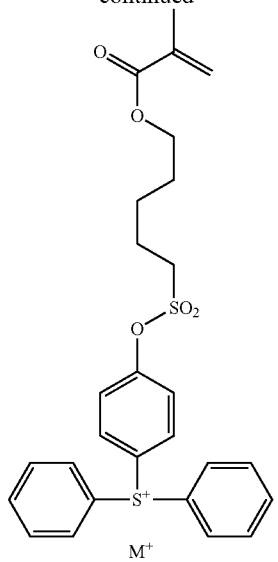
Herein M⁻ is as defined above.
Examples of the monomer from which the recurring units (a2) having formula (2) are derived are shown below, but not limited thereto.
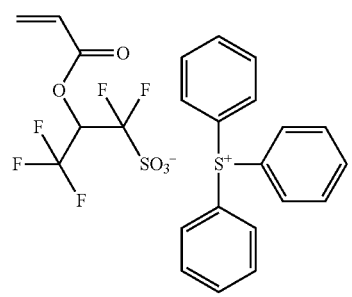
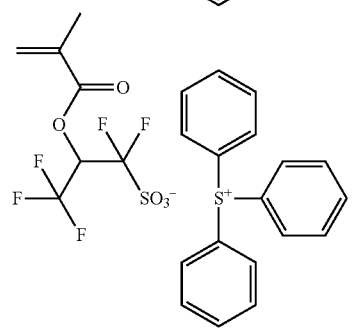
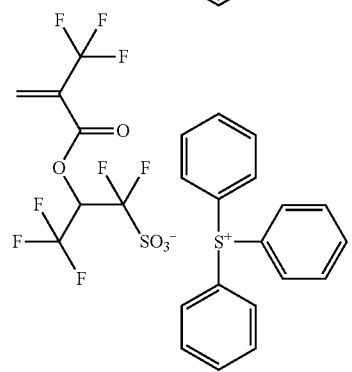

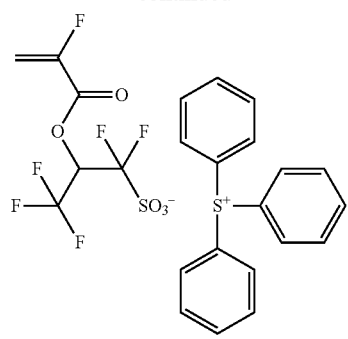
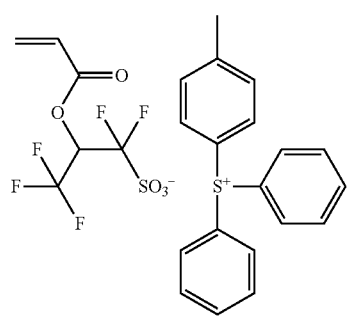
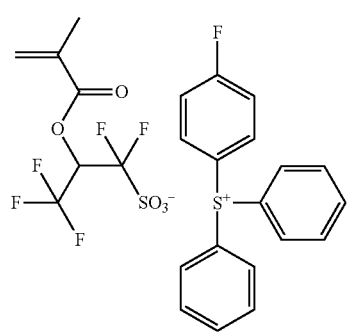
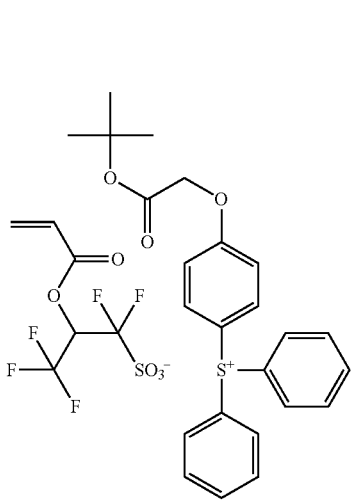
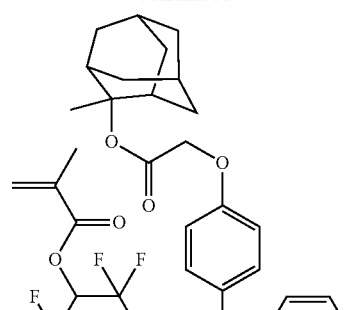
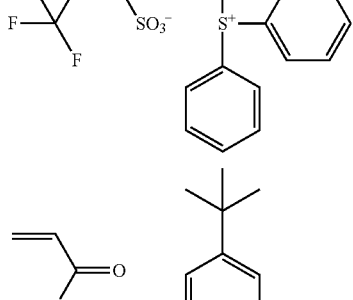
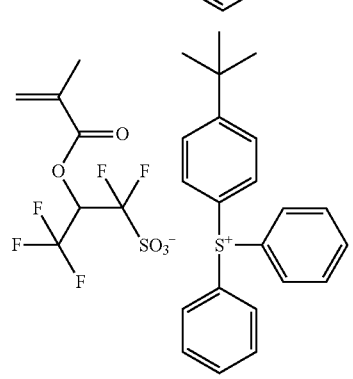
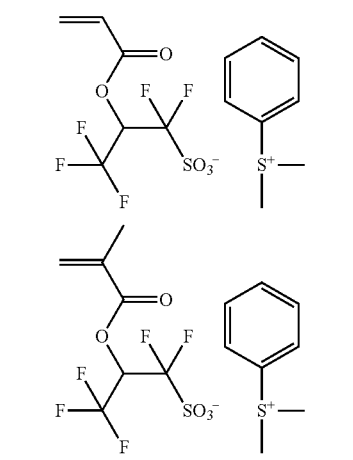

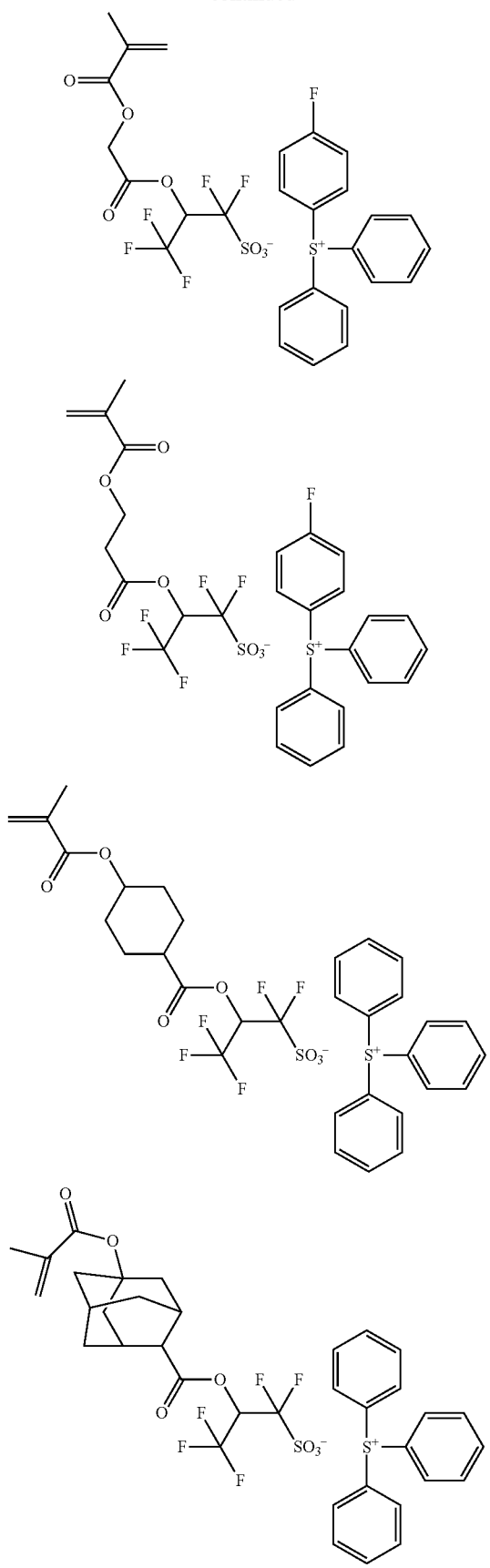
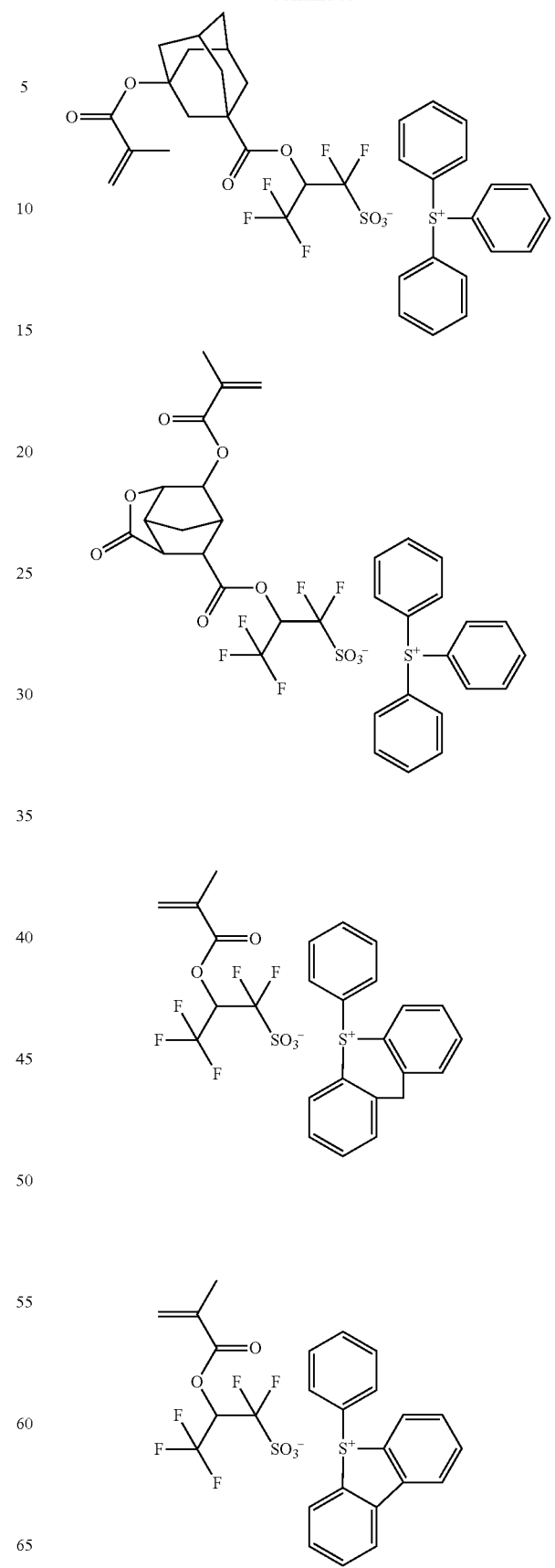

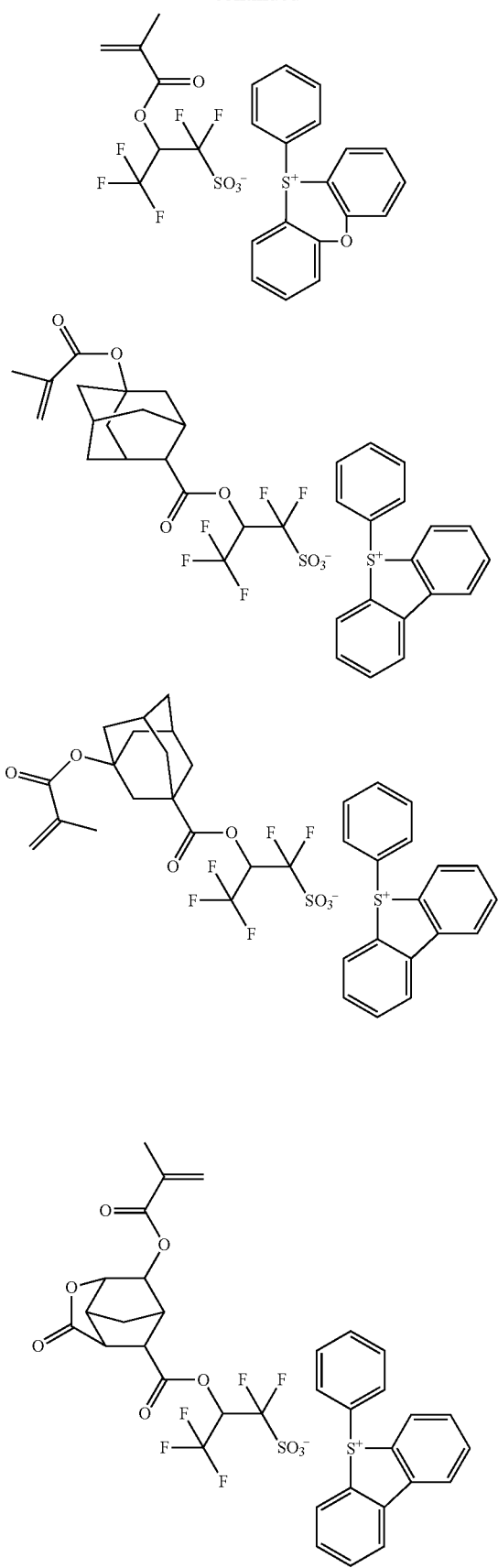
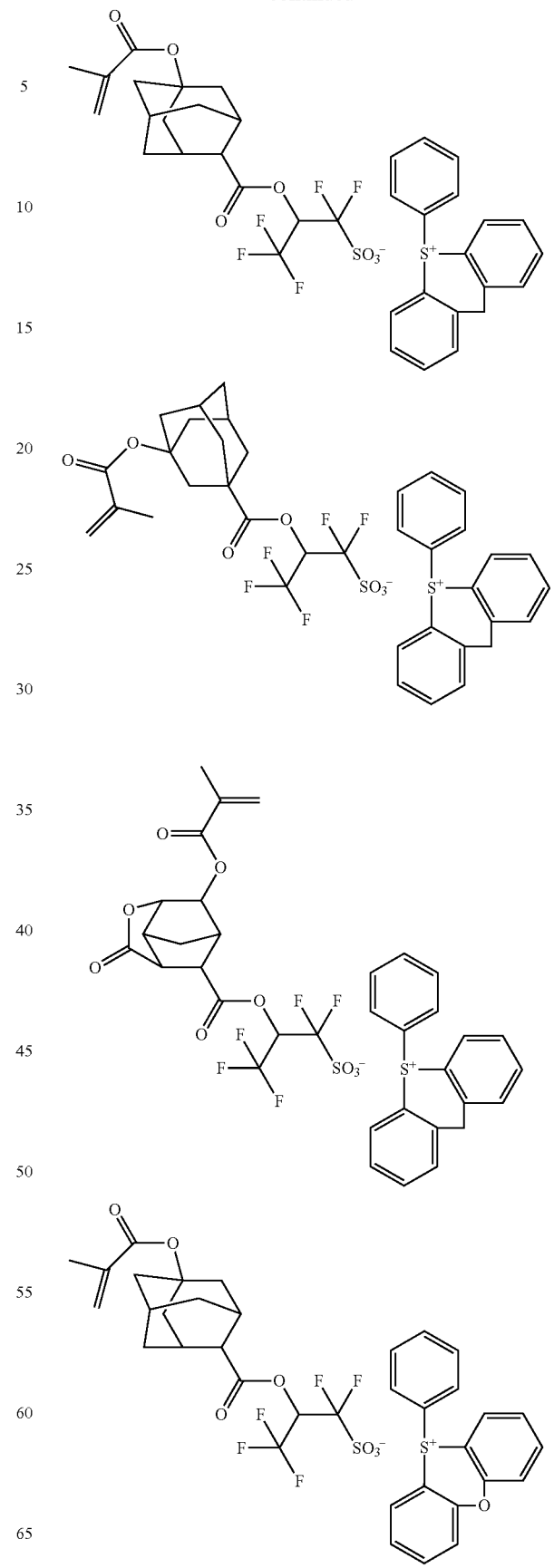

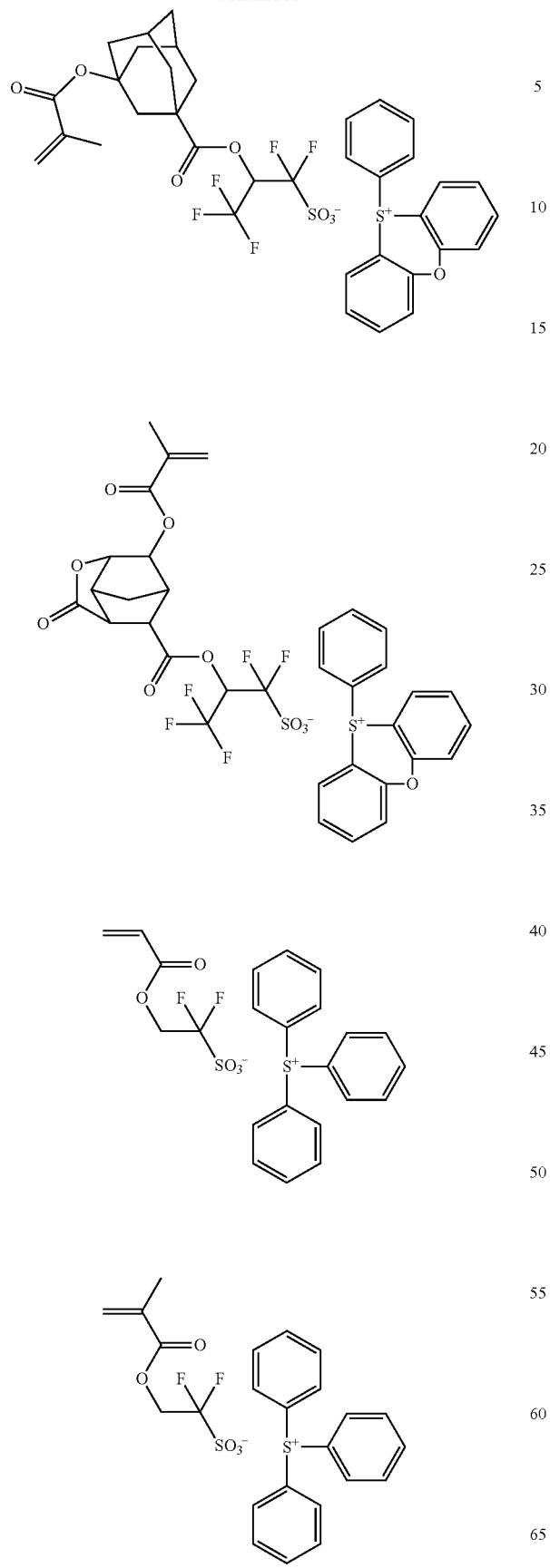

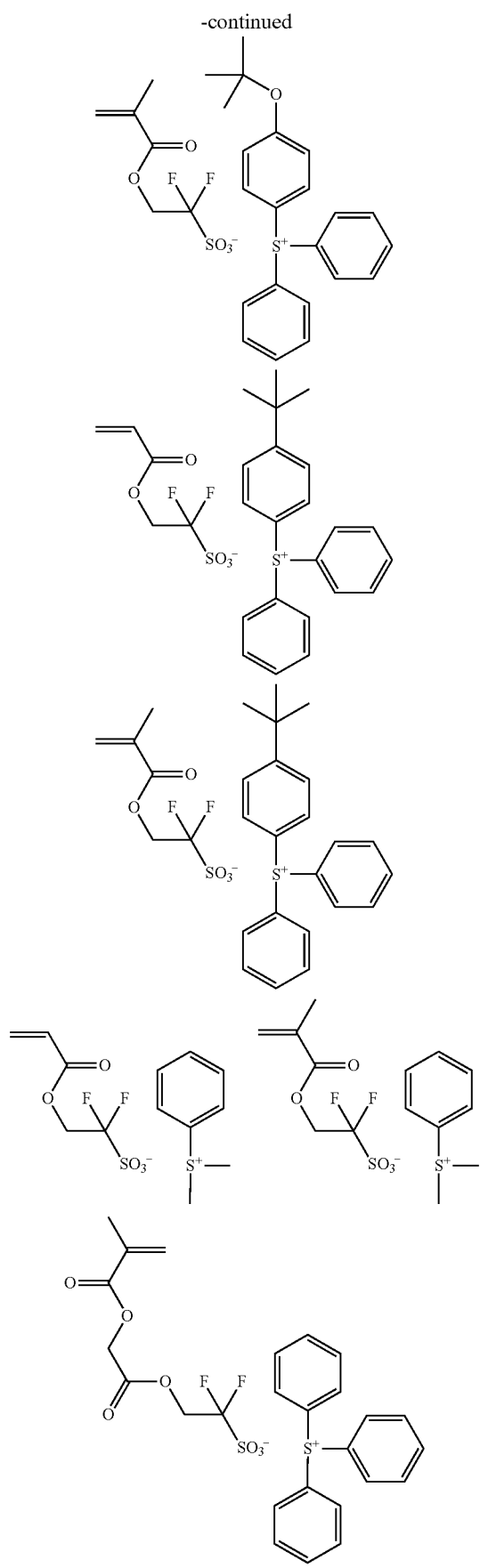
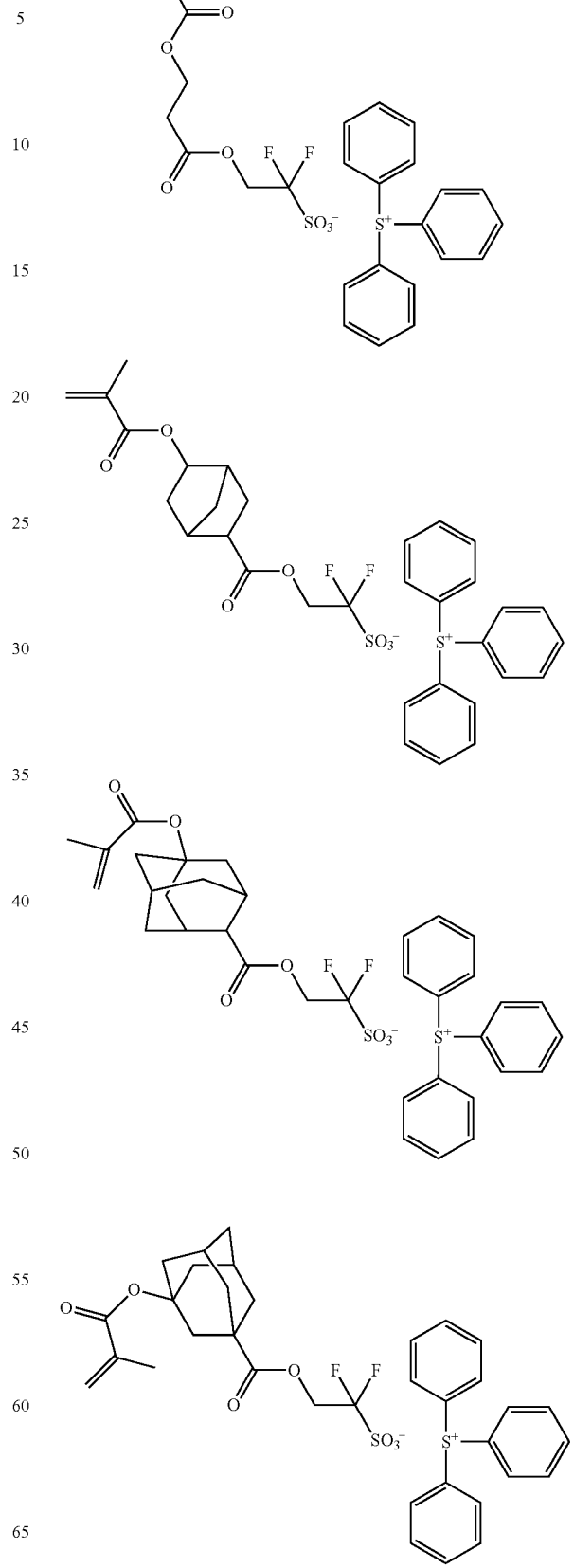

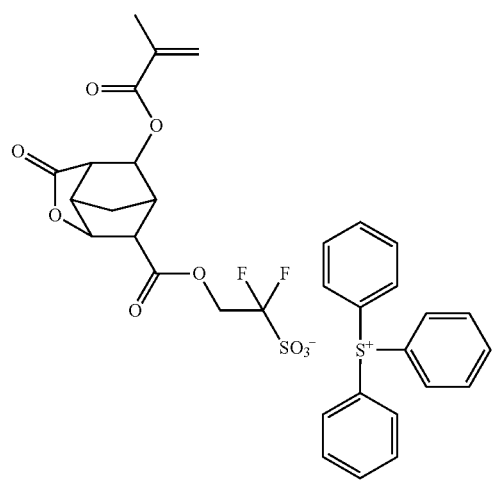
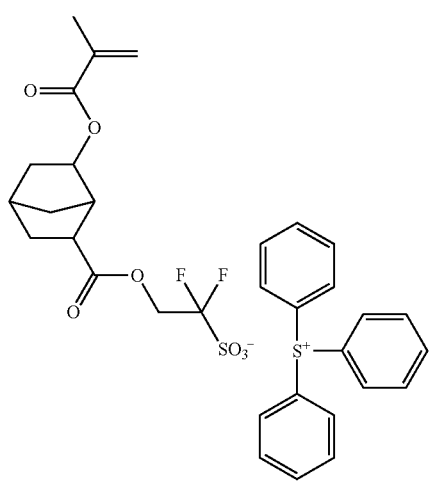
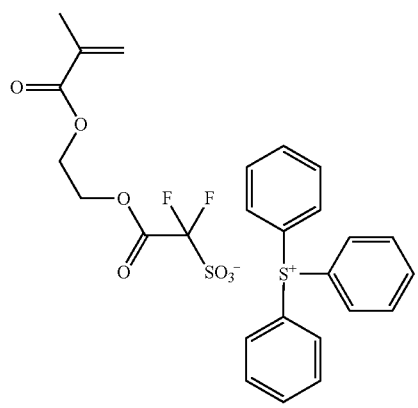
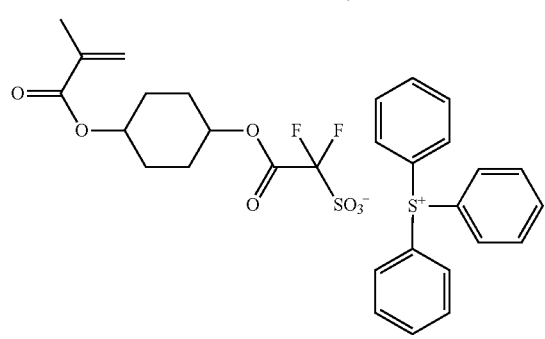
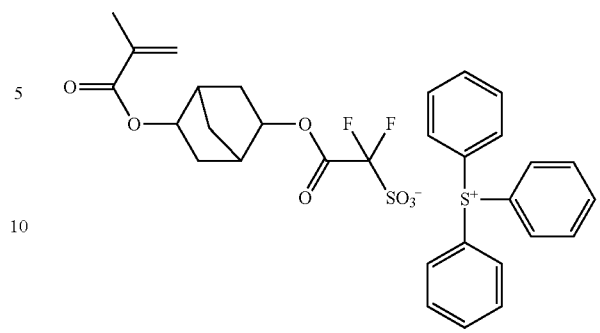
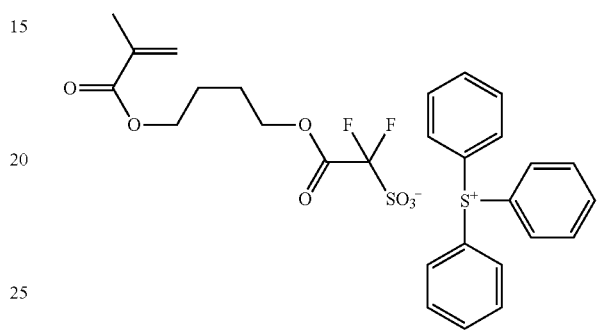
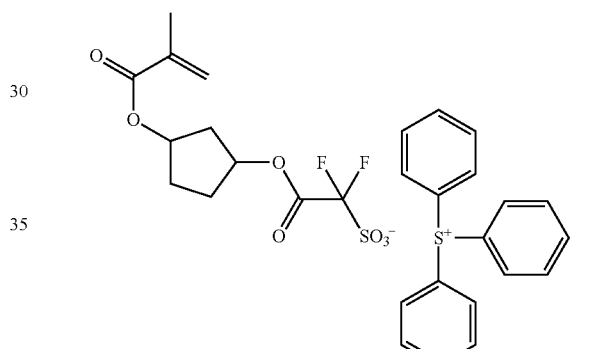
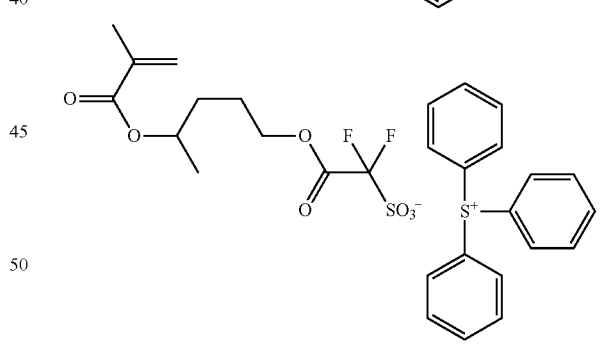
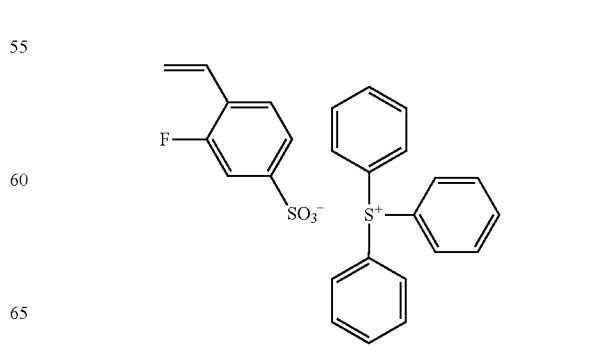

-continued
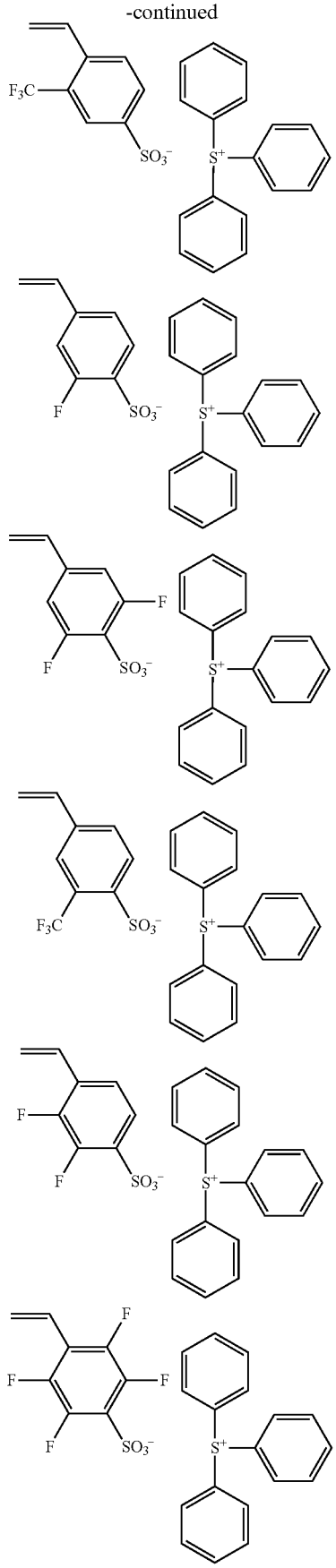
-continued
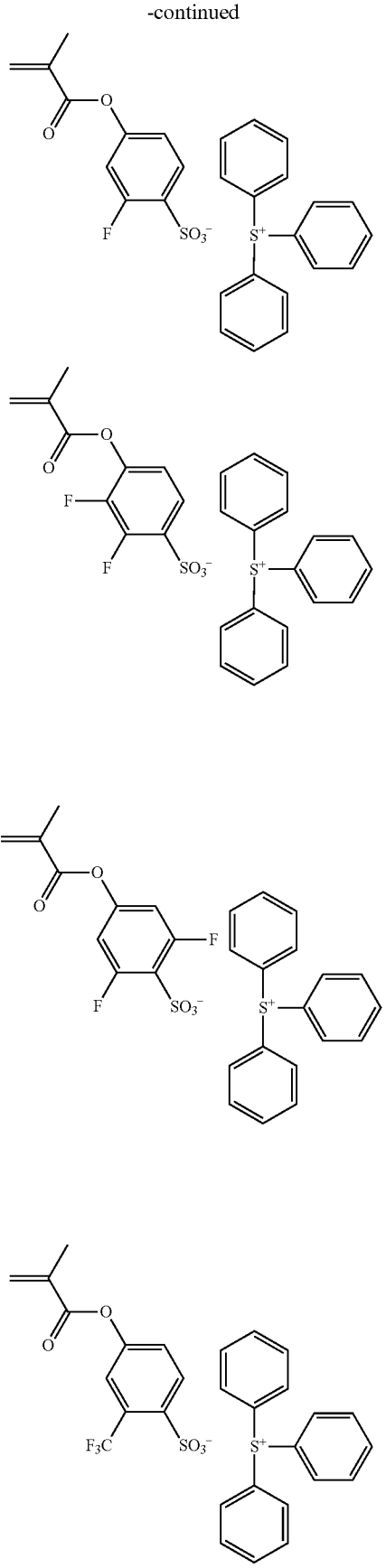

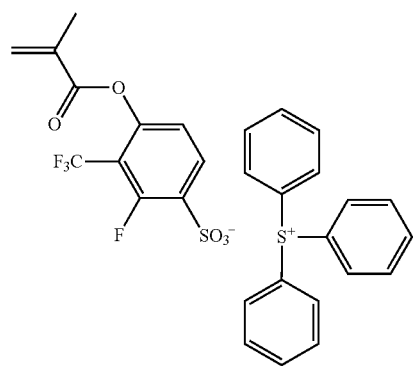
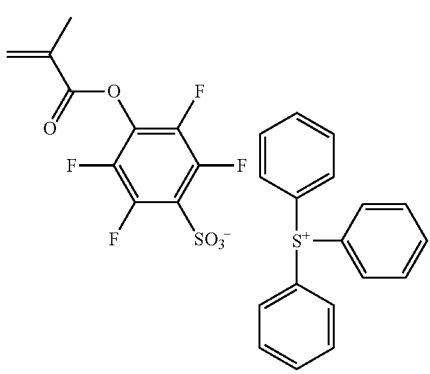
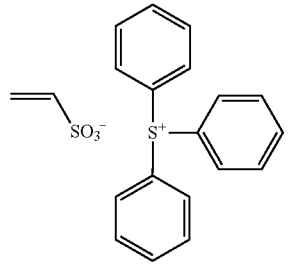
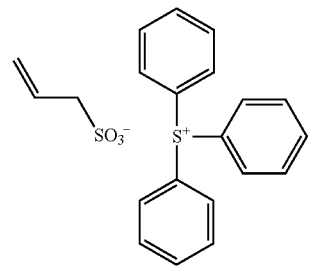
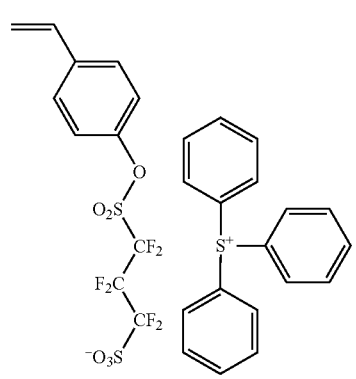
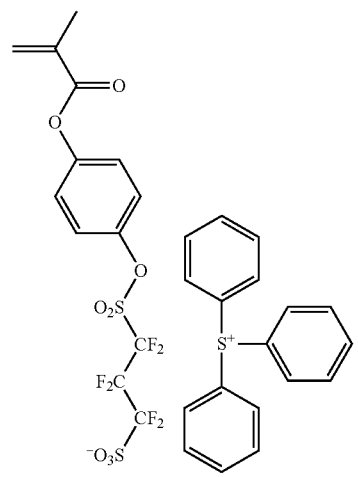
Examples of the monomer from which the recurring units (a3) having formula (3) are derived are shown below, but not limited thereto.
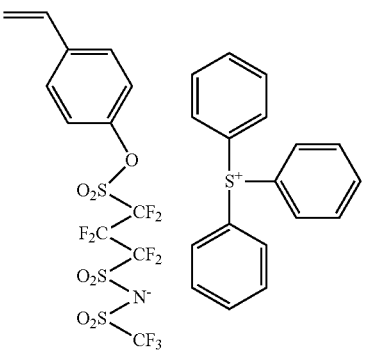
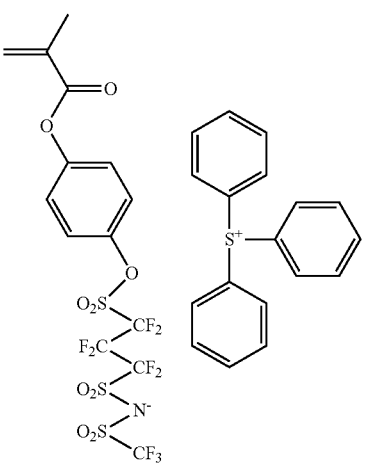

-continued

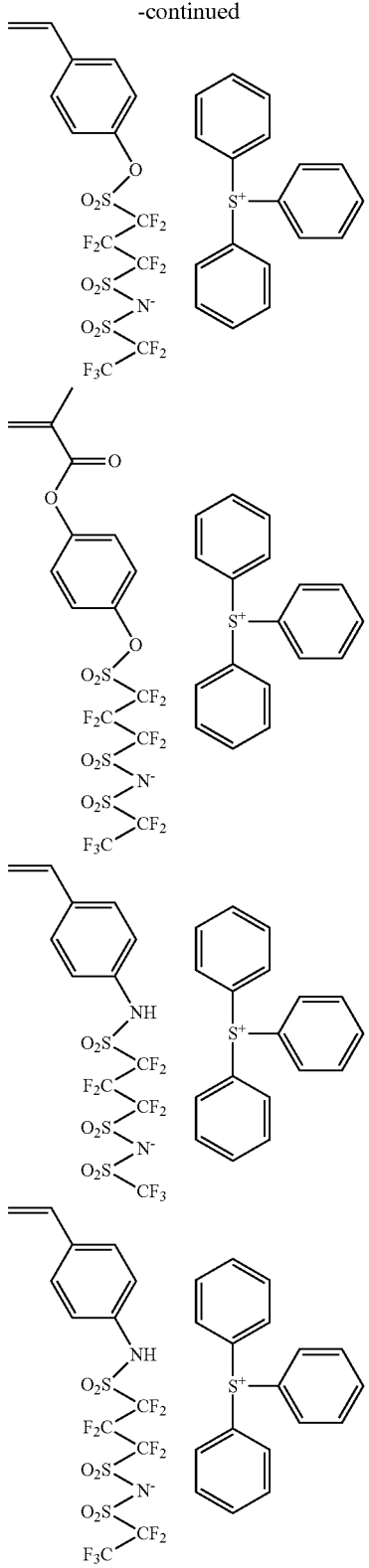

In formula (1), examples of the non-nucleophilic counter ion represented by M⁻ include halide ions such as chloride and bromide ions; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; alkylsulfonate ions such as mesylate and butanesulfonate; imidates such as bis(trifluoromethylsulfonyl)imide, bis(perfluoroethylsulfonyl)imide and bis(perfluorobutylsulfonyl)imide; methidates such as tris(trifluoromethylsulfonyl) methide and tris(perfluoroethylsulfonyl)methide, as well as the anions described in JP-A 2007-145797, JP-A 2008-007410, JP-A 2008-299069, JP-A 2009-080474, and JP-A 2009-169230.

Polymers comprising recurring units of formula (1), (2) or (3) wherein at least one of $R^3$ and $R^4$, at least one of $R^6$, $R^7$ and $R^8$, or at least one of $R^{11}$, $R^{12}$ and $R^{13}$ is an optionally substituted phenyl group have high sensitivity to a light fraction of wavelength up to 400 nm. In this case, full wavelength cutoff is preferable.

The polymerization method according to the invention is to produce a polymer comprising recurring units having an acid generator bound to the backbone while the polymer is useful as a base polymer for photoresist. In addition to the recurring units having an acid generator bound to the backbone, the polymer should comprise recurring units of at least one type selected from recurring units (b1) having a carboxyl group optionally substituted with an acid labile group as represented by the formula (4) and recurring units (b2) having a hydroxyl group optionally substituted with an acid labile group, as represented by the formula (5). When an inventive polymer contains recurring units having an acid labile group-substituted carboxyl or hydroxyl group, it is possible to form a positive resist pattern via exposure and alkaline development, or a negative resist pattern via exposure and organic solvent development. When an inventive polymer contains recurring units having a carboxyl or hydroxyl group which is not substituted with an acid labile group, a negative resist composition may be formulated from the polymer.

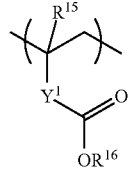

(4)

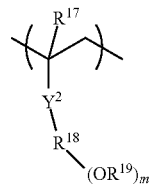

(5)

Herein $R^{15}$ and $R^{17}$ are each independently hydrogen or methyl. $R^{16}$ and $R^{19}$ are each independently hydrogen or an acid labile group. $Y^1$ is a single bond, phenylene, naphthylene or —C(=O)—O—$R^{20}$—, wherein $R^{20}$ is a straight, branched or cyclic $C_1$-$C_{10}$ alkylene group which may contain an ether, ester, lactone ring or hydroxyl moiety, or a phenylene or naphthylene group. $Y^2$ is a single bond, a phenylene or naphthylene group which may have a nitro, cyano or halogen moiety, or —C(=O)—O—$R^{21}$—, —C(=O)—NH—$R^{21}$—, —O—$R^{21}$—, or —S—$R^{21}$—, wherein $R^{21}$ is a straight, branched or cyclic $C_1$-$C_{10}$ alkylene group which may contain an ether, ester, lactone ring or hydroxyl moiety, or a phenylene or naphthylene group which may contain a straight, branched or cyclic $C_1$-$C_6$ alkyl, $C_2$-$C_6$ alkenyl, $C_6$-$C_{10}$ aryl, alkoxy, acyl, acyloxy, alkoxycarbonyl, nitro, cyano or halogen moiety. $R^{18}$ is a single bond, or a straight, branched or cyclic, $C_1$-$C_{16}$, di- to pentavalent, aliphatic hydrocarbon group or phenylene group, which may contain an ether or ester moiety, and m is an integer of 1 to 4.

The recurring units (b1) and (b2) are derived from monomers having the formulae (4') and (5'), respectively.

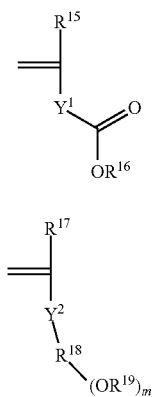

Herein $R^{15}$ to $R^{19}$, $Y^1$, $Y^2$, and m are as defined above.

Examples of the monomer having formula (4') are shown below, but not limited thereto.

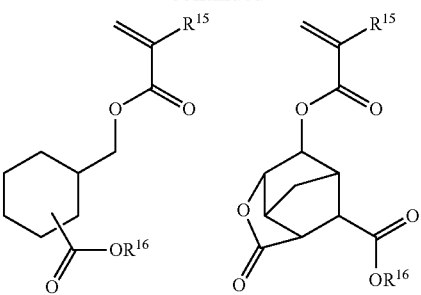

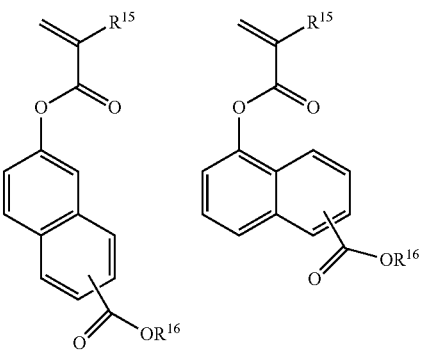

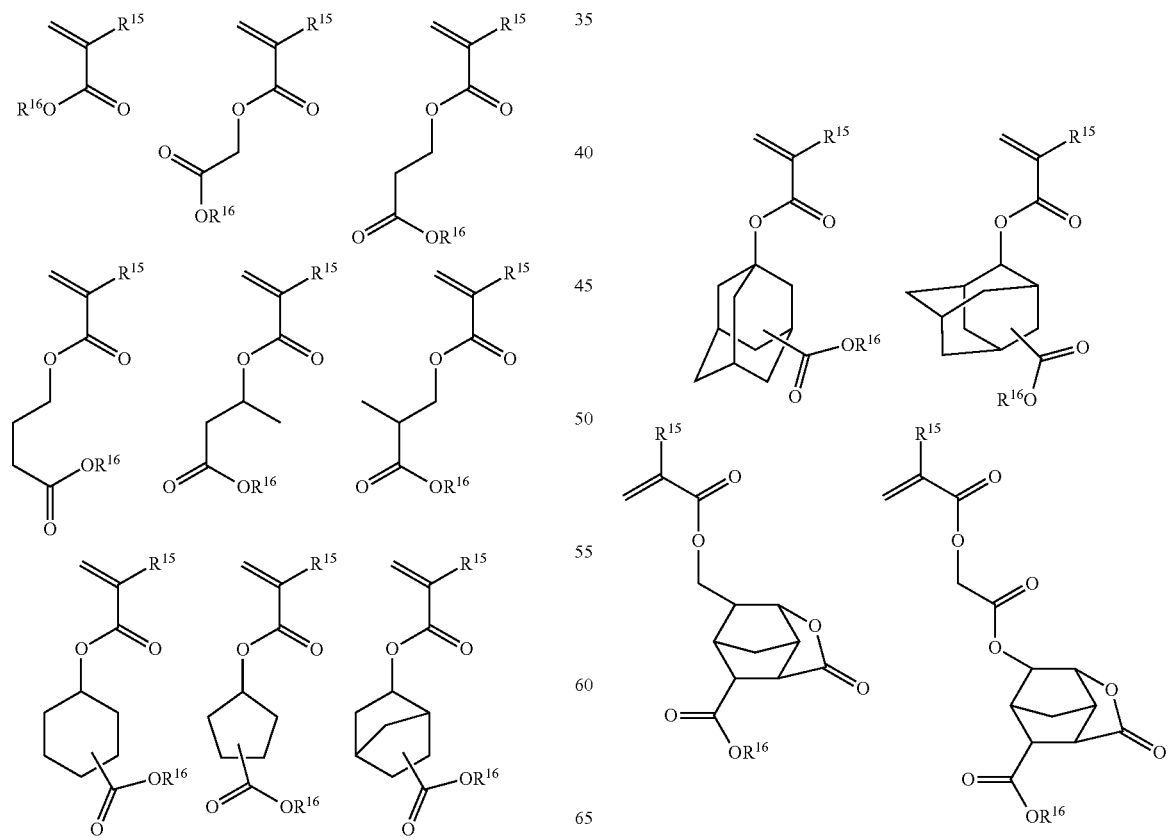

-continued
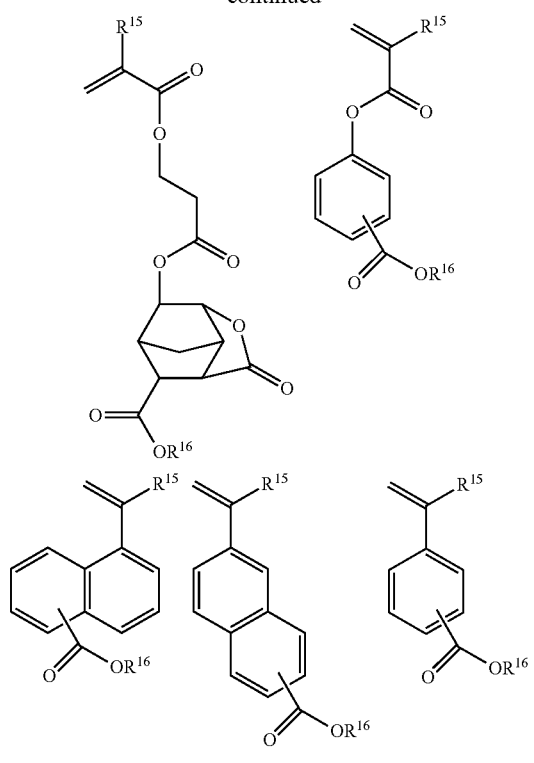
Herein $R^{15}$ and $R^{16}$ are as defined above.
Examples of the monomer having formula (5') are shown below, but not limited thereto.
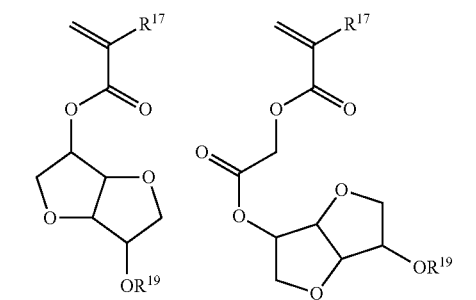
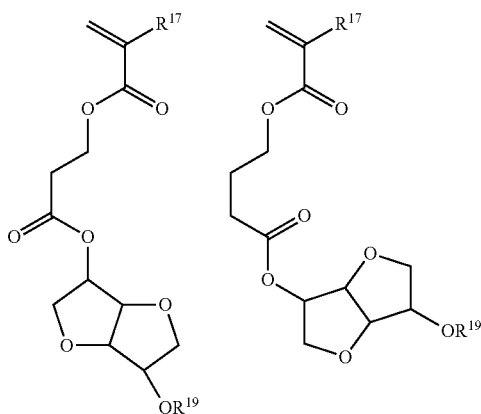
-continued
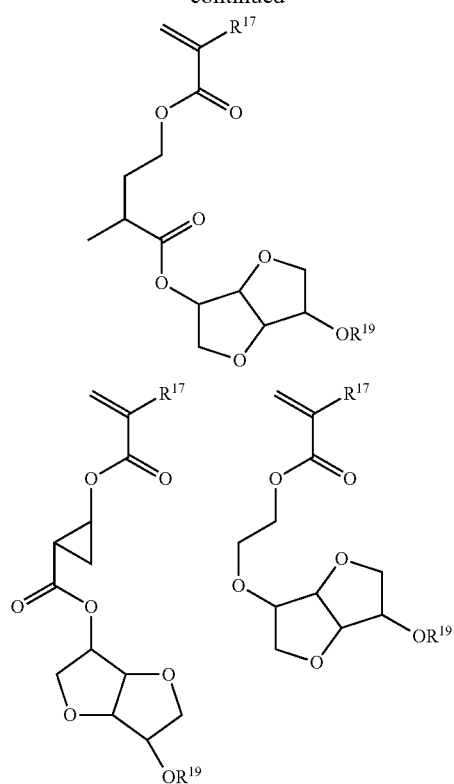
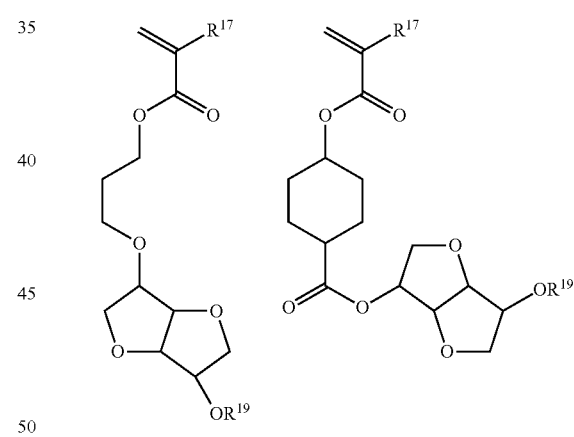
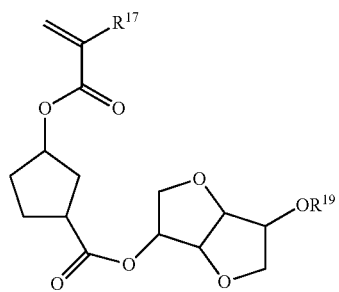

-continued
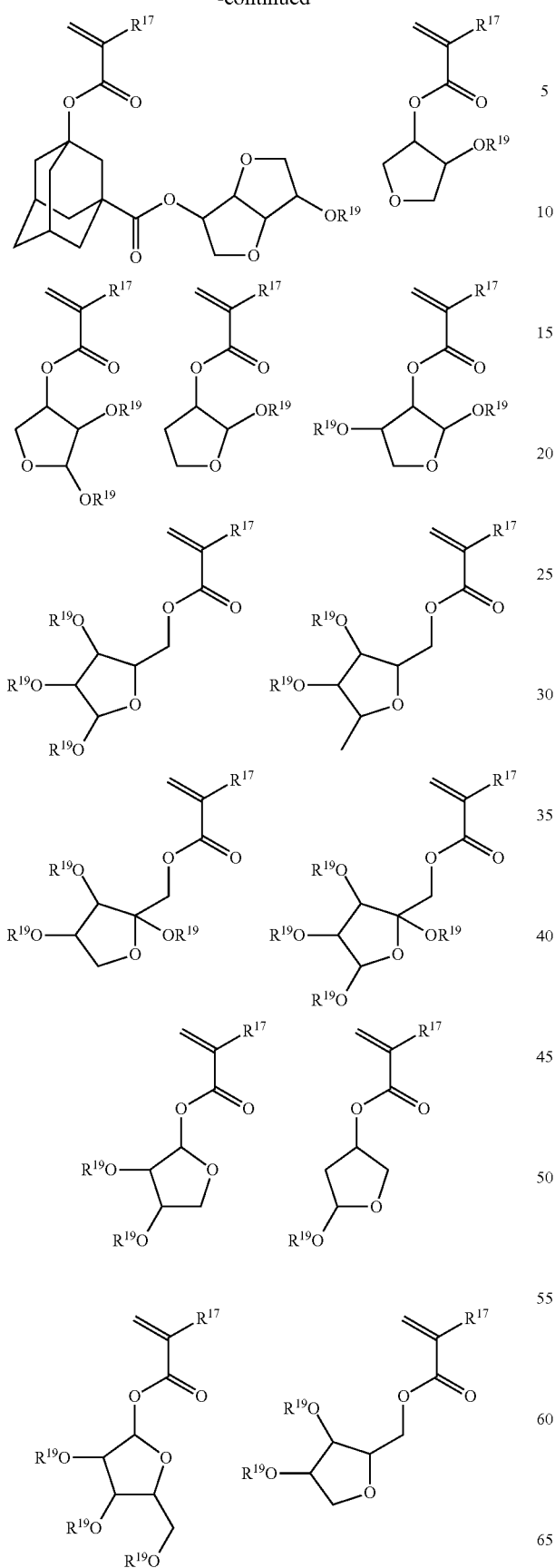
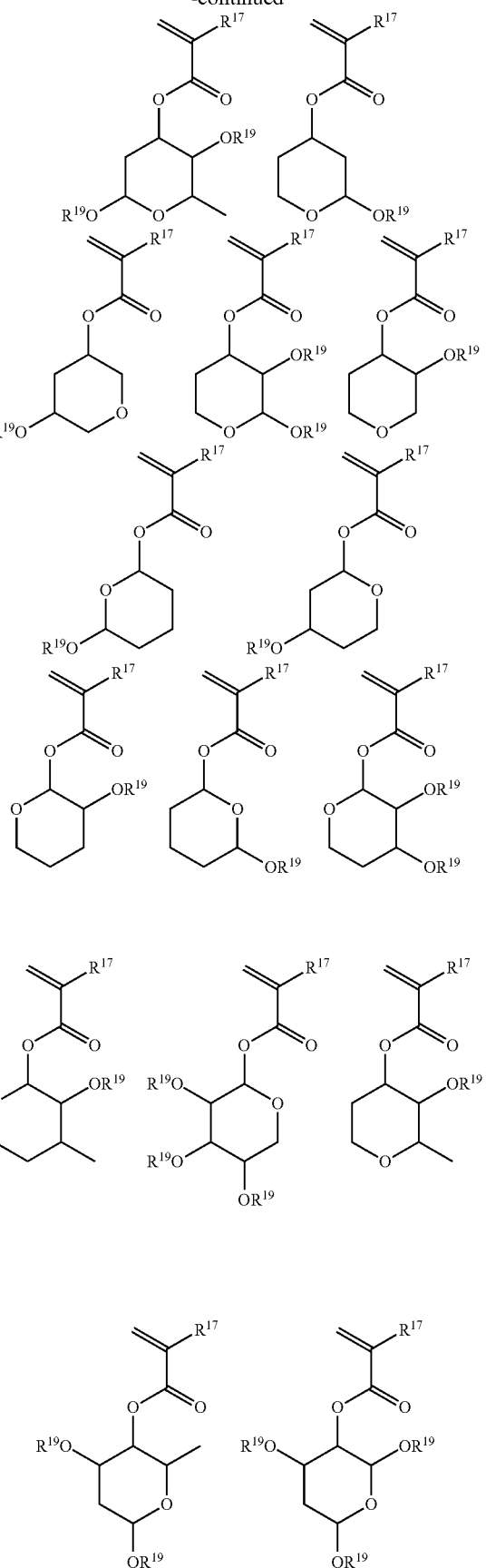

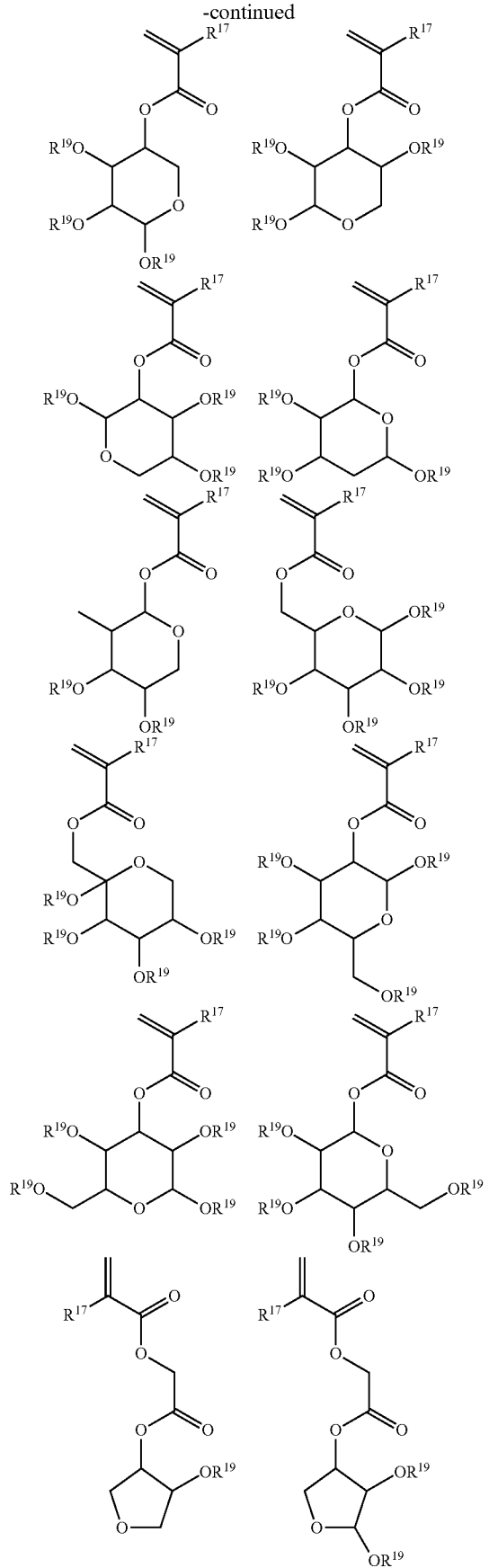
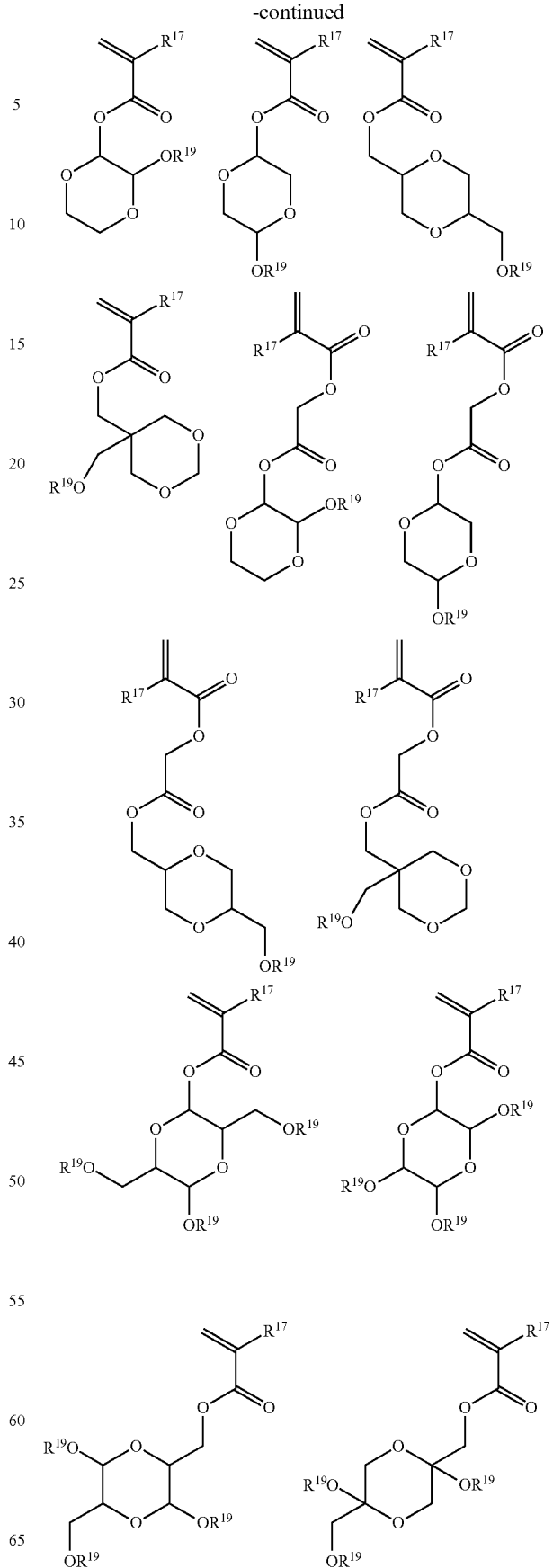

-continued
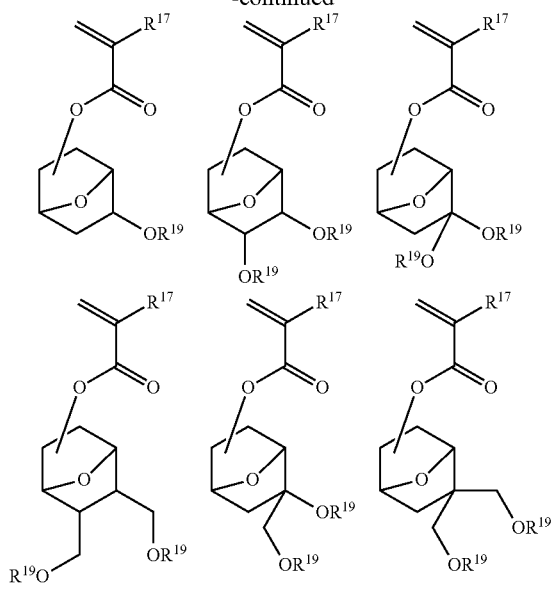
-continued
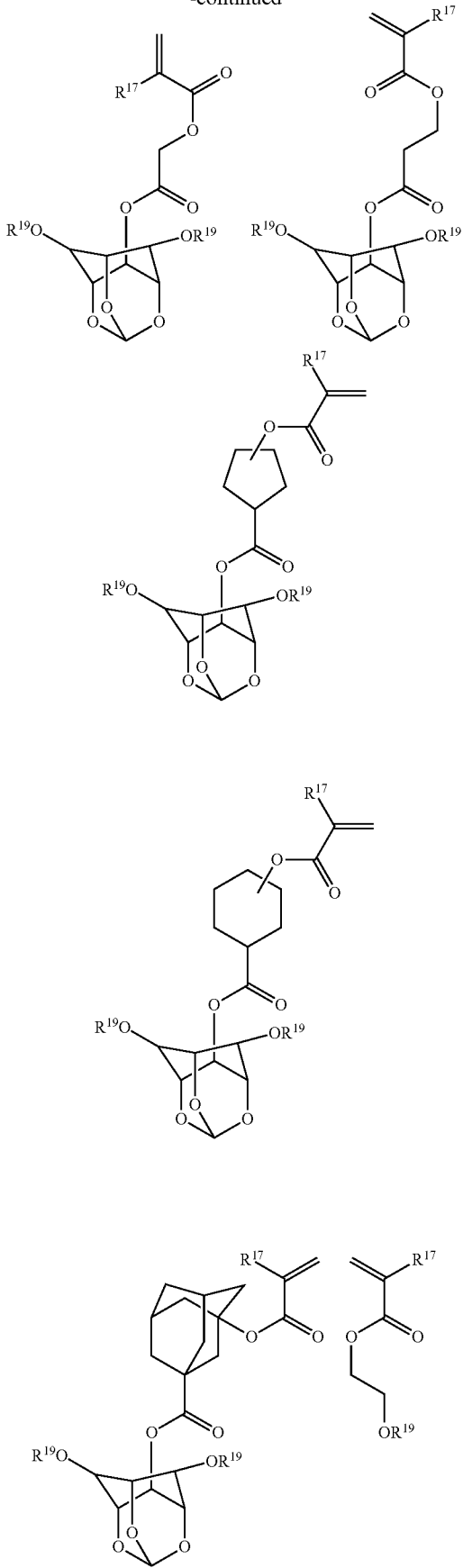

-continued
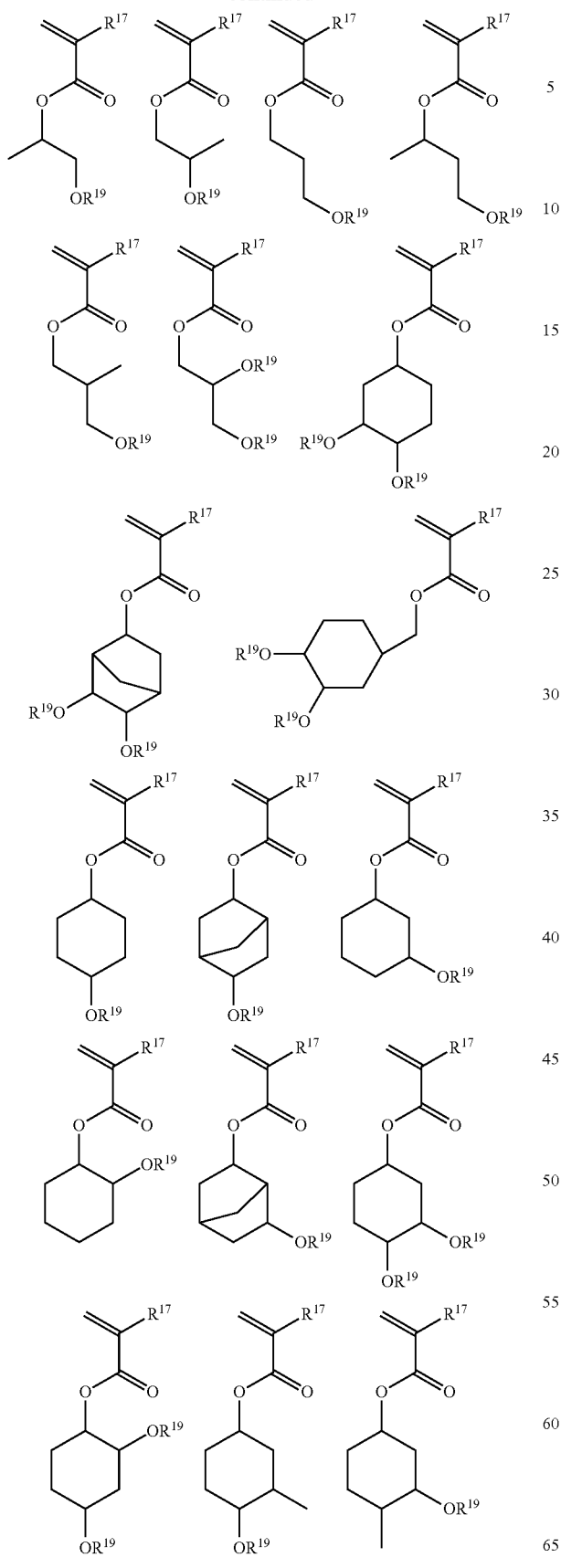
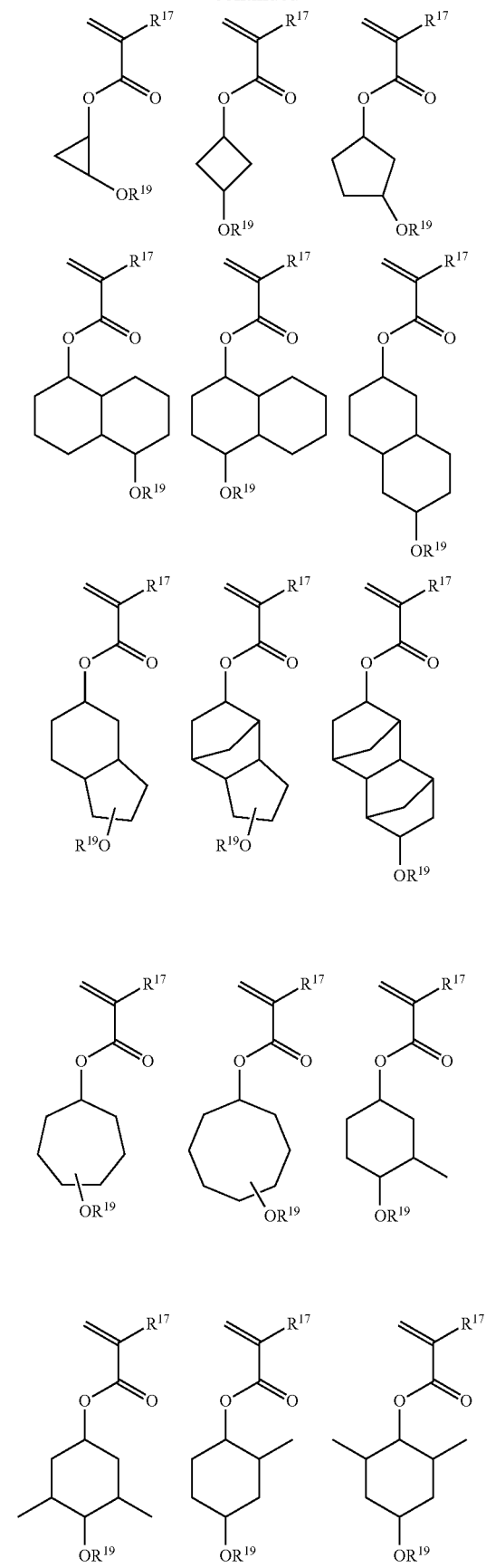

65
-continued
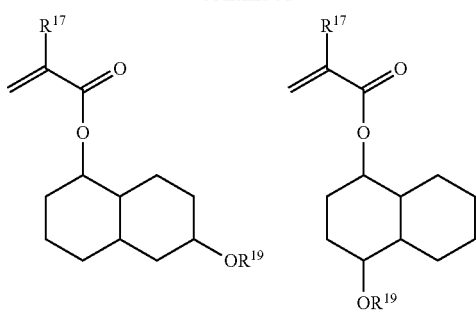
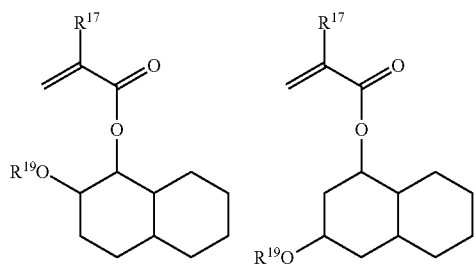
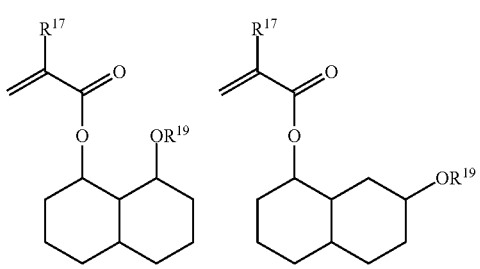
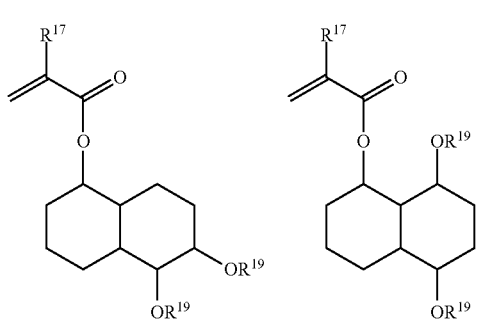
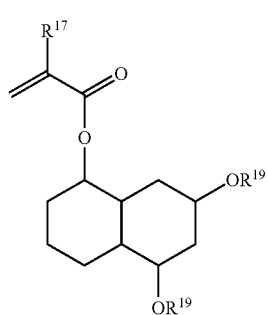
66
-continued
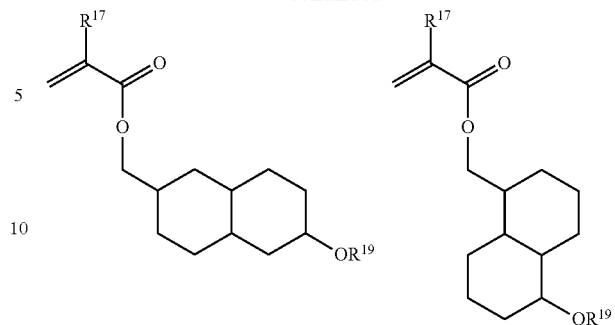
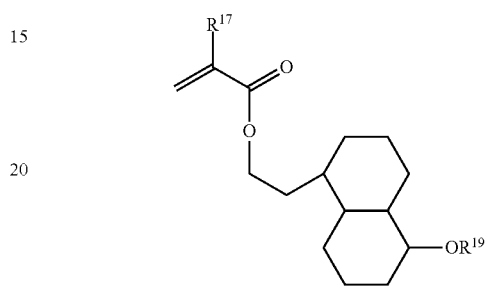
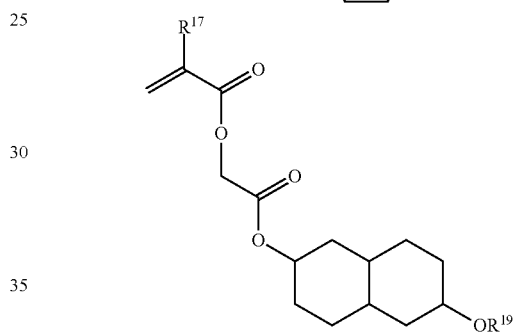
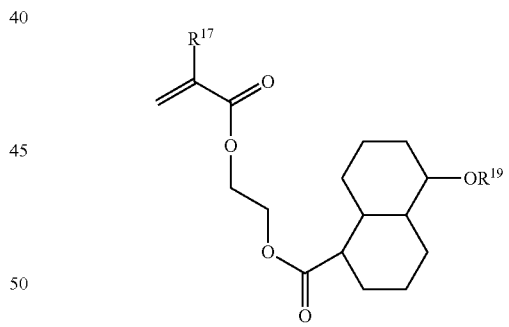
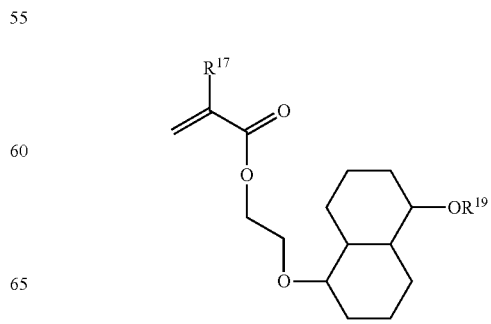

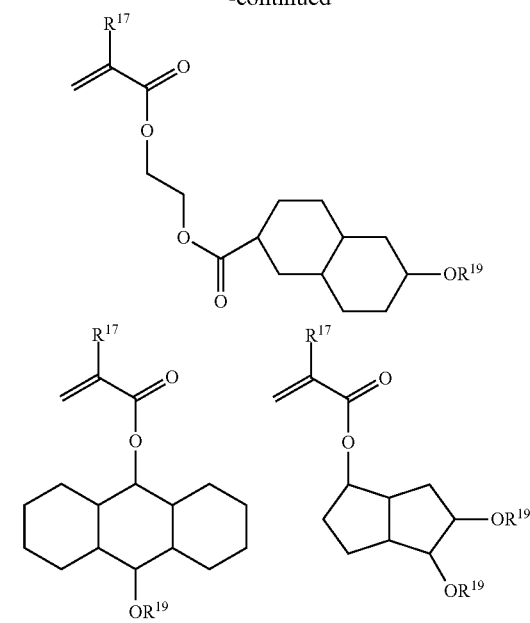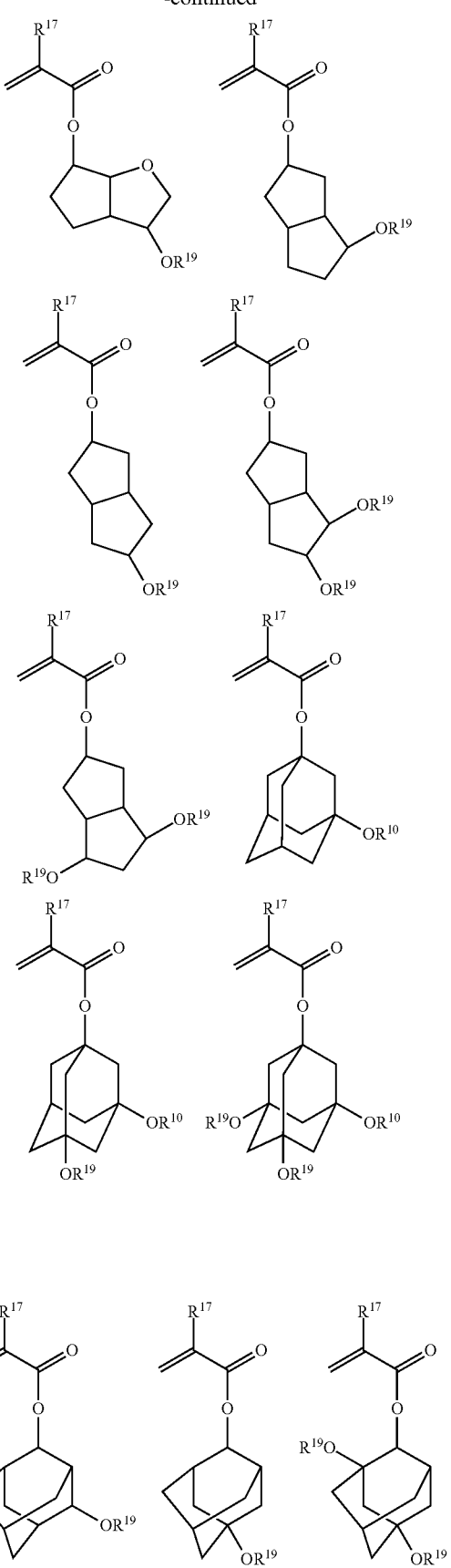

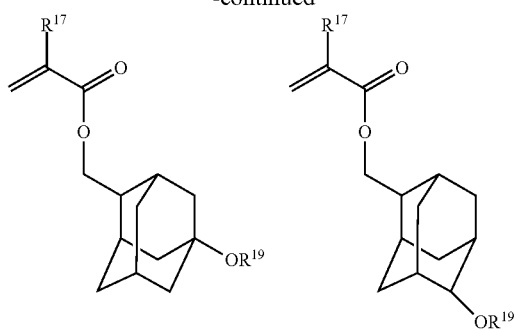
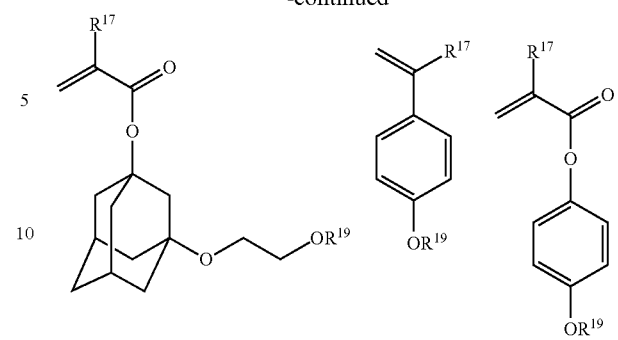
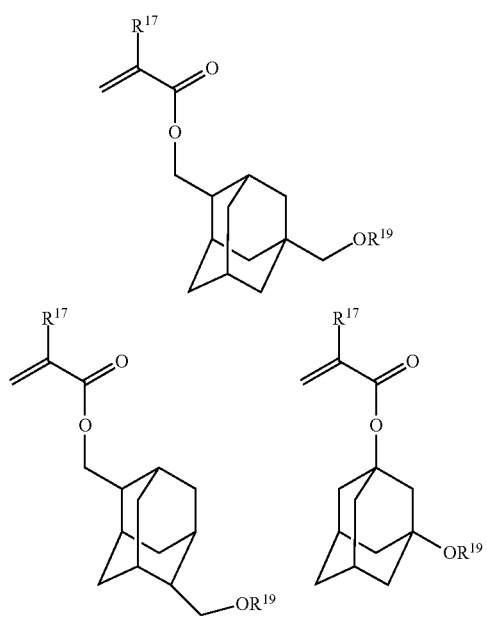
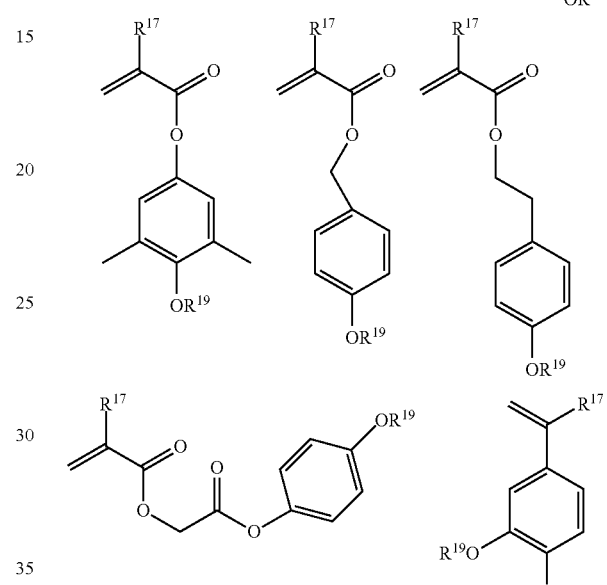
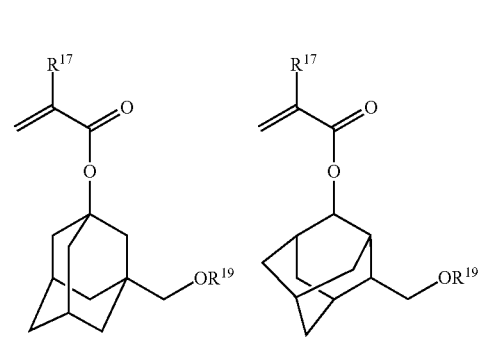
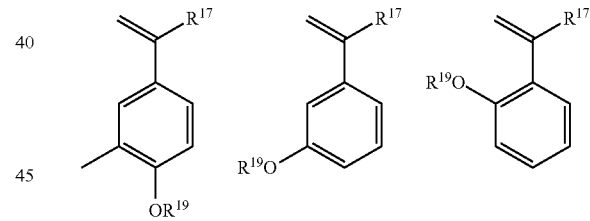
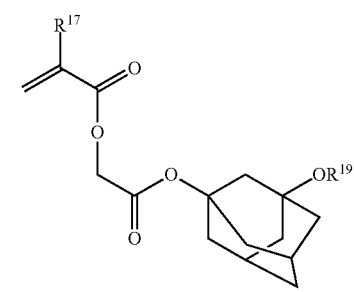
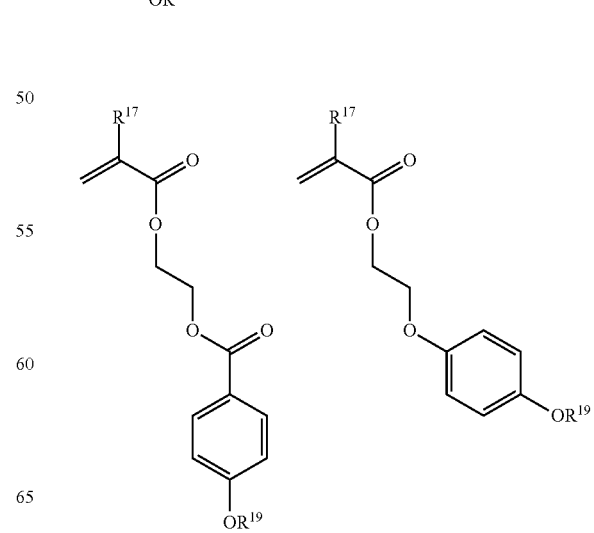

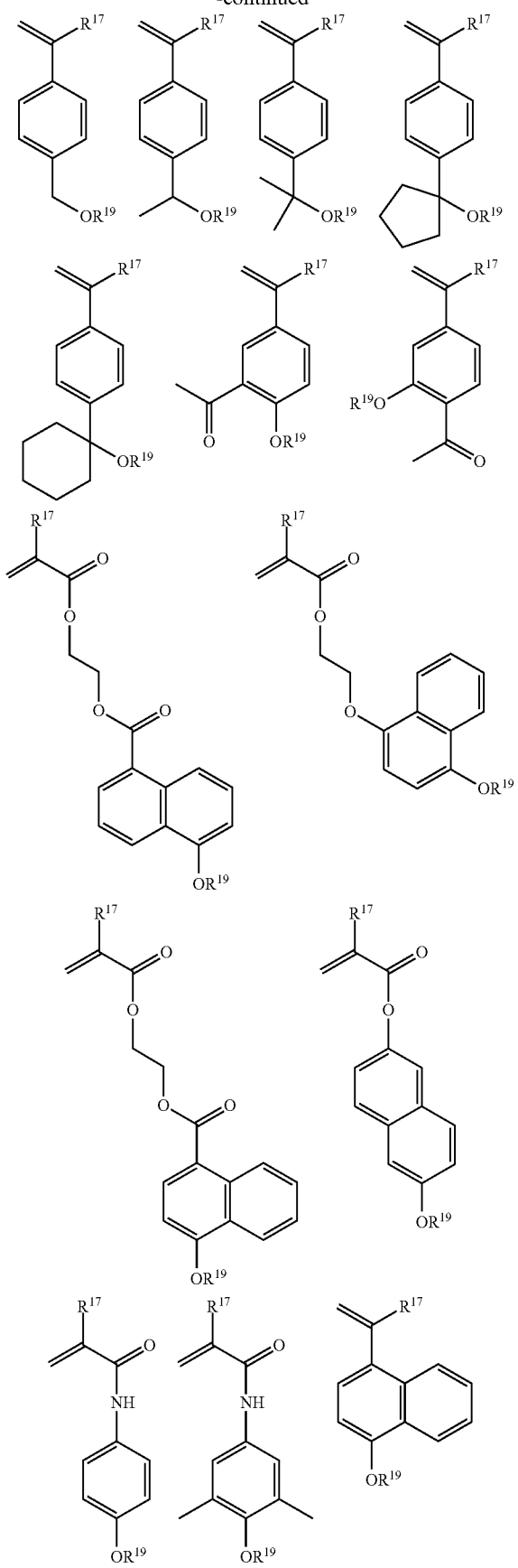
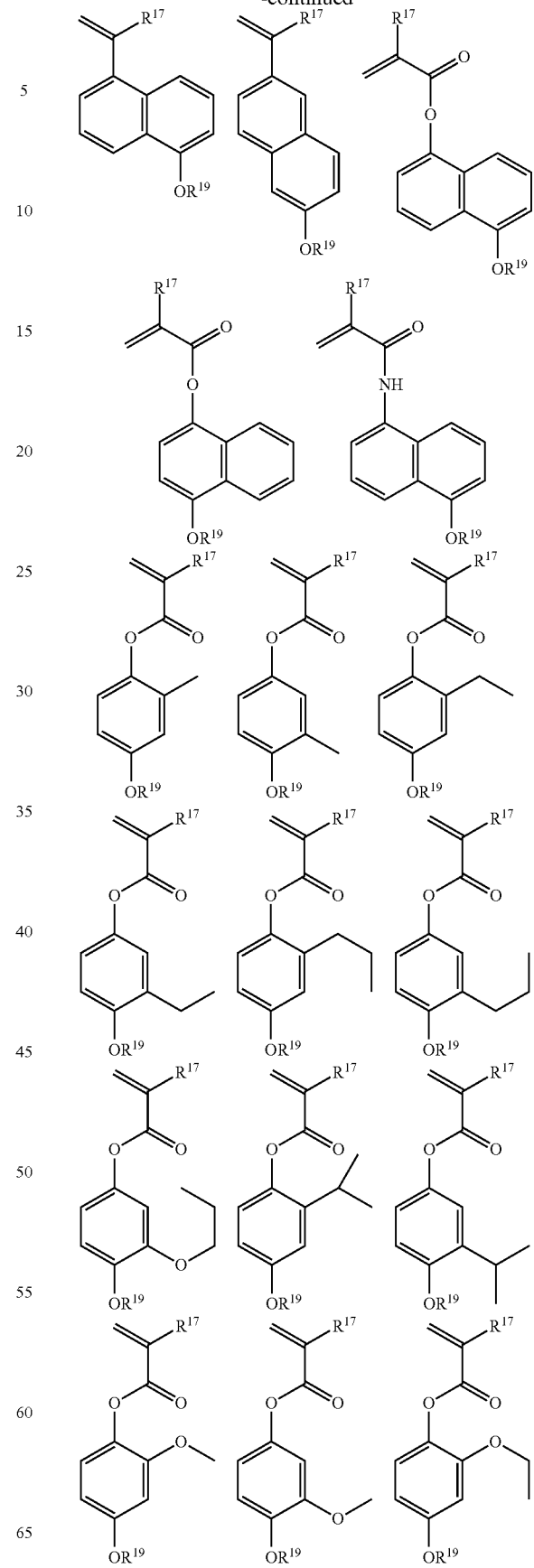

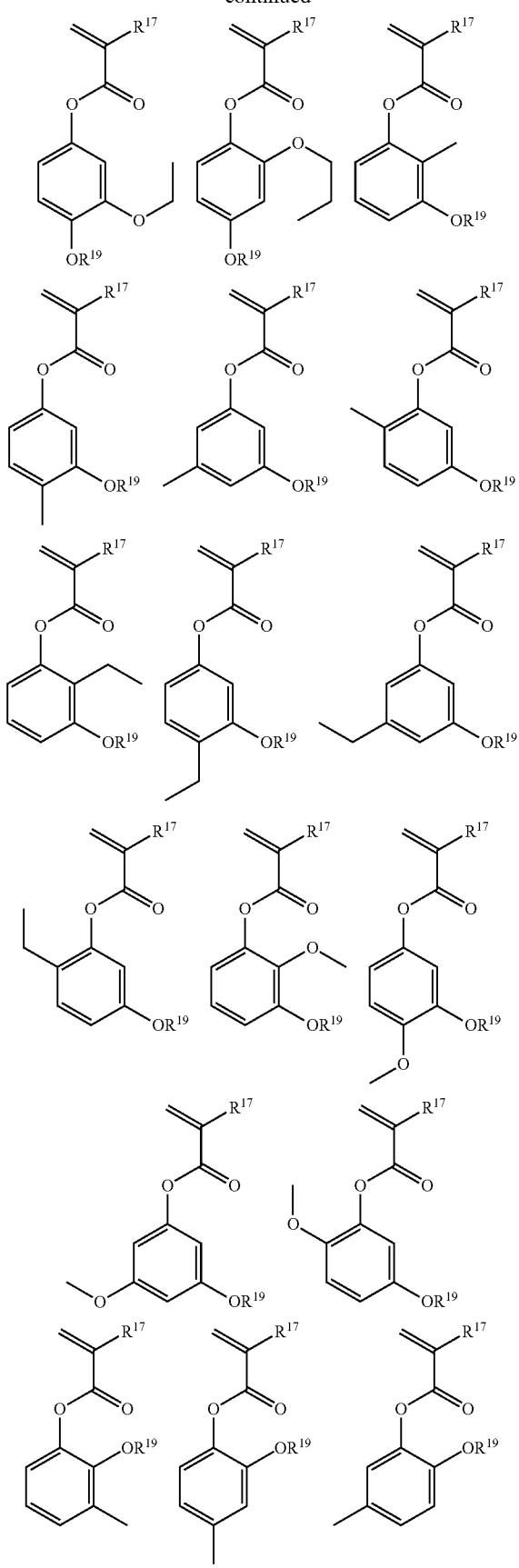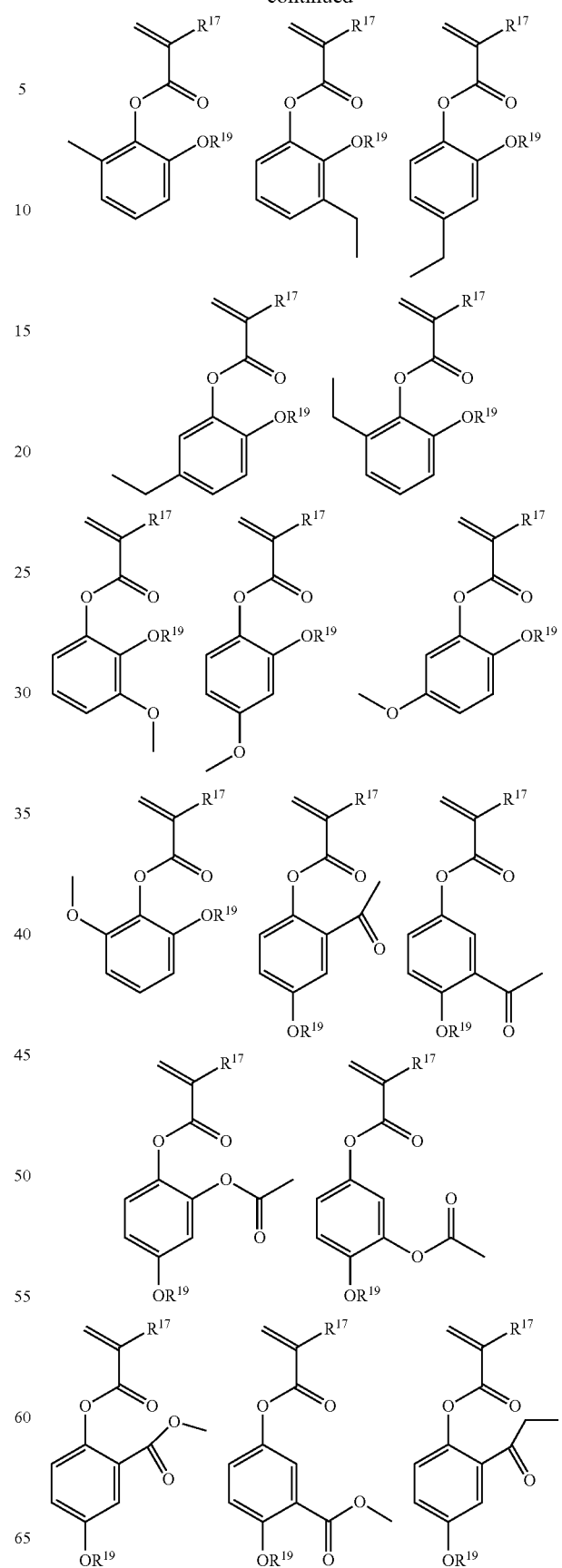

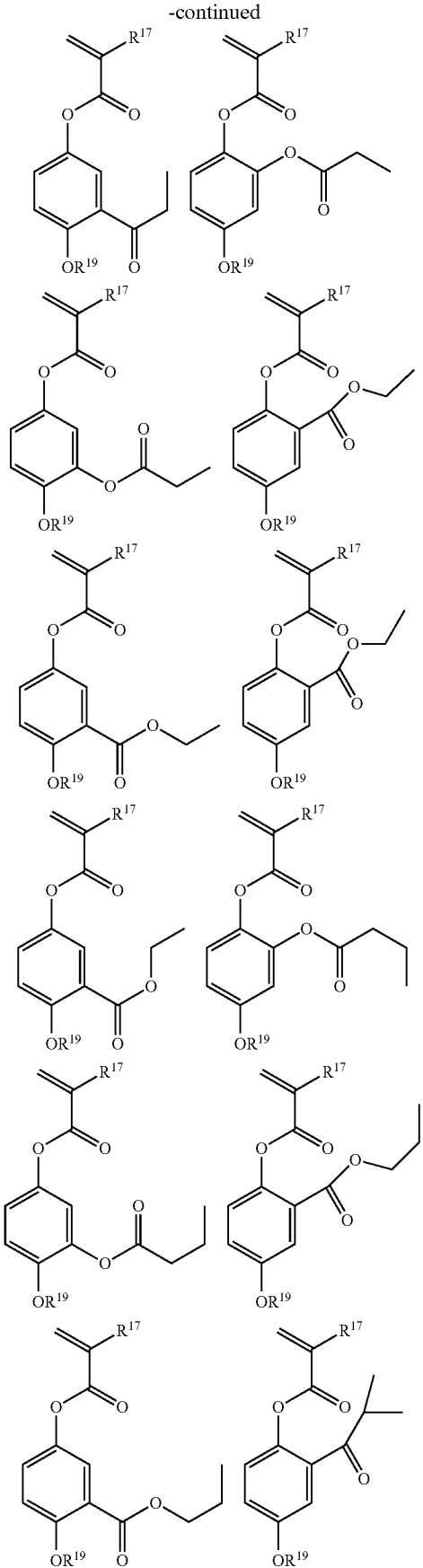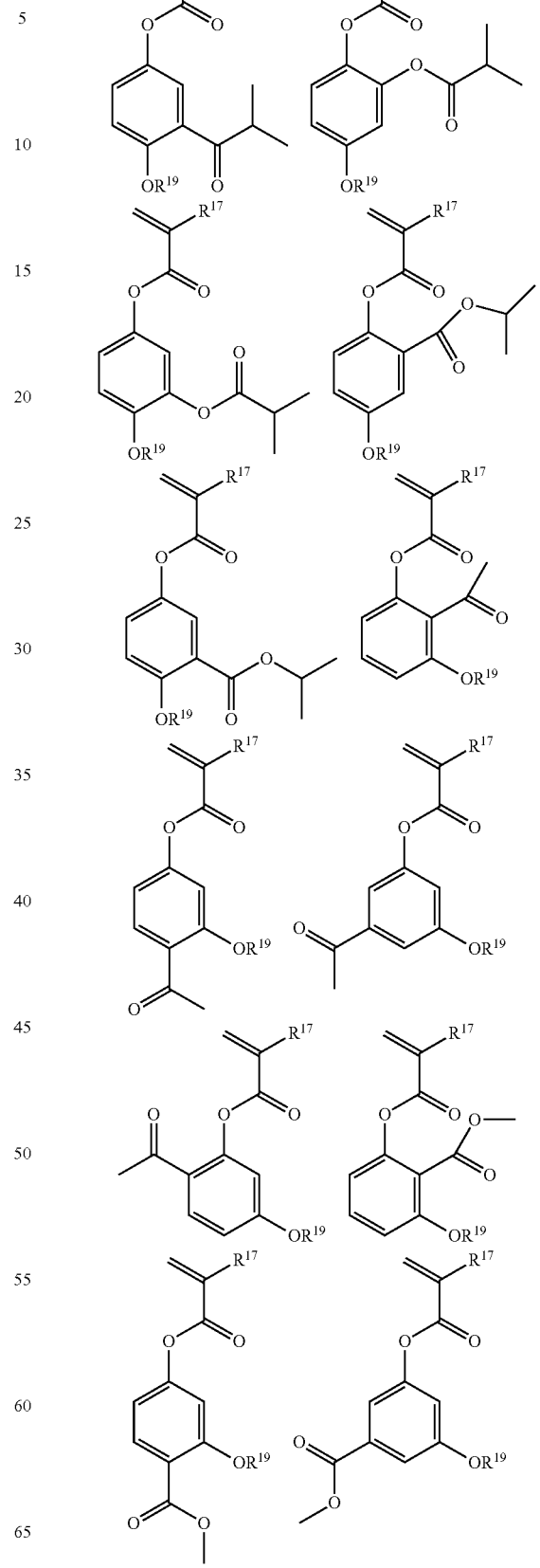

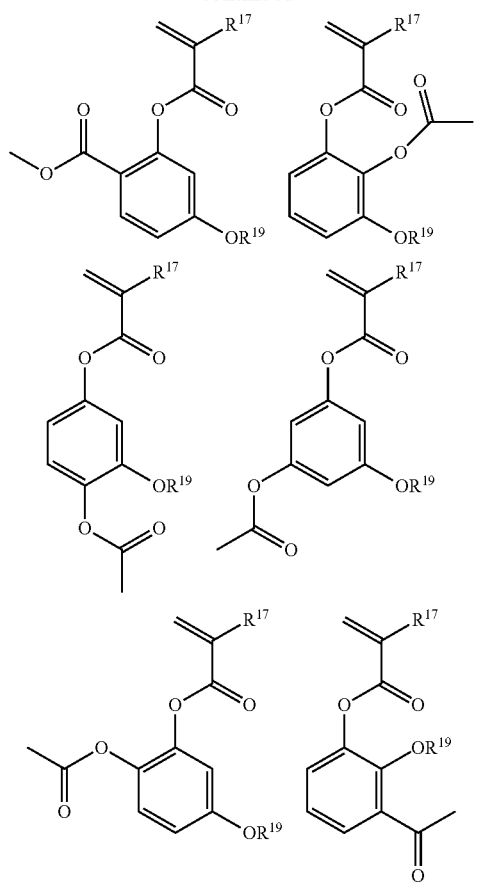
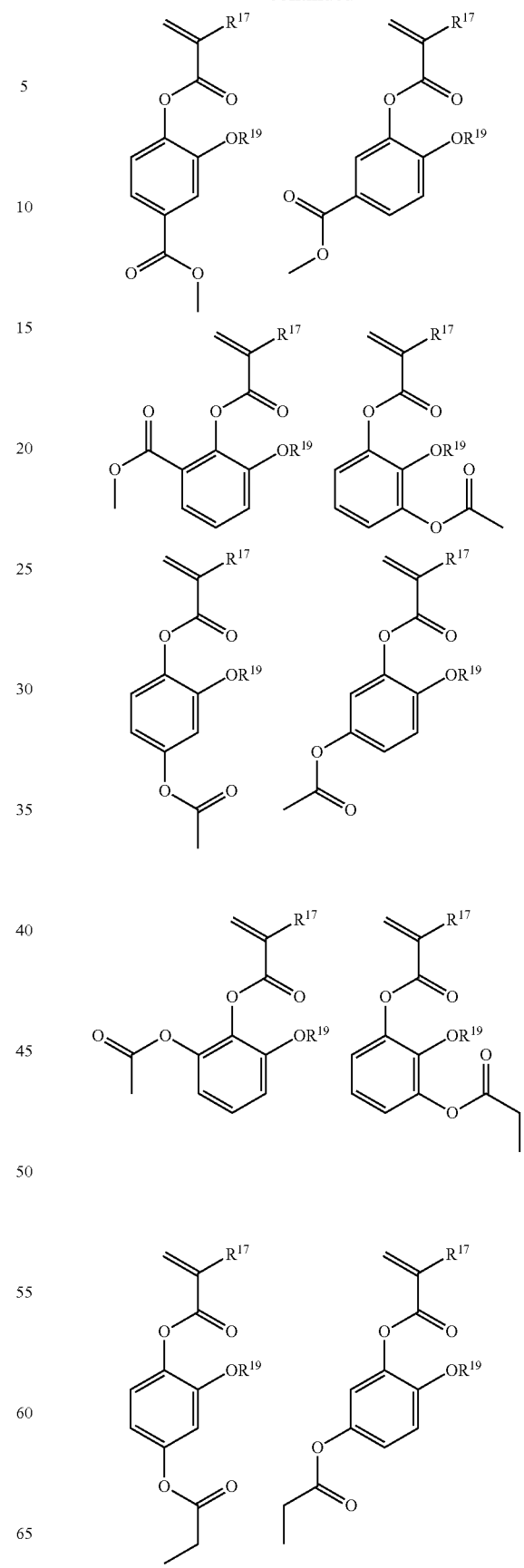

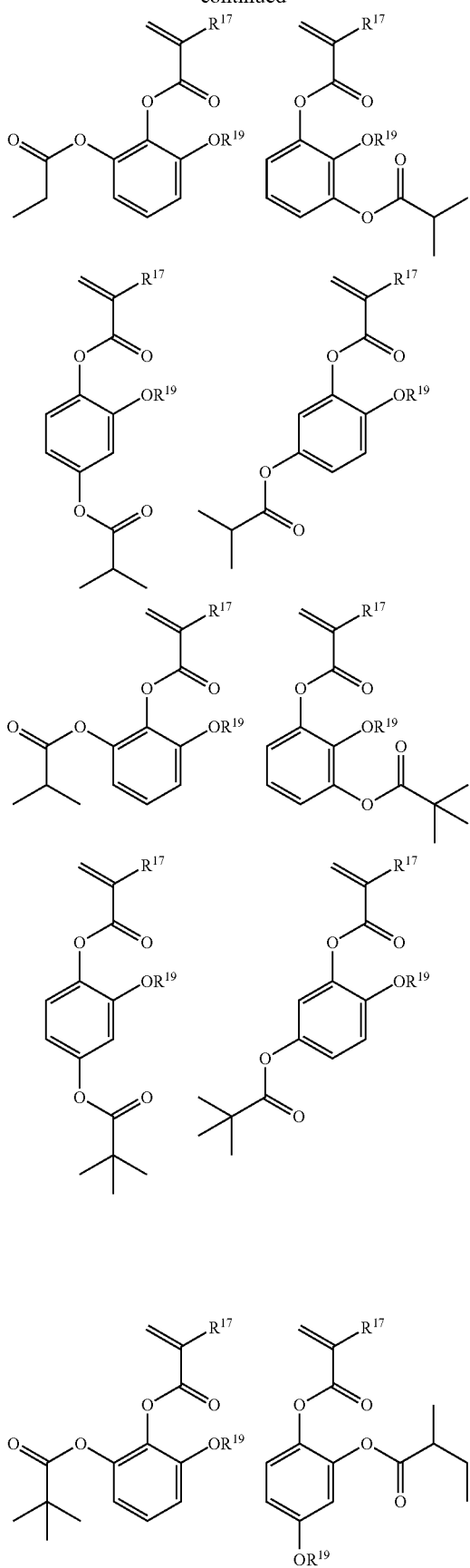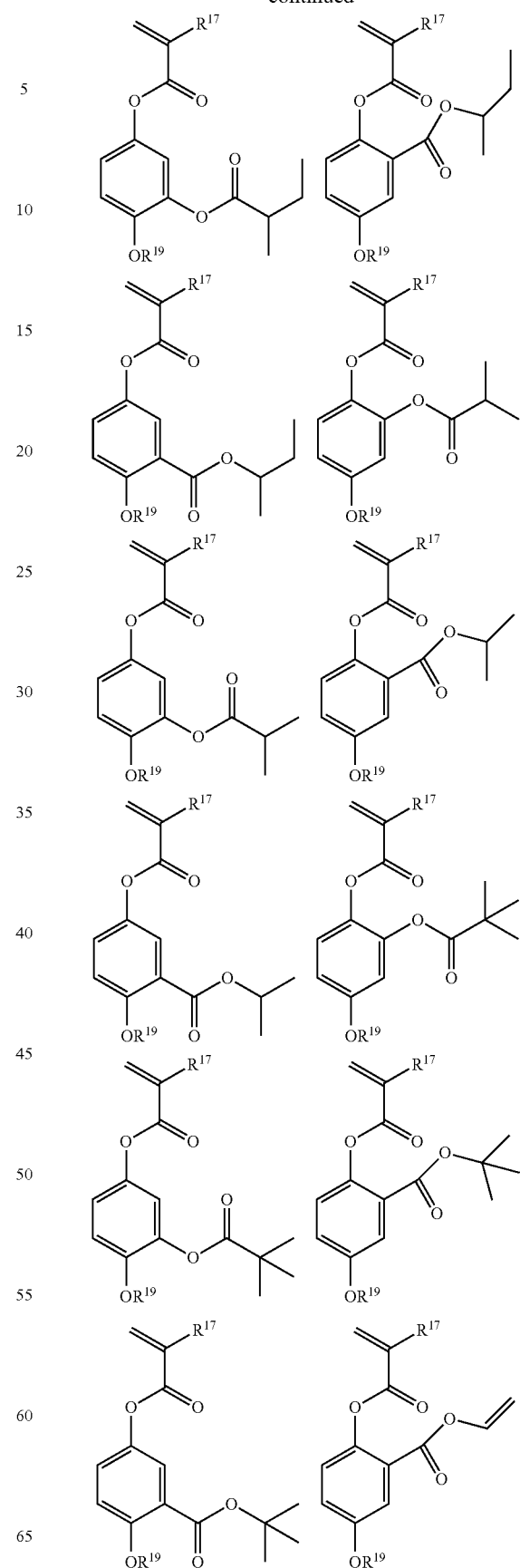

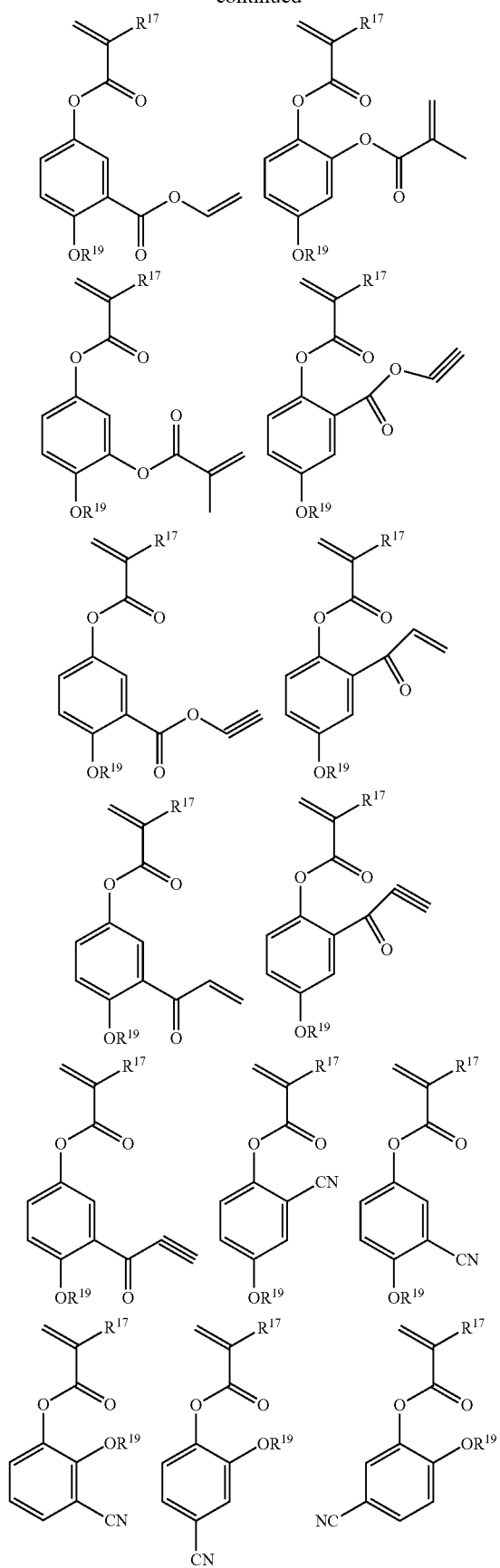
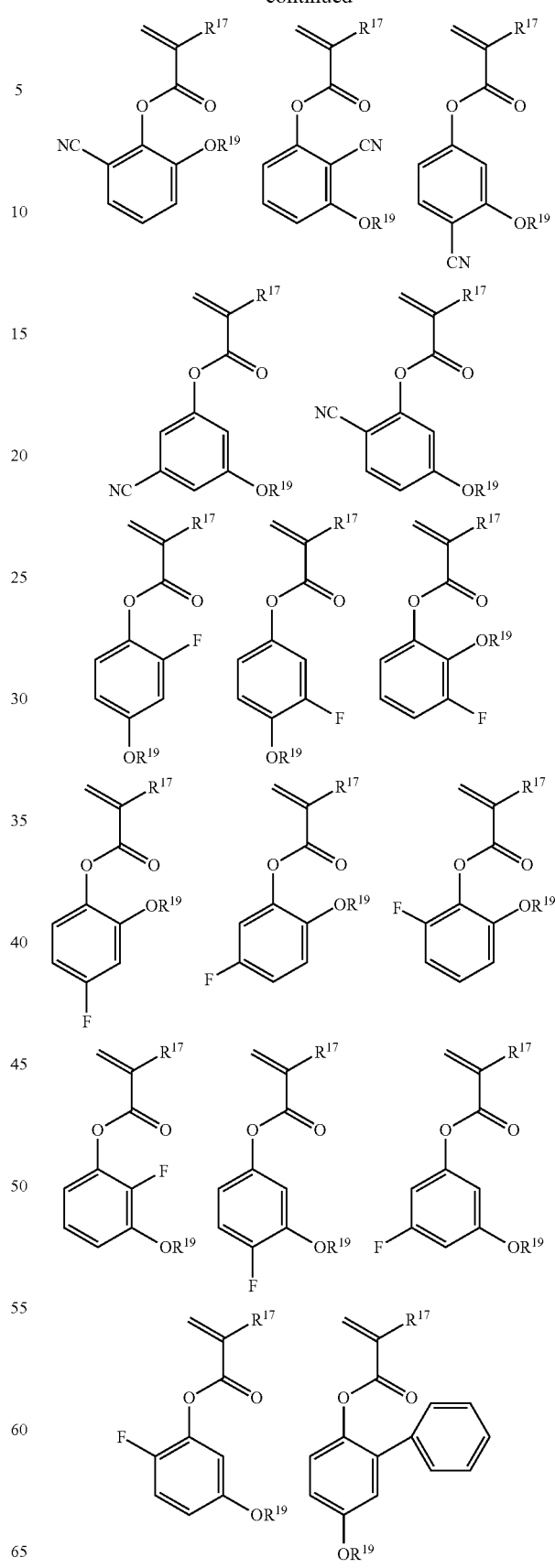

-continued
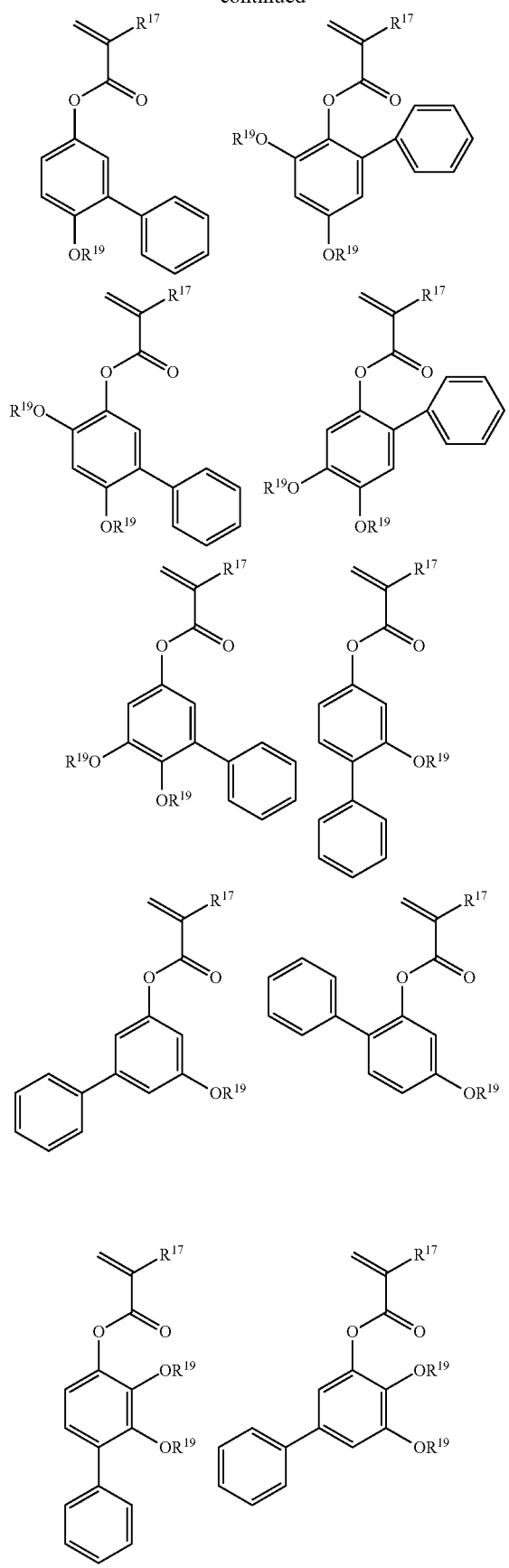
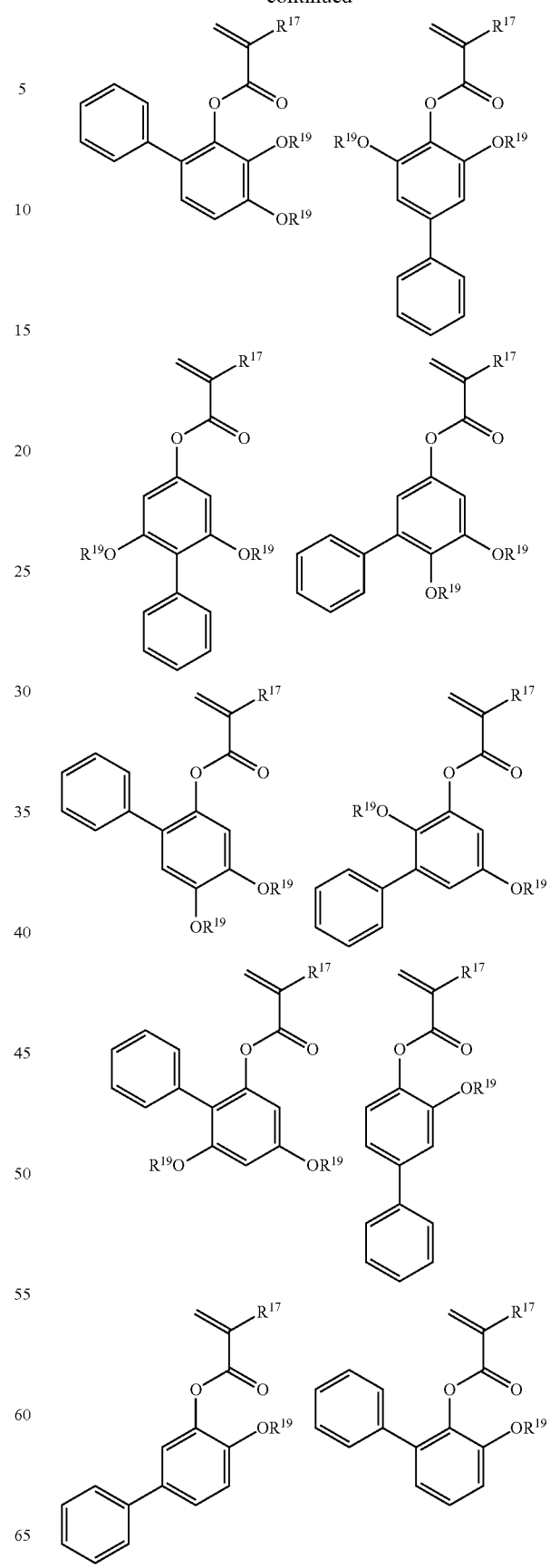

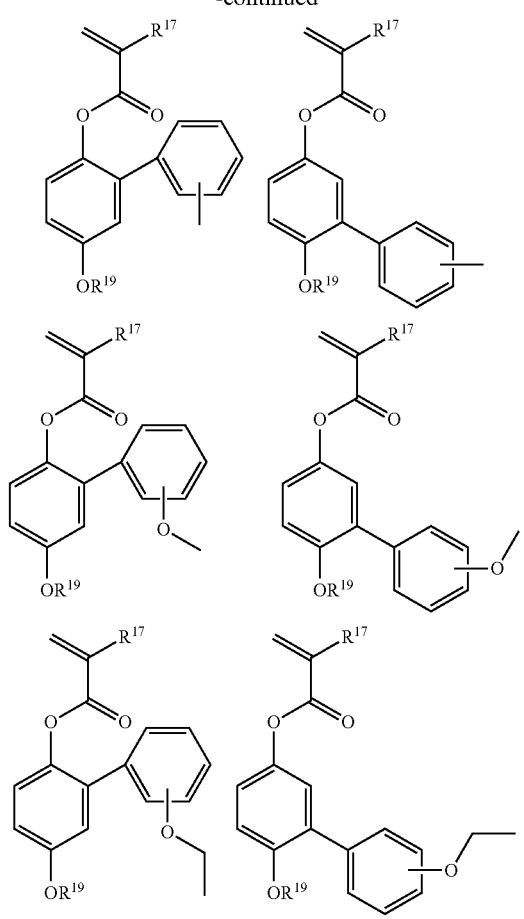
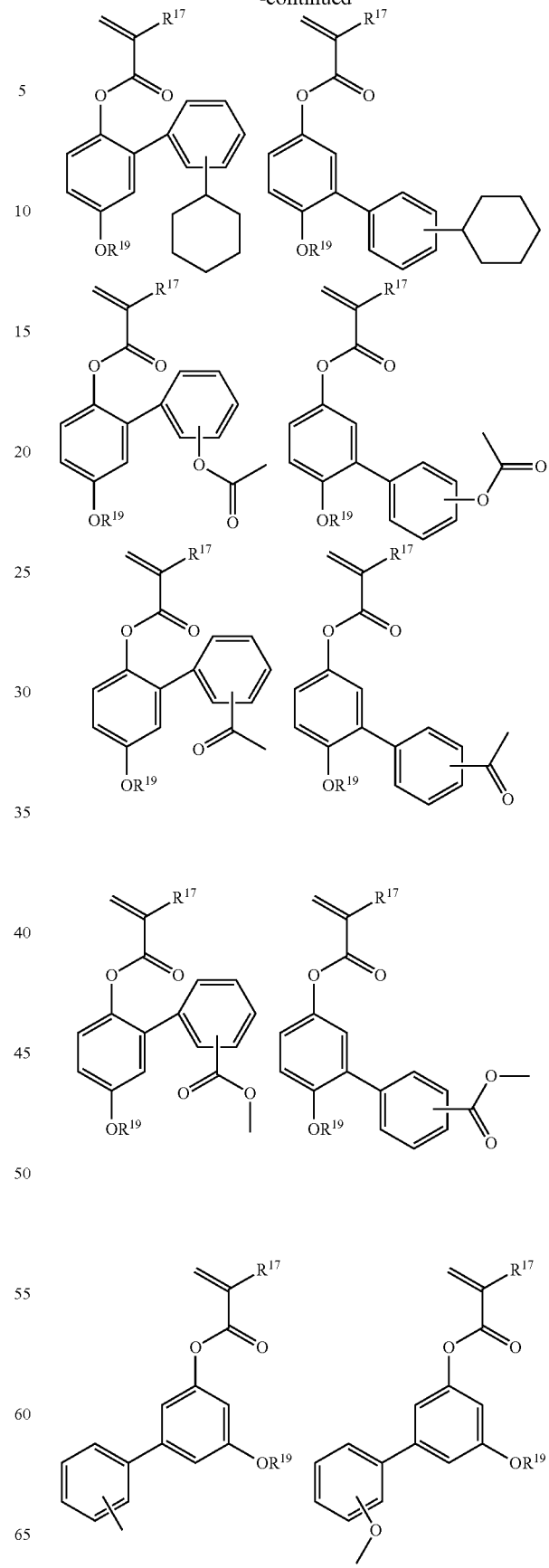

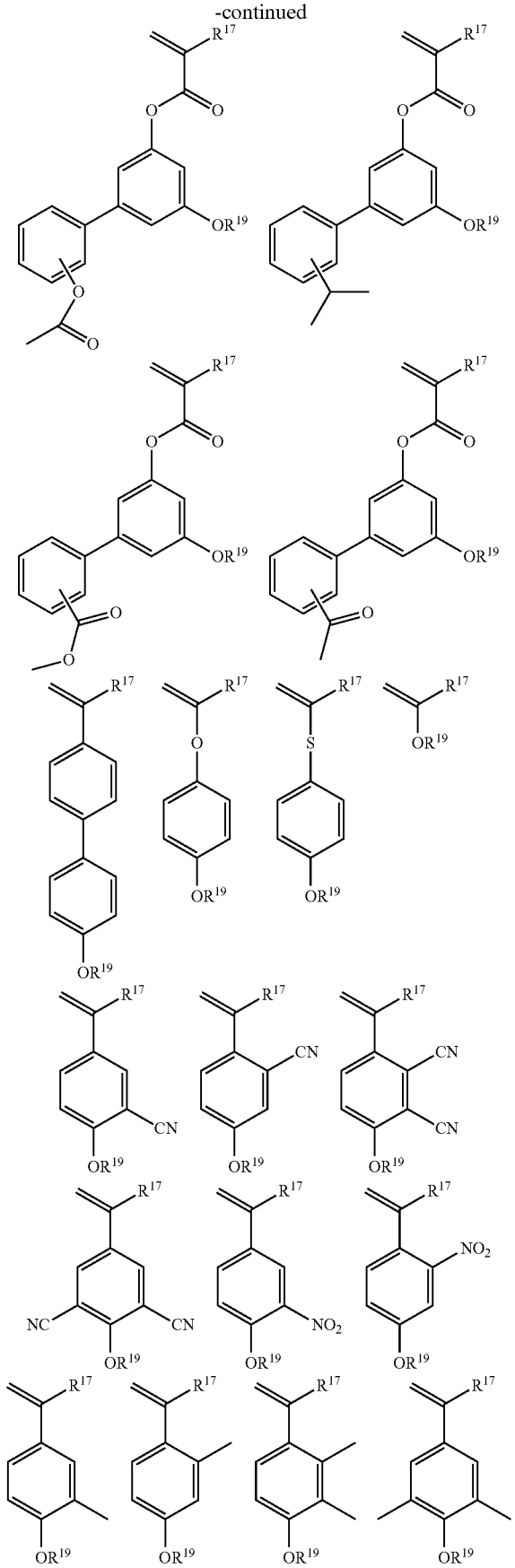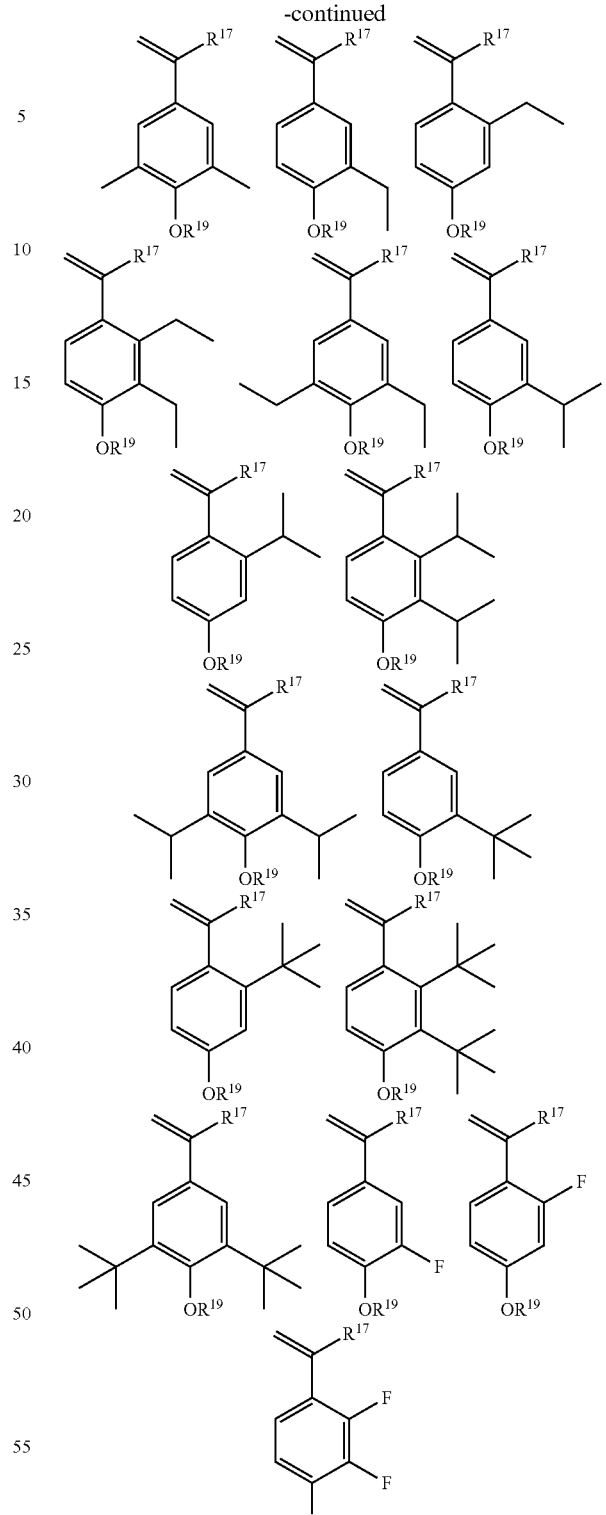

Herein $R^{17}$ and $R^{19}$ are as defined above.

The acid labile group represented by $R^a$, $R^b$, $R^c$, $R^{16}$ or $R^{19}$ may be selected from a variety of such groups while they may be the same or different. Suitable acid labile groups include groups of the formula (AL-10), acetal groups of the formula (AL-11), tertiary alkyl groups of the formula (AL-12), and $C_4$-$C_{20}$ oxoalkyl groups, but are not limited thereto.

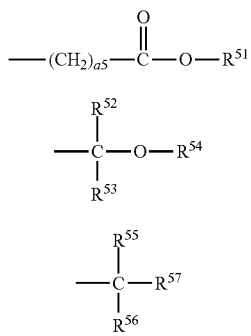

(AL-10)

(AL-11)

(AL-12)

In formulae (AL-10) and (AL-11), $R^{51}$ and $R^{54}$ each are a monovalent hydrocarbon group of 1 to 40 carbon atoms, more specifically 1 to 20 carbon atoms, which may contain a heteroatom such as oxygen, sulfur, nitrogen or fluorine. $R^{52}$ and $R^{53}$ each are hydrogen or a monovalent hydrocarbon group of 1 to 20 carbon atoms which may contain a heteroatom such as oxygen, sulfur, nitrogen or fluorine. The subscript "a5" is an integer of 0 to 10, and especially 1 to 5. Alternatively, a pair of $R^{52}$ and $R^{53}$, $R^{52}$ and $R^{54}$, or $R^{53}$ and $R^{54}$ may bond together to form a ring, specifically aliphatic ring, with the carbon atom or the carbon and oxygen atoms to which they are attached, the ring having 3 to 20 carbon atoms, especially 4 to 16 carbon atoms. In formula (AL-12), $R^{55}$, $R^{56}$ and $R^{57}$ each are a monovalent hydrocarbon group of 1 to 20 carbon atoms which may contain a heteroatom such as oxygen, sulfur, nitrogen or fluorine. Alternatively, a pair of $R^{55}$ and $R^{56}$, $R^{55}$ and $R^{57}$, or $R^{56}$ and $R^{57}$ may bond together to form a ring, specifically aliphatic ring, with the carbon atom to which they are attached, the ring having 3 to 20 carbon atoms, especially 4 to 16 carbon atoms. Typical of the monovalent hydrocarbon group are straight, branched or cyclic alkyl groups.

Illustrative examples of the acid labile group of formula (AL-10) include tert-butoxycarbonyl, tert-butoxycarbonylmethyl, tert-pentyloxycarbonyl, tert-pentyloxycarbonylmethyl, 1-ethoxyethoxycarbonylmethyl, 2-tetrahydropyranyloxycarbonylmethyl and 2-tetrahydrofuranyloxycarbonylmethyl as well as substituent groups of the following formulae (AL-10)-1 to (AL-10)-10.

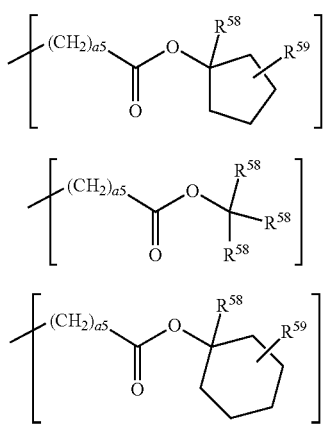

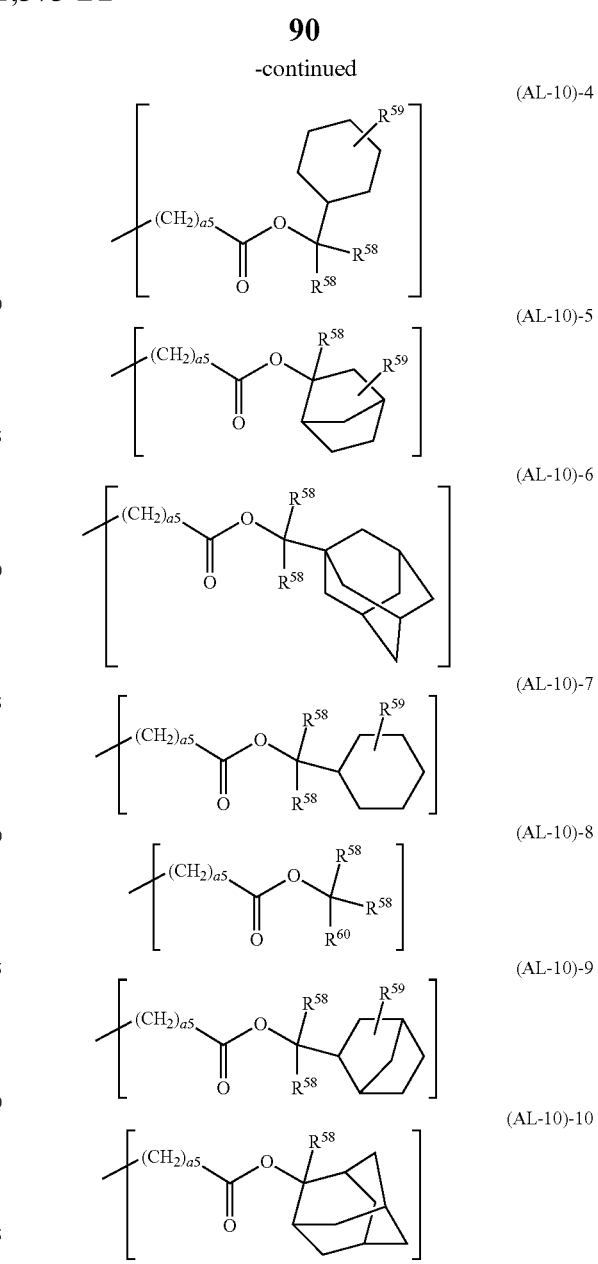

In formulae (AL-10)-1 to (AL-10)-10, $R^{58}$ is each independently a straight, branched or cyclic $C_1$-$C_8$ alkyl group, $C_6$-$C_{20}$ aryl group or $C_7$-$C_{20}$ aralkyl group; $R^{59}$ is hydrogen or a straight, branched or cyclic $C_1$-$C_{20}$ alkyl group; $R^{60}$ is a $C_6$-$C_{20}$ aryl group or $C_7$-$C_{20}$ aralkyl group; and a5 is an integer of 0 to 10, especially 1 to 5.

Illustrative examples of the acetal group of formula (AL-11) include those of the following formulae (AL-11)-1 to (AL-11)-112.

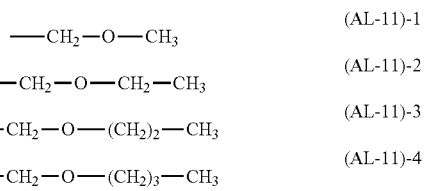

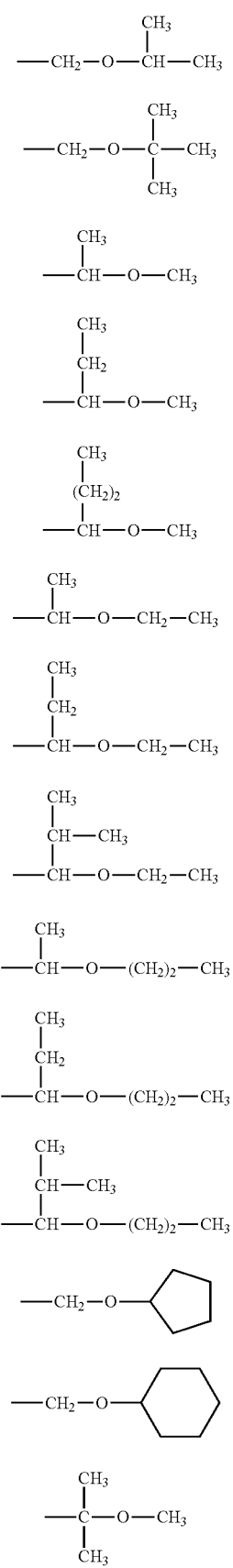
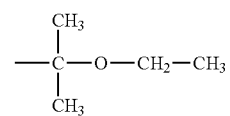 (AL-11)-19
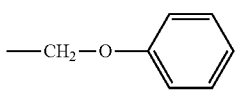 (AL-11)-20
 (AL-11)-21
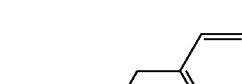 (AL-11)-22
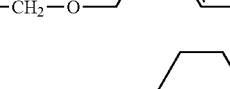 (AL-11)-23
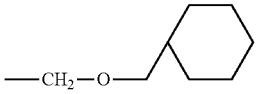 (AL-11)-24
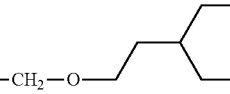 (AL-11)-25
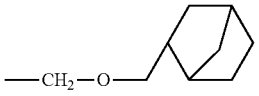 (AL-11)-26
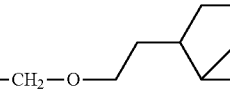 (AL-11)-27
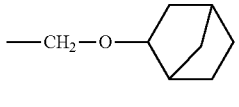 (AL-11)-28
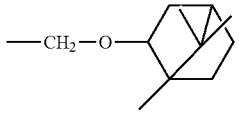 (AL-11)-29
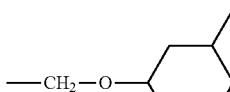 (AL-11)-29
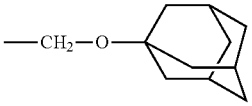 (AL-11)-30
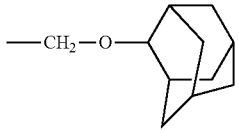 (AL-11)-31

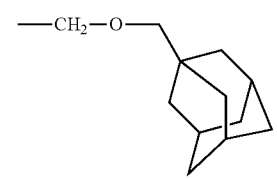 (AL-11)-32
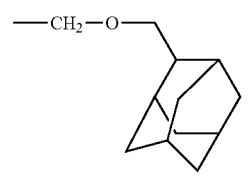 (AL-11)-33
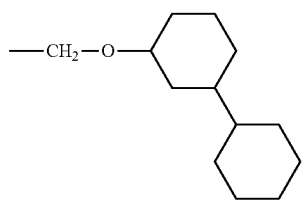 (AL-11)-34
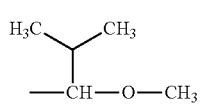 (AL-11)-35
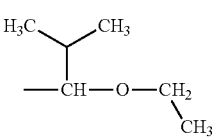 (AL-11)-36
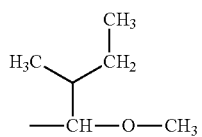 (AL-11)-37
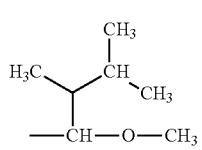 (AL-11)-38
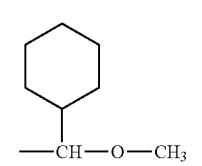 (AL-11)-39
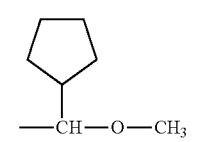 (AL-11)-40
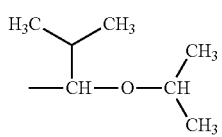 (AL-11)-41
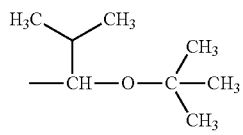 (AL-11)-42
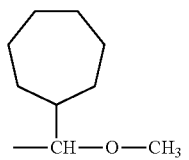 (AL-11)-43
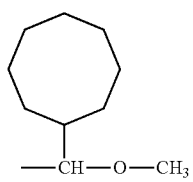 (AL-11)-44
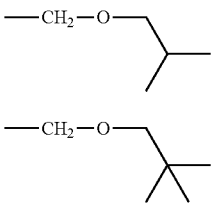 (AL-11)-45
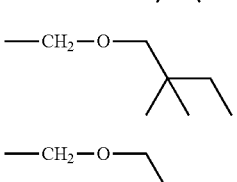 (AL-11)-46
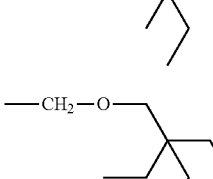 (AL-11)-47
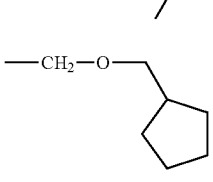 (AL-11)-48
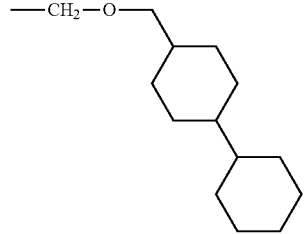 (AL-11)-49
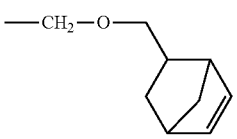 (AL-11)-50
 (AL-11)-51
(AL-11)-52

(AL-11)-53 —CH₂—O— 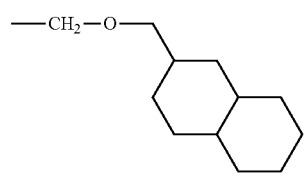
(AL-11)-54 —CH₂—O— 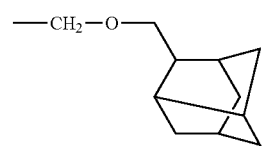
(AL-11)-55 —CH₂—O— 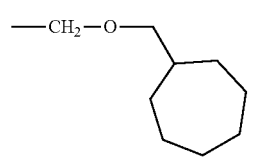
(AL-11)-56 —CH₂—O— 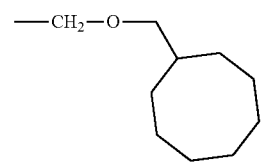
(AL-11)-57 —CH₂—O— 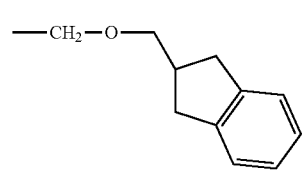
(AL-11)-58 —CH₂—O— 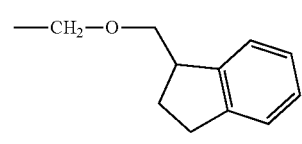
(AL-11)-59 —CH₂—O— 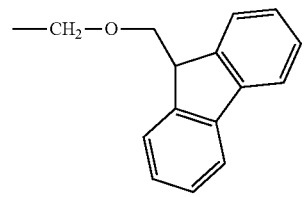
(AL-11)-60 —CH₂—O— 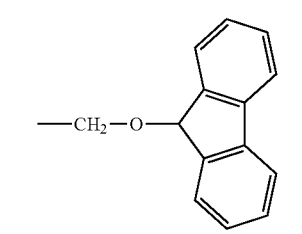
(AL-11)-61 —CH₂—O— 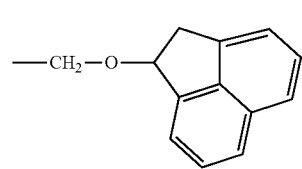
(AL-11)-62 —CH₂—O— 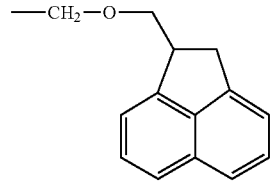
(AL-11)-63 —CH₂—O— 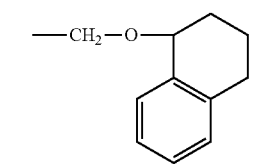
(AL-11)-64 —CH₂—O— 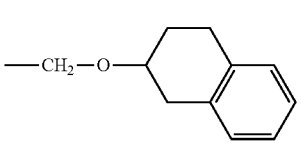
(AL-11)-65 —CH₂—O— 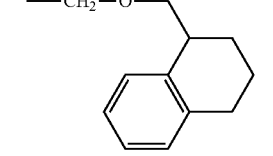
(AL-11)-66 —CH₂—O— 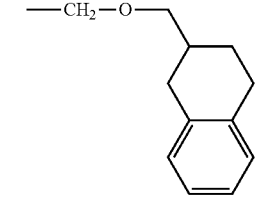
(AL-11)-67 —CH₂—O— 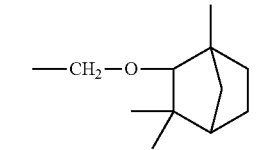
(AL-11)-68 —CH₂—O— 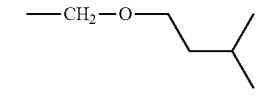
(AL-11)-69 —CH₂—O— 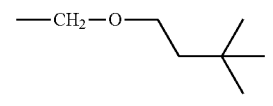
(AL-11)-70 —CH₂—O— 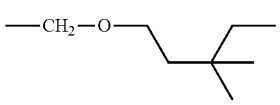
(AL-11)-71 —CH₂—O— 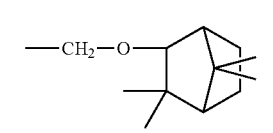
(AL-11)-72 —CH₂—O— 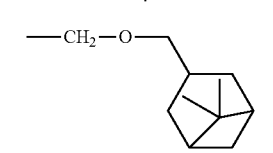

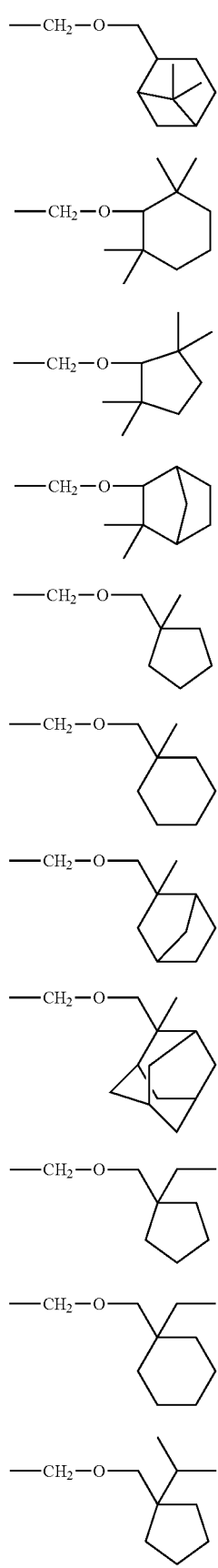
(AL-11)-73
(AL-11)-74
(AL-11)-75
(AL-11)-76
(AL-11)-77
(AL-11)-78
(AL-11)-79
(AL-11)-80
(AL-11)-81
(AL-11)-82
(AL-11)-83
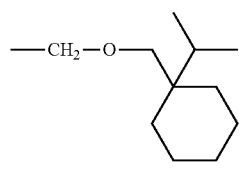
(AL-11)-84
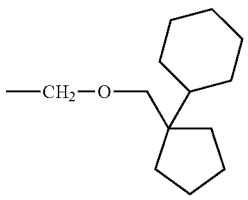
(AL-11)-85
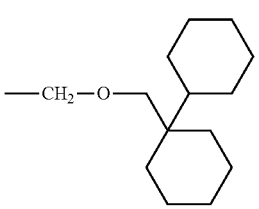
(AL-11)-86
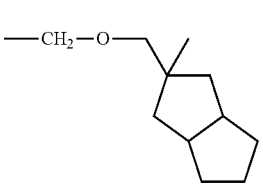
(AL-11)-87
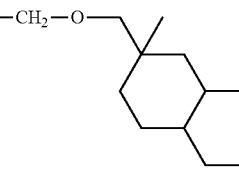
(AL-11)-88
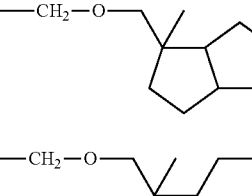
(AL-11)-89
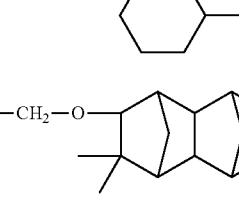
(AL-11)-90
(AL-11)-91
(AL-11)-92
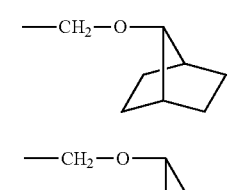
(AL-11)-93

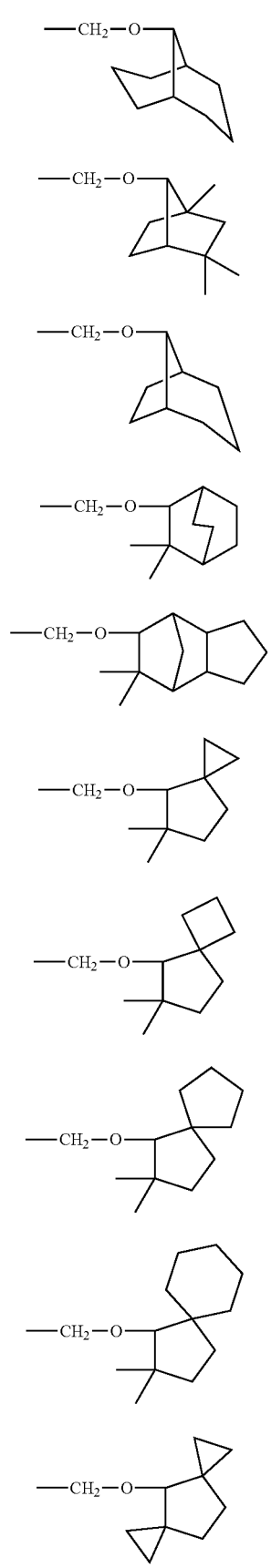
(AL-11)-94
(AL-11)-95
(AL-11)-96
(AL-11)-97
(AL-11)-98
(AL-11)-99
(AL-11)-100
(AL-11)-101
(AL-11)-102
(AL-11)-103
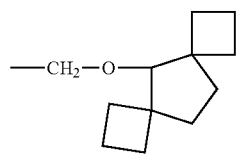
(AL-11)-104
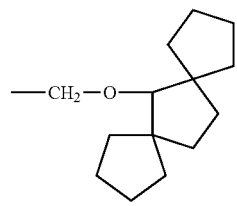
(AL-11)-105
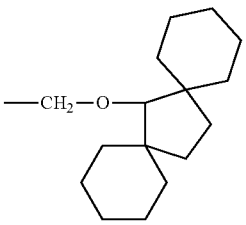
(AL-11)-106
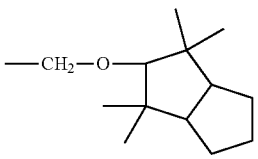
(AL-11)-107
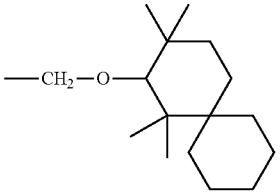
(AL-11)-108
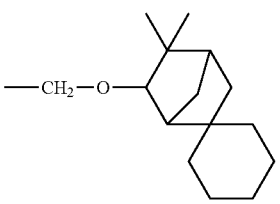
(AL-11)-109
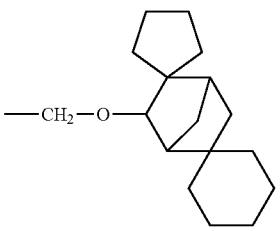
(AL-11)-110
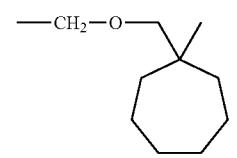
(AL-11)-111

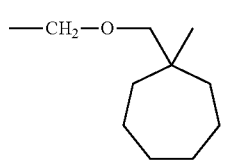
(AL-11)-112

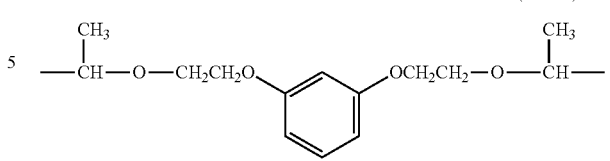
(AL-11)-117

Other examples of acid labile groups include those of the following formula (AL-11a) or (AL-11b) while the polymer may be crosslinked within the molecule or between molecules with these acid labile groups.

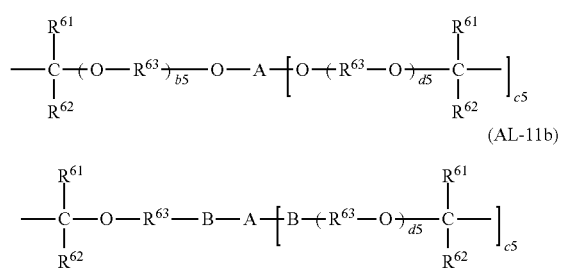
(AL-11a)
(AL-11b)

Herein $R^{61}$ and $R^{62}$ each are hydrogen or a straight, branched or cyclic $C_1$-$C_8$ alkyl group, or $R^{61}$ and $R^{62}$ may bond together to form a ring with the carbon atom to which they are attached, and $R^{61}$ and $R^{62}$ are straight or branched $C_1$-$C_8$ alkylene groups when they form a ring. $R^{63}$ is a straight, branched or cyclic $C_1$-$C_{10}$ alkylene group. Each of b5 and d5 is an integer of 0 to 10, and c5 is an integer of 1 to 7. "A" is a (c5+1)-valent aliphatic or alicyclic saturated hydrocarbon group, aromatic hydrocarbon group or heterocyclic group having 1 to 50 carbon atoms, which may contain a heteroatom such as oxygen, sulfur or nitrogen or in which some carbon-bonded hydrogen atoms may be substituted by hydroxyl, carboxyl, acyl radicals or fluorine atoms. "B" is —CO—O—, —NHCO—O— or —NHCONH—.

Preferably, "A" is selected from divalent to tetravalent, straight, branched or cyclic $C_1$-$C_{20}$ alkylene, alkanetriyl and alkanetetrayl groups, and $C_6$-$C_{30}$ arylene groups; each of b5 and d5 is an integer of 0 to 5; and c5 is an integer of 1 to 3.

The crosslinking acetal groups of formulae (AL-11a) and (AL-11b) are exemplified by the following formulae (AL-11)-113 through (AL-11)-120, but not limited thereto.

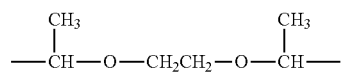
(AL-11)-113

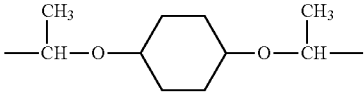
(AL-11)-114

(AL-11)-115

(AL-11)-116

(AL-11)-118

(AL-11)-119

(AL-11)-120

Illustrative examples of the tertiary alkyl group of formula (AL-12) include tert-butyl, triethylcarbyl, 1-ethylnorbornyl, 1-methylcyclohexyl, 1-ethylcyclopentyl, and tert-pentyl groups as well as those of (AL-12)-1 to (AL-12)-16.

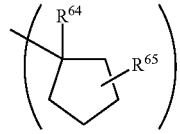
(AL-12)-1

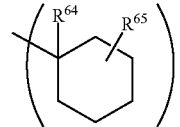
(AL-12)-2

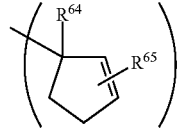
(AL-12)-3

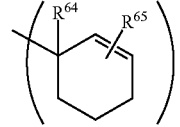
(AL-12)-4

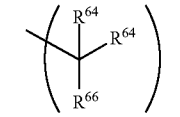
(AL-12)-5

Herein R⁶⁴ is each independently a straight, branched or cyclic $C_1$-$C_8$ alkyl group, $C_6$-$C_{20}$ aryl group or $C_7$-$C_{20}$ aralkyl group, or two R⁶⁴ groups may bond together to form a ring. R⁶⁵ and R⁶⁷ each are hydrogen, methyl or ethyl. R⁶⁶ is a $C_6$-$C_{20}$ aryl group or $C_7$-$C_{20}$ aralkyl group.

Also included are acid labile groups having the following formula (AL-12)-17. With acid labile groups containing R⁶⁸ representative of a di- or poly-valent alkylene or arylene group, the polymer may be crosslinked within the molecule or between molecules.

Herein, R⁶⁴ is as defined above, R⁶⁵ is a single bond, a straight, branched or cyclic $C_1$-$C_{20}$ alkylene group or $C_6$-$C_{20}$ arylene group, which may contain a heteroatom such as oxygen, sulfur or nitrogen, and b6 is an integer of 0 to 3.

The groups represented by R⁶⁴, R⁶⁵, R⁶⁶ and R⁶⁷ may contain a heteroatom such as oxygen, nitrogen or sulfur. Such groups are exemplified by those of the following formulae (AL-13)-1 to (AL-13)-7.

—(CH₂)₄OH (AL-13)-1

—(CH₂)₂O(CH₂)₃CH₃ (AL-13)-2

-continued

—CH$_2$—⟨cyclohexyl⟩—CH$_2$OH (AL-13)-3

—(CH$_2$)$_2$O(CH$_2$)$_2$OH (AL-13)-4

—(CH$_2$)$_6$OH (AL-13)-5

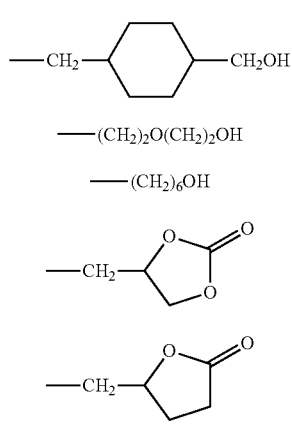

(AL-13)-6

(AL-13)-7

Of the acid labile groups of formula (AL-12), groups of exo-form structure having the following formula (AL-12)-18 are preferred.

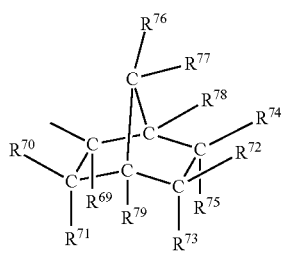

(AL-12)-18

Herein $R^{69}$ is a straight, branched or cyclic $C_1$-$C_8$ alkyl group or optionally substituted $C_6$-$C_{20}$ aryl group. $R^{70}$ to $R^{75}$, $R^{78}$, and $R^{79}$ are each independently hydrogen or a monovalent $C_1$-$C_{15}$ hydrocarbon group, typically straight, branched or cyclic alkyl, which may contain a heteroatom, $R^{76}$ and $R^{77}$ are hydrogen; or a pair of $R^{70}$ and $R^{71}$, $R^{72}$ and $R^{74}$, $R^{72}$ and $R^{75}$, $R^{73}$ and $R^{75}$, $R^{73}$ and $R^{79}$, $R^{74}$ and $R^{78}$, $R^{76}$ and $R^{77}$, or $R^{77}$ and $R^{78}$ may bond together to form a ring, typically aliphatic ring, with the carbon atom to which they are attached, and in this case, the ring-forming participant is a divalent $C_1$-$C_{15}$ hydrocarbon group, typically straight, branched or cyclic alkylene, which may contain a heteroatom. Also, a pair of $R^{70}$ and $R^{79}$, $R^{76}$ and $R^{79}$, or $R^{72}$ and $R^{78}$ which are attached to vicinal carbon atoms may bond together directly to form a double bond. The formula also represents an enantiomer.

Suitable recurring units having an exo-form structure represented by the formula (AL-12)-18 are those having the following formula:

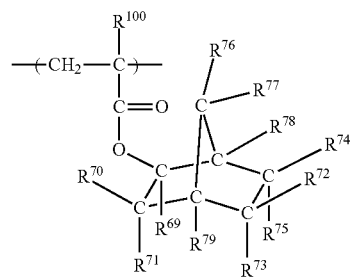

wherein $R^{69}$ to $R^{79}$ are as defined above, and $R^{100}$ is hydrogen or methyl. The monomers from which these recurring units are derived are described in U.S. Pat. No. 6,448,420 (JP-A 2000-327633). Illustrative non-limiting examples thereof are given below.

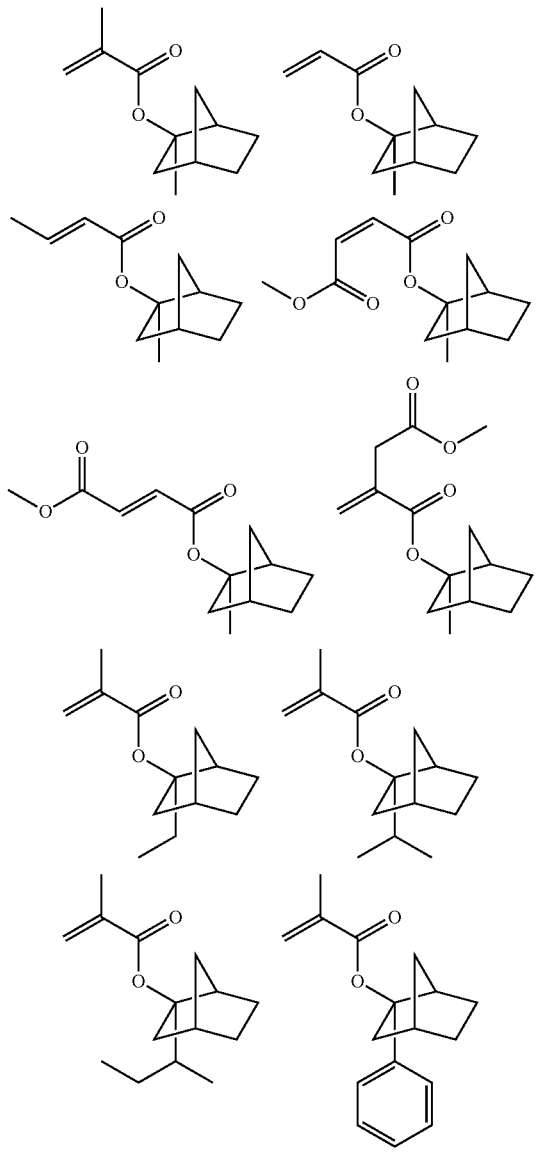

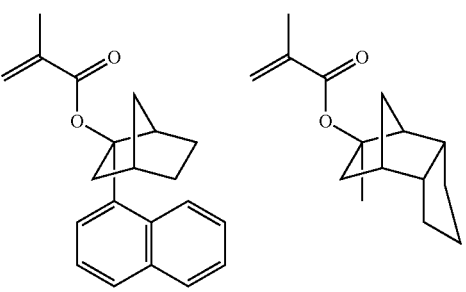

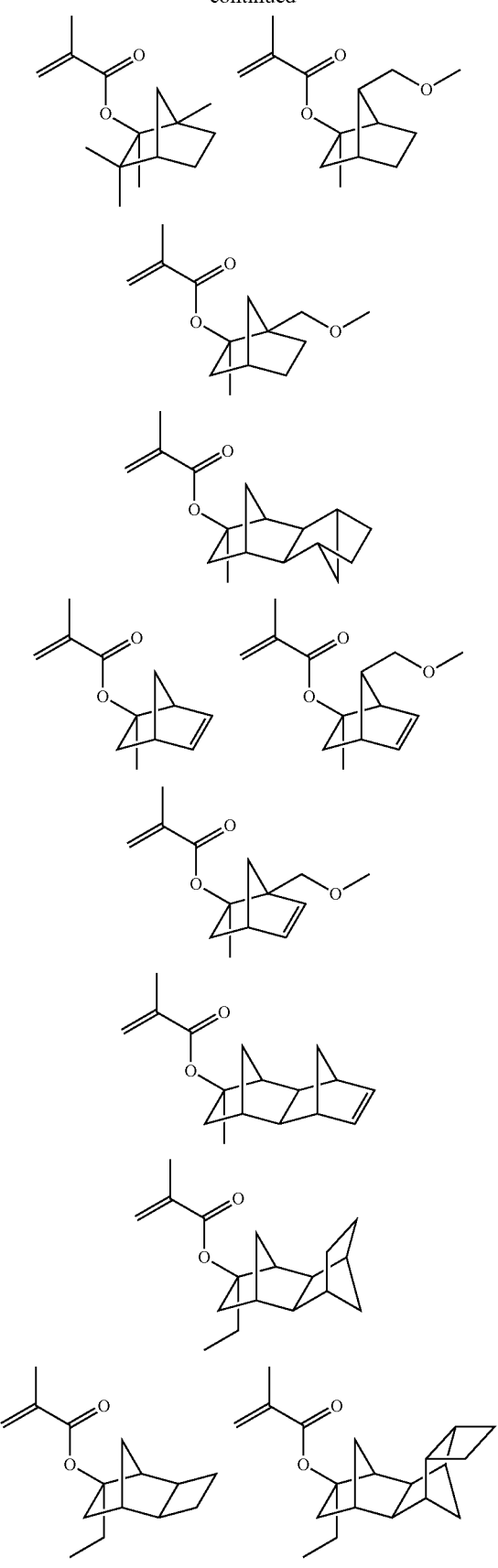

Also included in the acid labile groups of formula (AL-12) are acid labile groups having furandiyl, tetrahydrofurandiyl or oxanorbornanediyl as represented by the following formula (AL-12)-19.

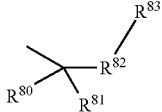

(AL-12)-19

Herein, $R^{80}$ and $R^{81}$ are each independently a $C_1$-$C_{10}$ monovalent hydrocarbon group. $R^{80}$ and $R^{81}$, taken together, may form an aliphatic hydrocarbon ring of 3 to 20 carbon atoms with the carbon atom to which they are attached. $R^{82}$ is furandiyl, tetrahydrofurandiyl or oxanorbornanediyl. $R^{83}$ is hydrogen or a $C_1$-$C_{10}$ monovalent hydrocarbon group which may contain a heteroatom. Typical of the monovalent hydrocarbon group are straight, branched or cyclic alkyl groups.

Recurring units having an acid labile group of formula (AL-12)-19 include those represented by the formula:

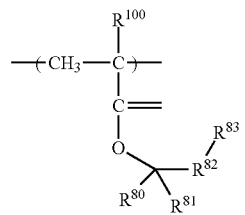

wherein $R^{100}$, $R^{80}$ to $R^{83}$ are as defined above. These recurring units are derived from monomers as exemplified below. Note that Me is methyl and Ac is acetyl.

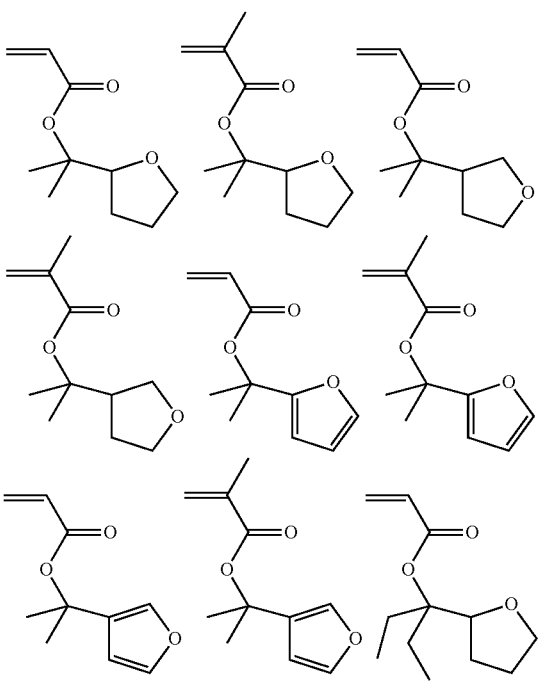

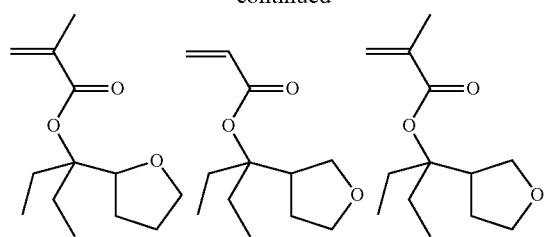
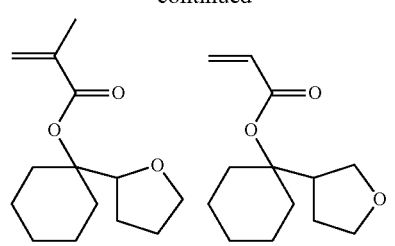
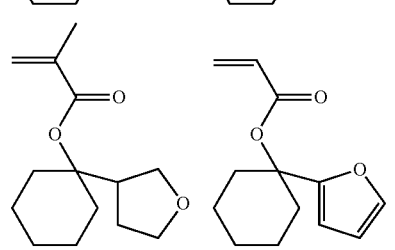
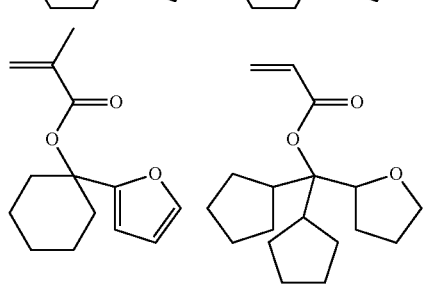
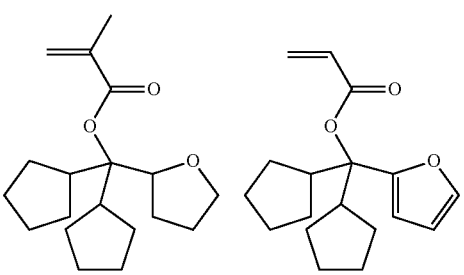
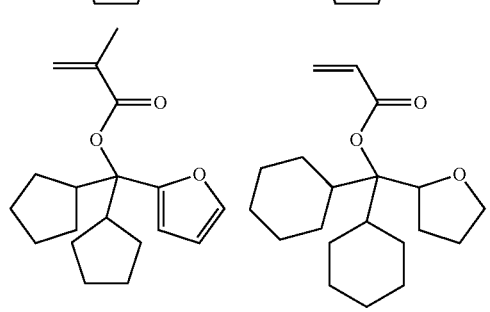
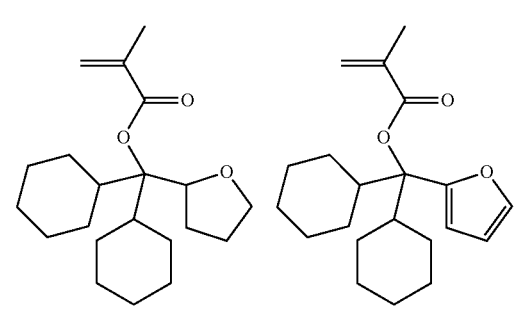

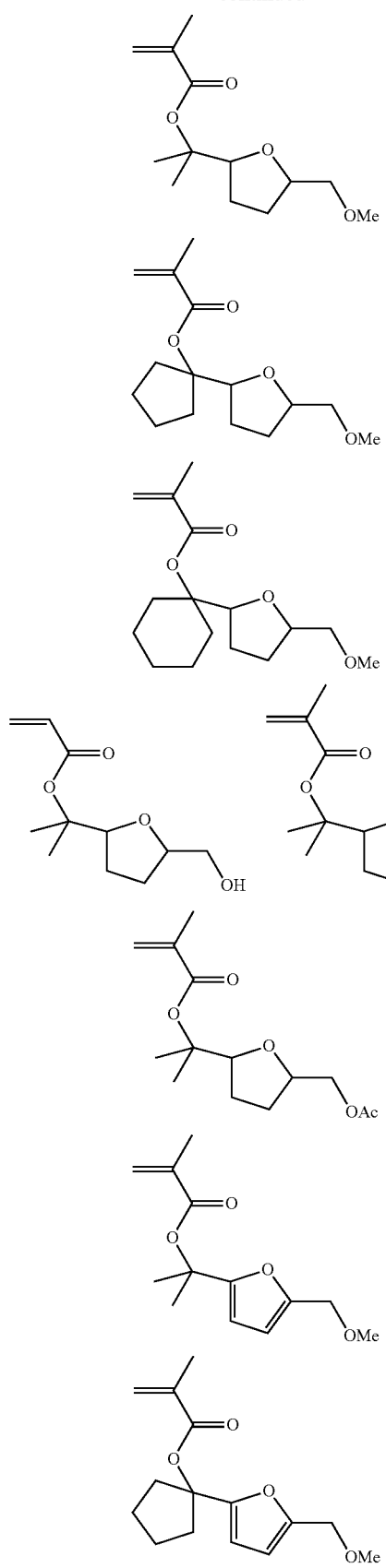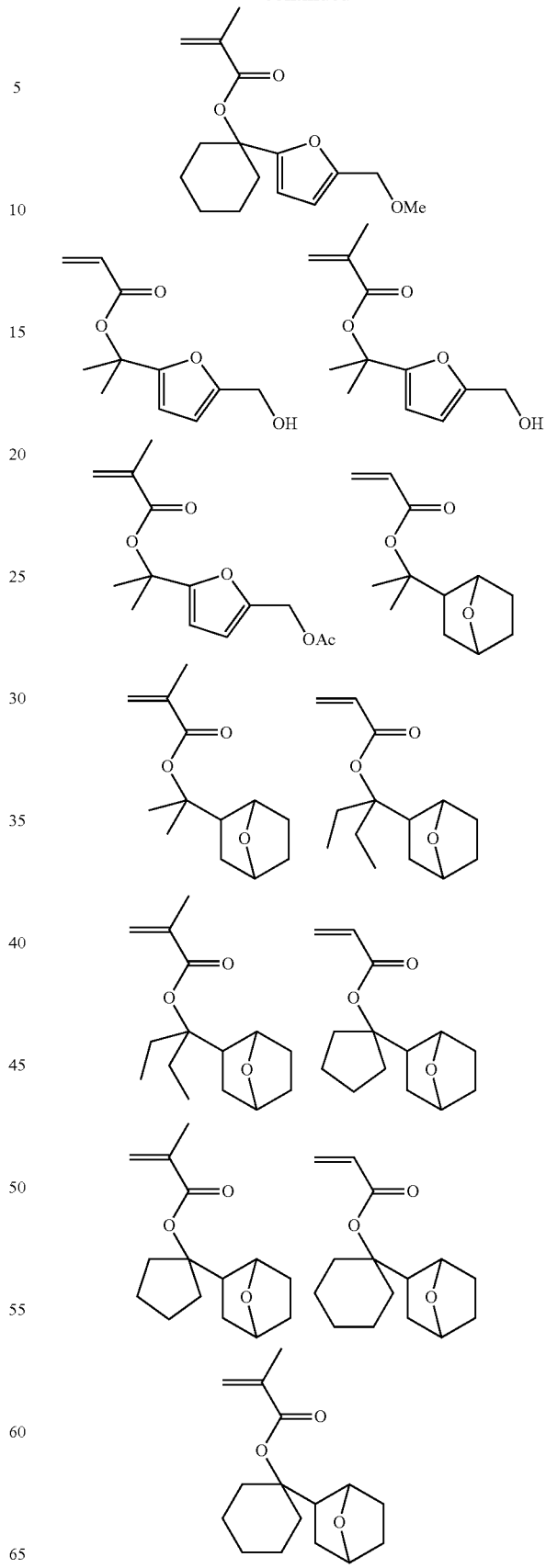

Of the acid labile groups of tertiary alkyl form having formula (AL-12), those acid labile groups having a branched alkyl directly attached to the ring offer high solubility in organic solvents. Suitable acid labile groups are exemplified below, but not limited thereto.
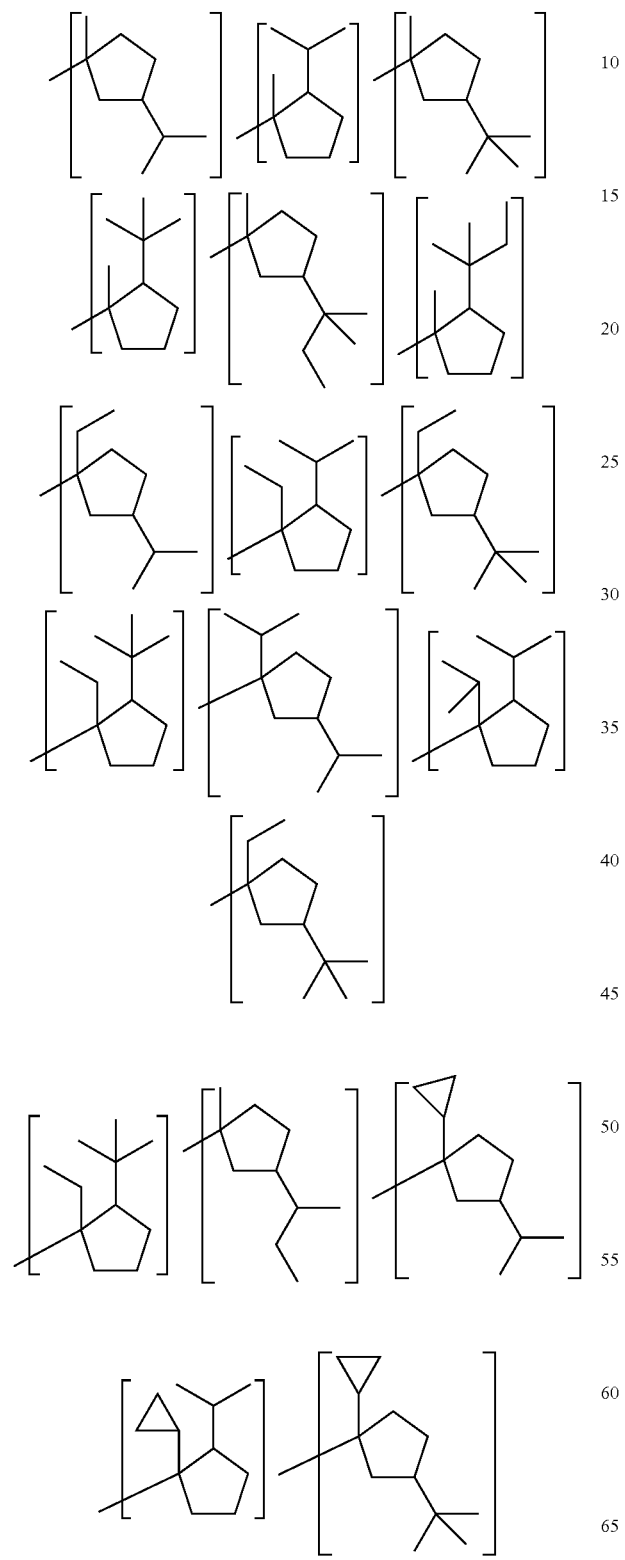
-continued
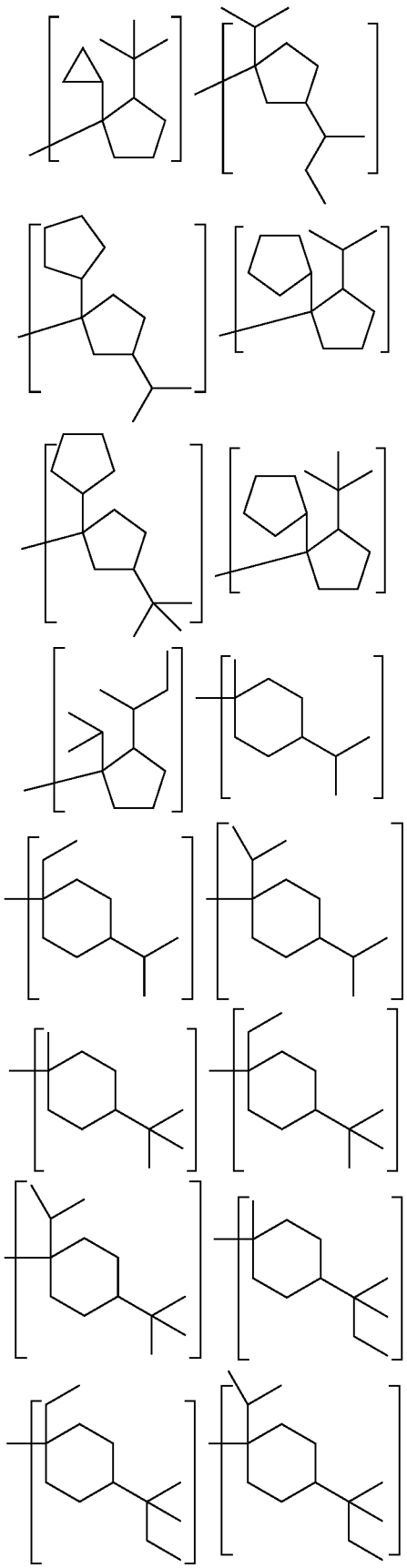

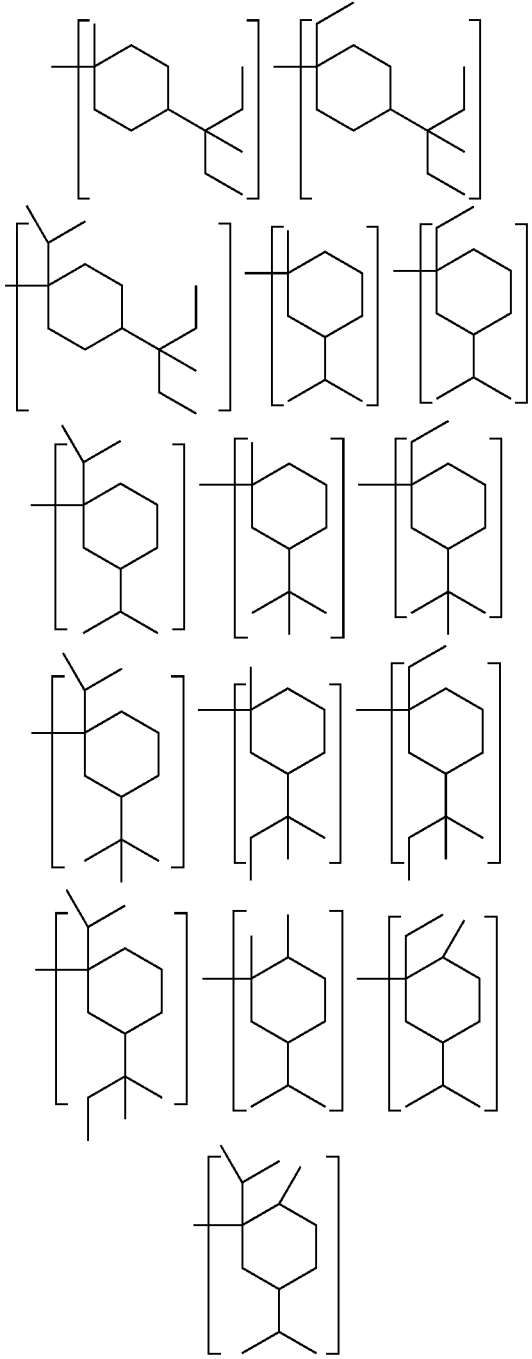

Examples of the monomer corresponding to recurring unit (c) are shown below, but not limited thereto.

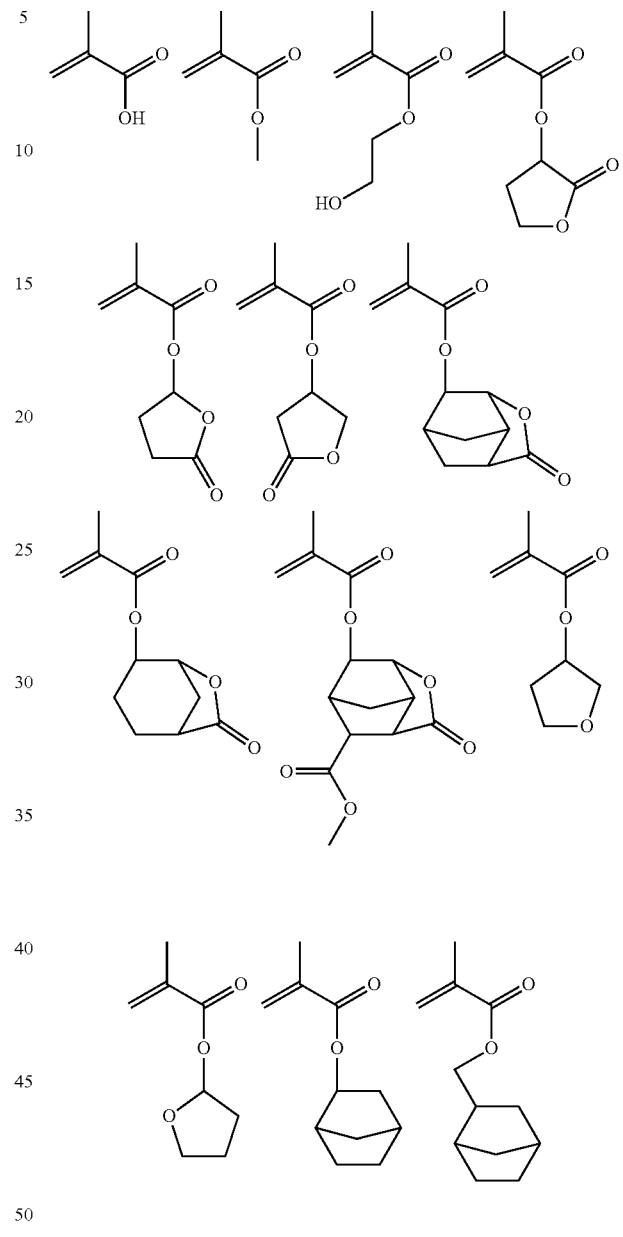

Of the foregoing acid labile groups, Ra in formula (1) is preferably selected from t-butoxycarbonyl, t-pentyloxycarbonyl, methylcyclopentyloxycarbonyl, methylcyclohexyloxycarbonyl, ethylcyclopentyloxycarbonyl, ethylcyclohexyloxycarbonyl, methoxymethyl, and ethoxymethyl. Inter alia, t-butoxycarbonyl and t-pentyloxycarbonyl are preferred.

While the preferred polymer comprises recurring units (a1, a2, a3) and recurring units (b1) and/or (b2), it may have further copolymerized therein recurring units (c) derived from monomers having an adhesive group such as hydroxy, lactone ring, ether, ester, amide, carbonyl, sulfonic acid ester, sulfone, carboxyl, acid anhydride, or cyano group.

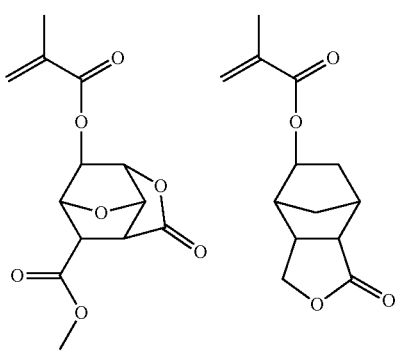

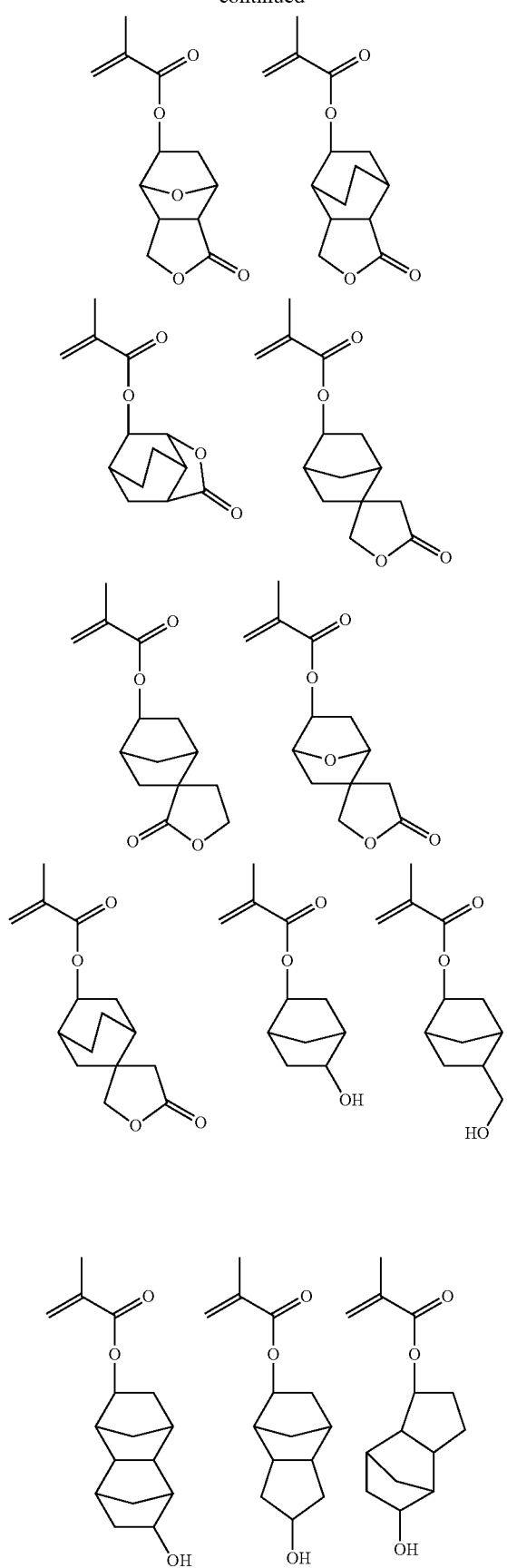
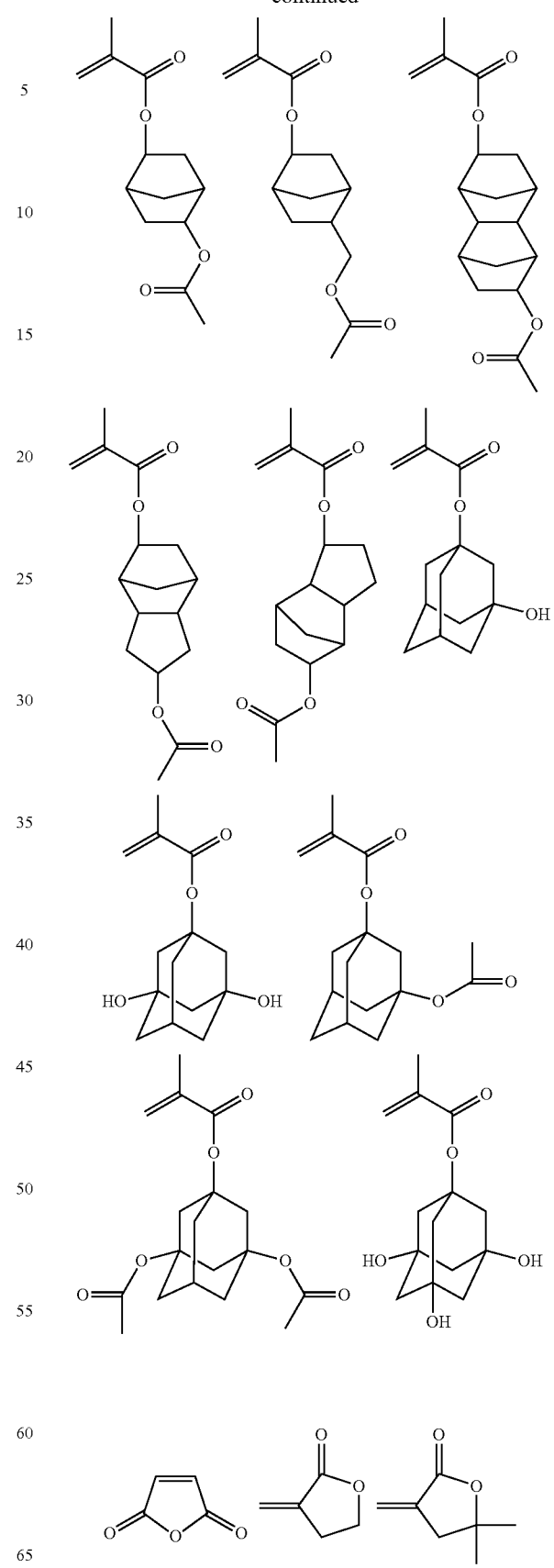

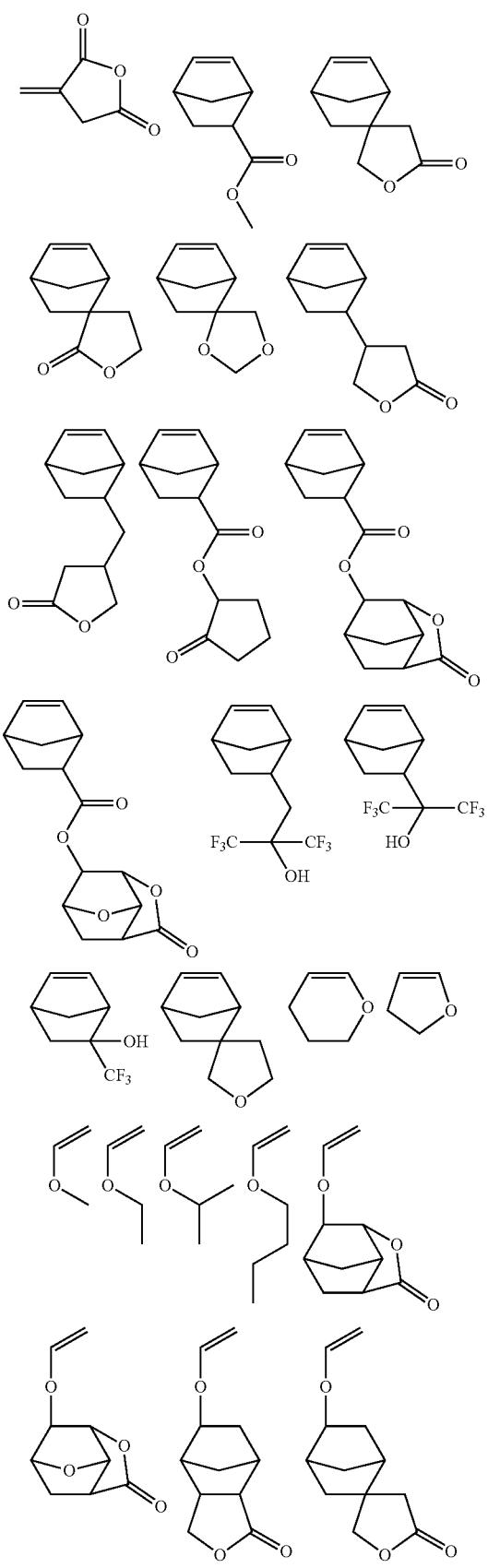
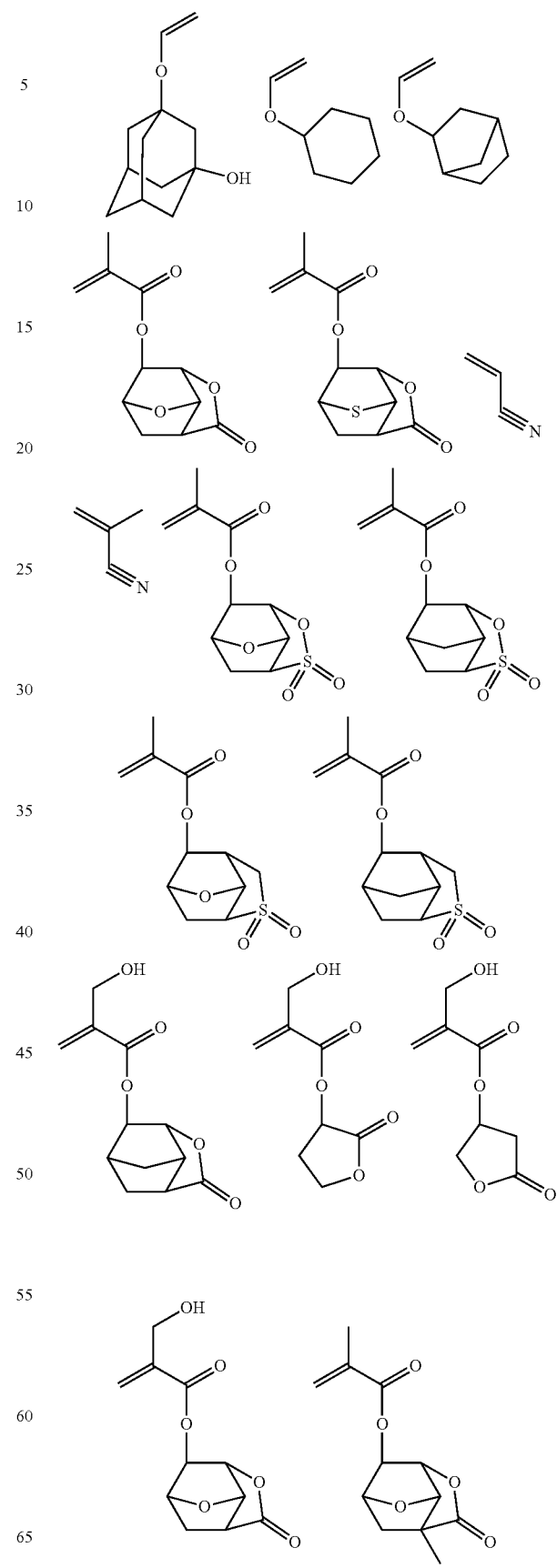

121
-continued
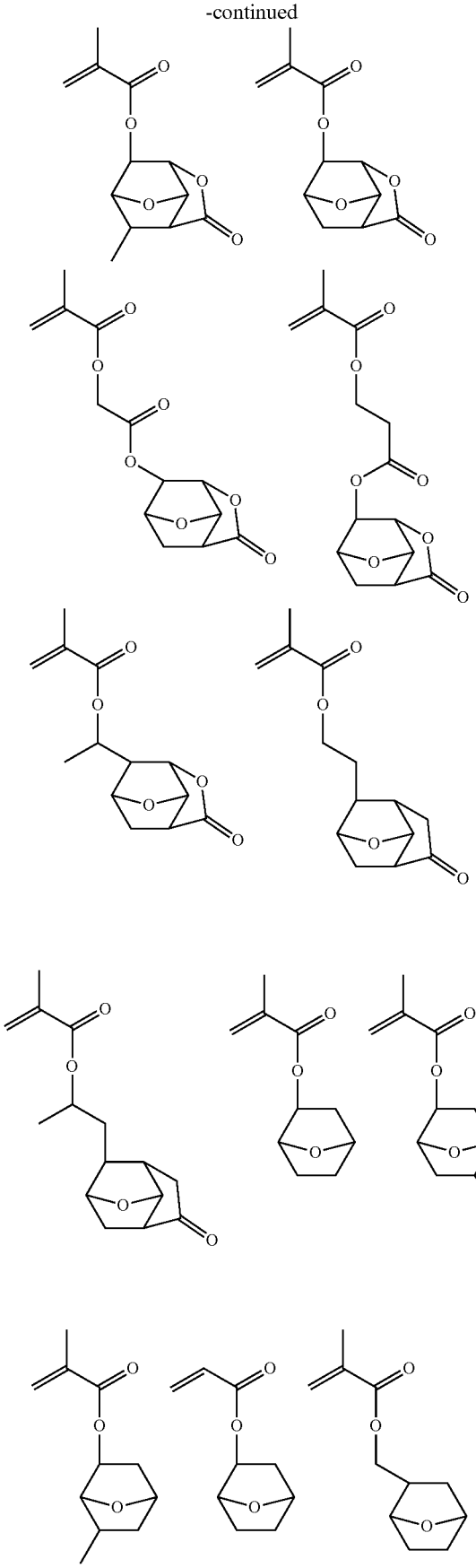
122
-continued
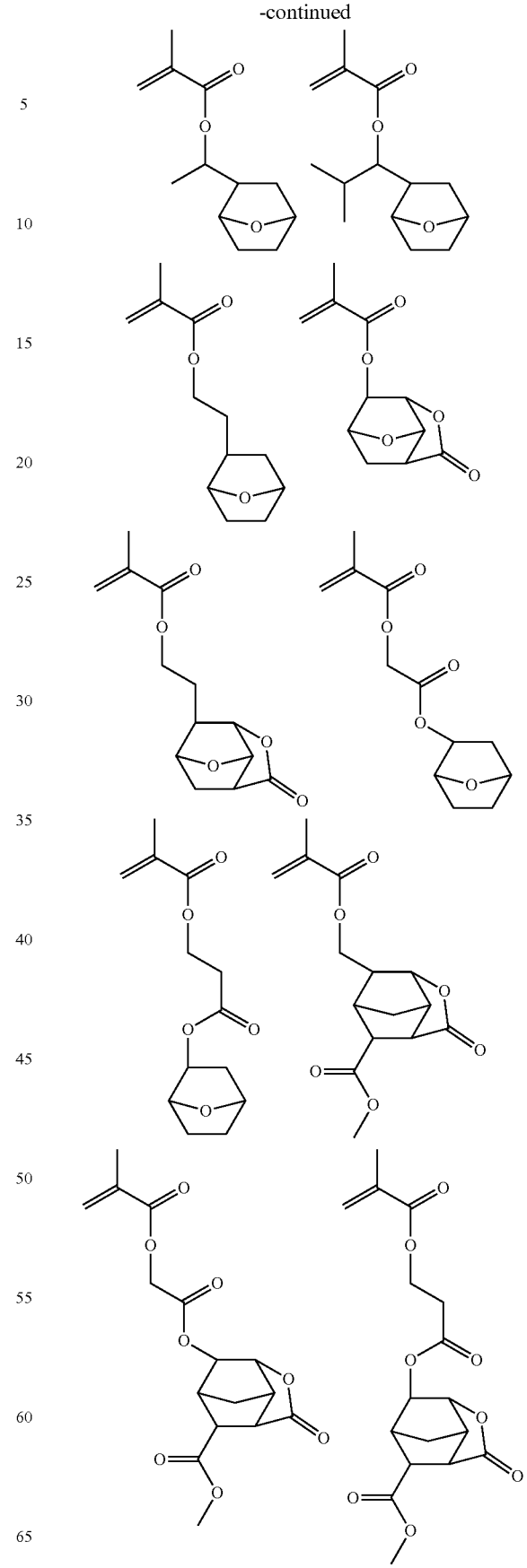

123
-continued
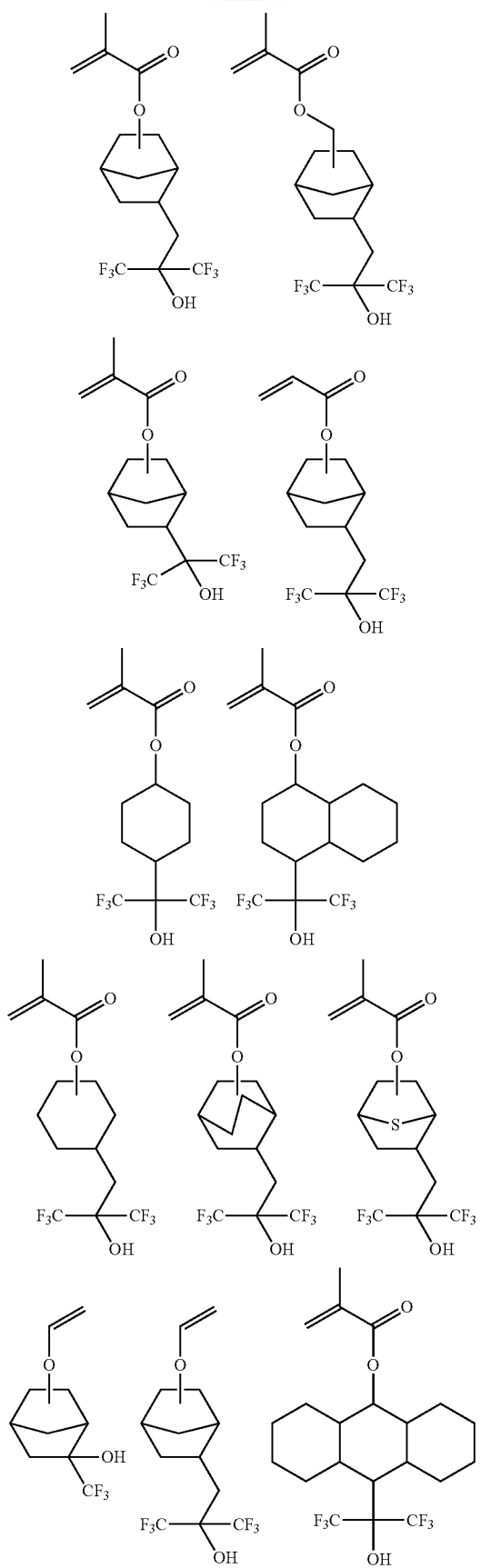
124
-continued
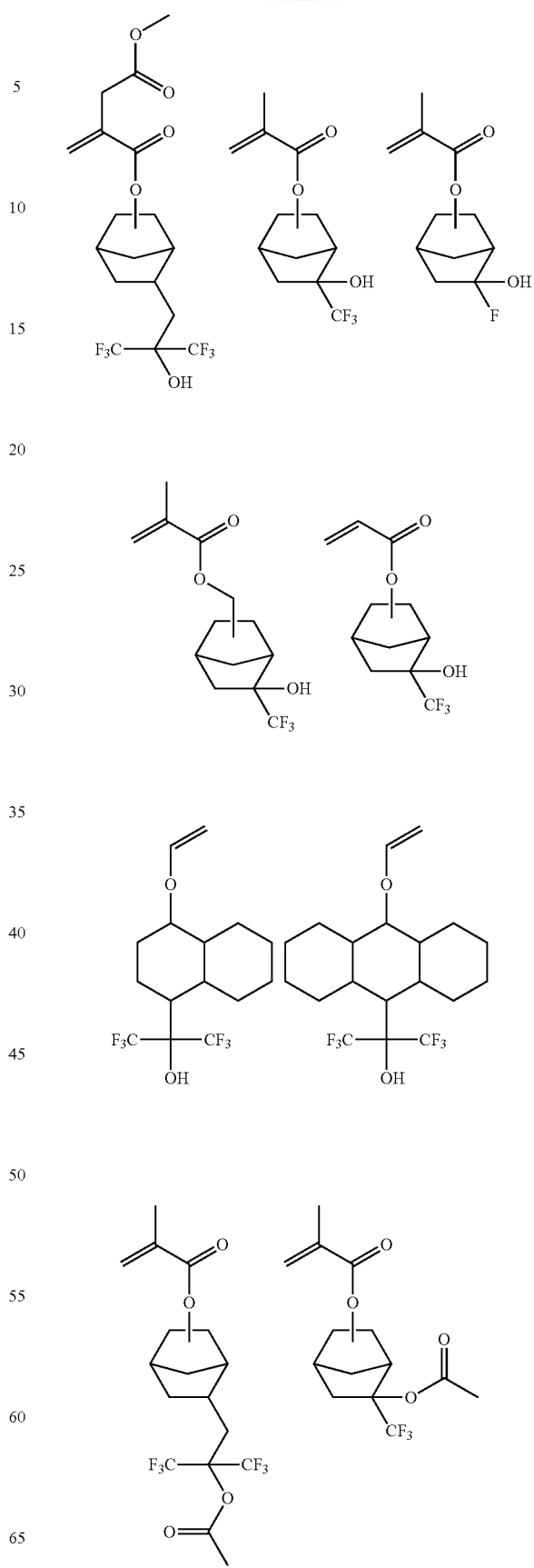

125
-continued
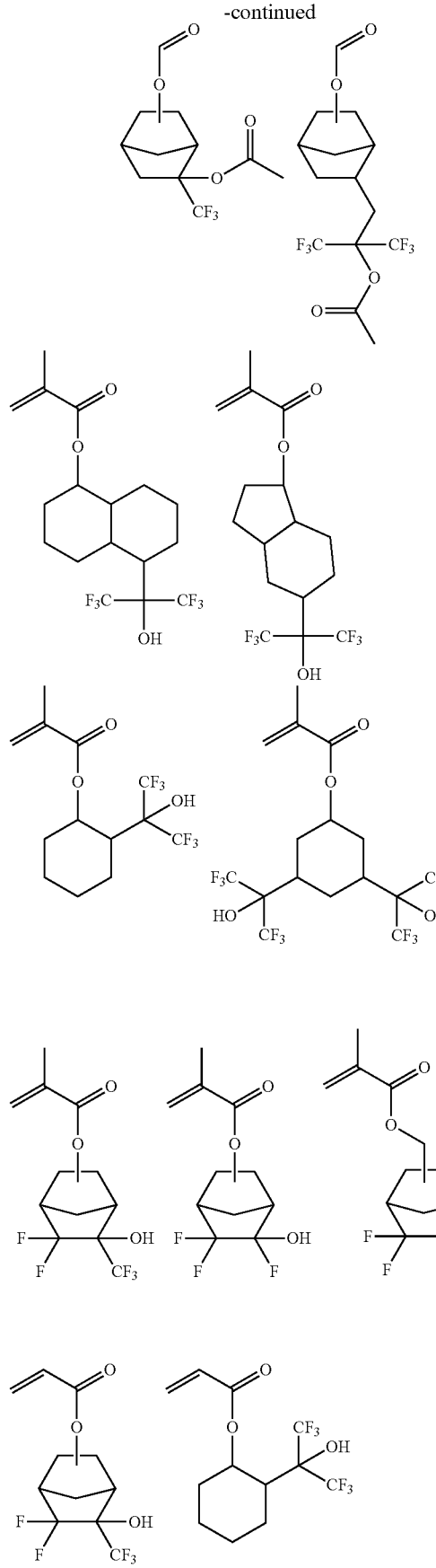
126
-continued
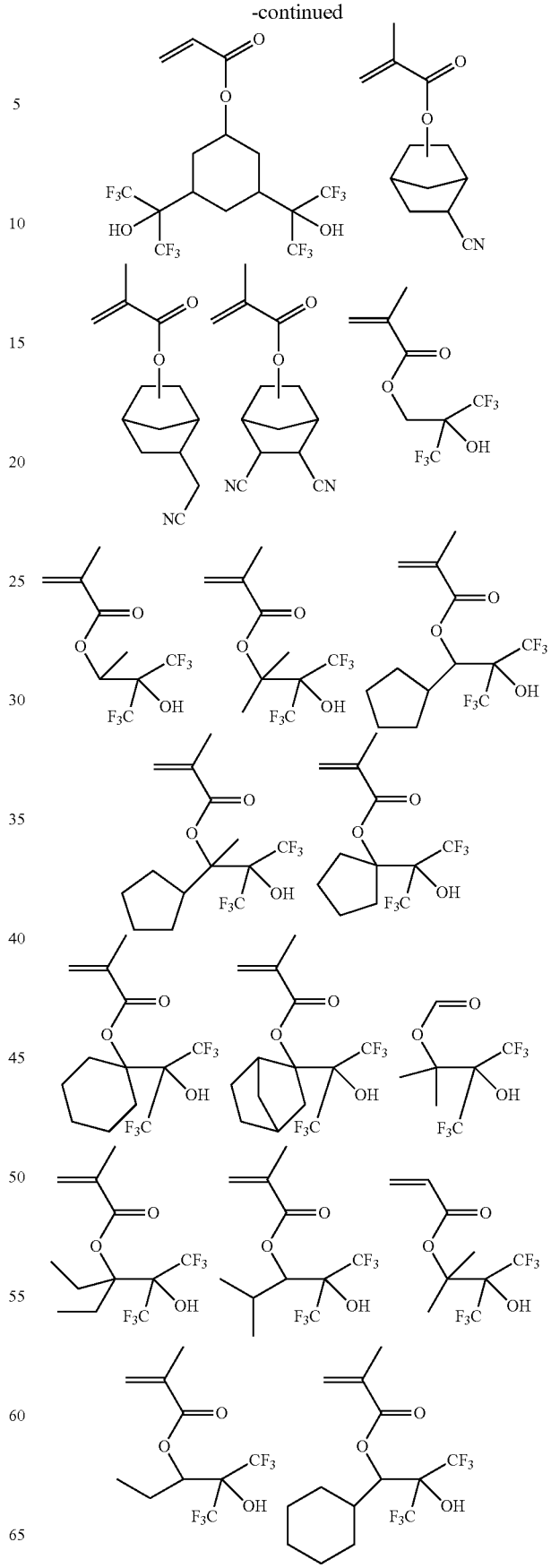

-continued
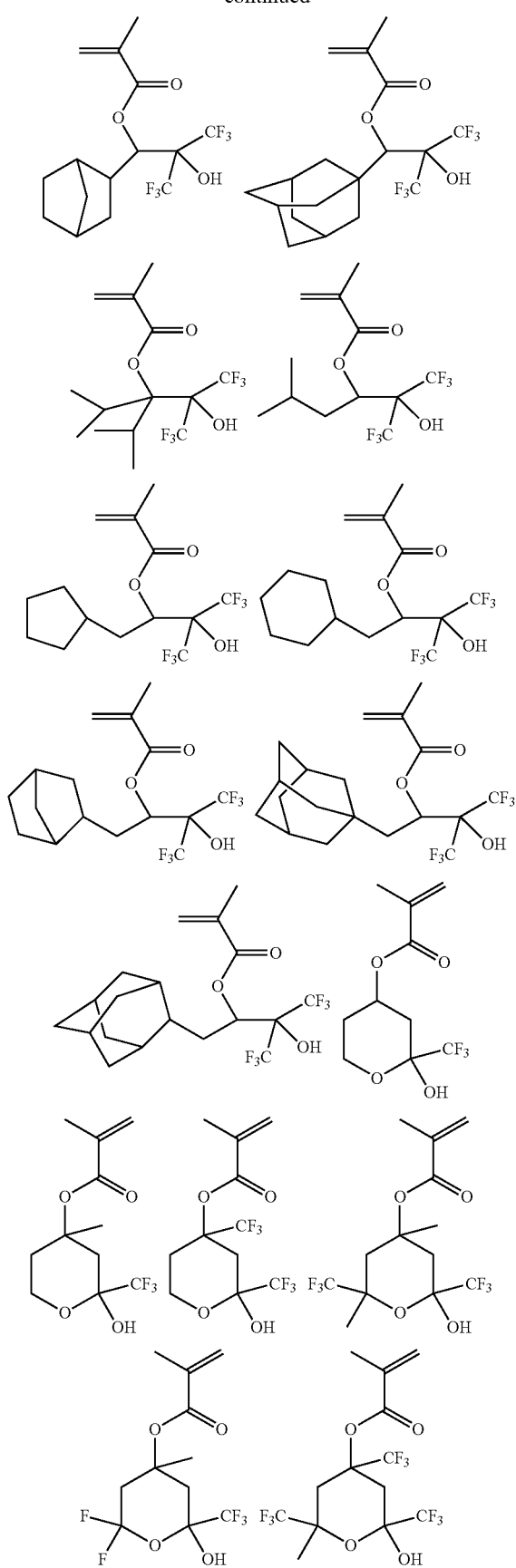
-continued
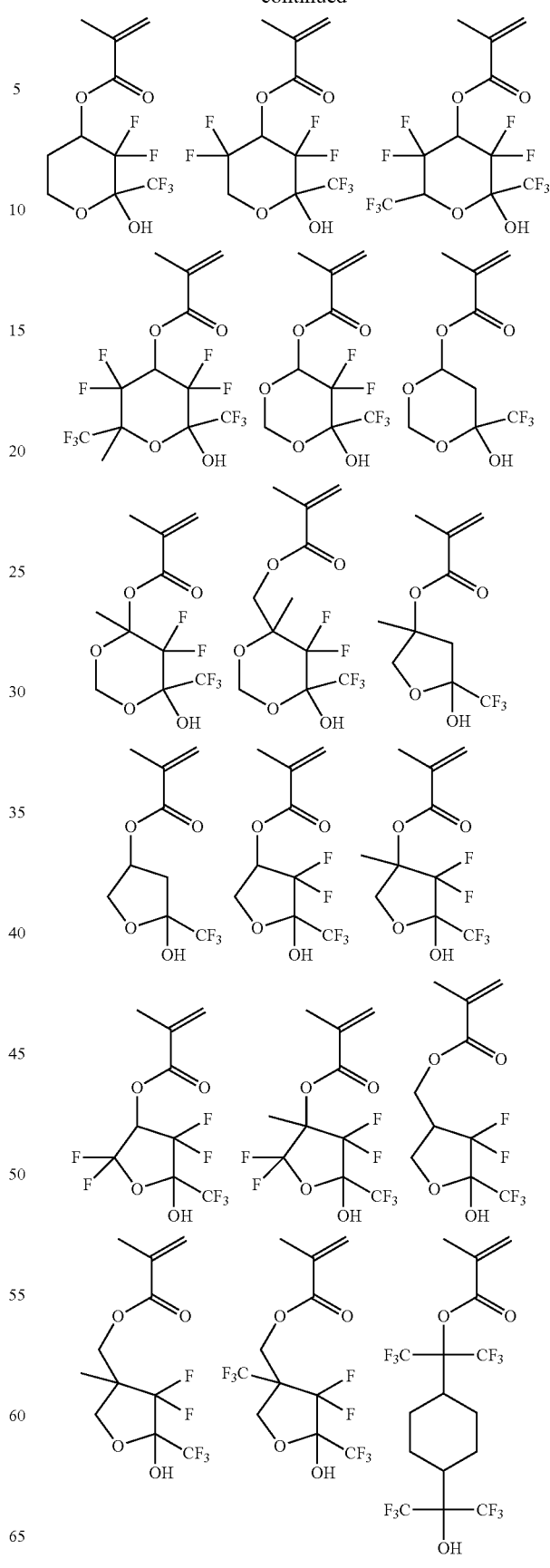

-continued
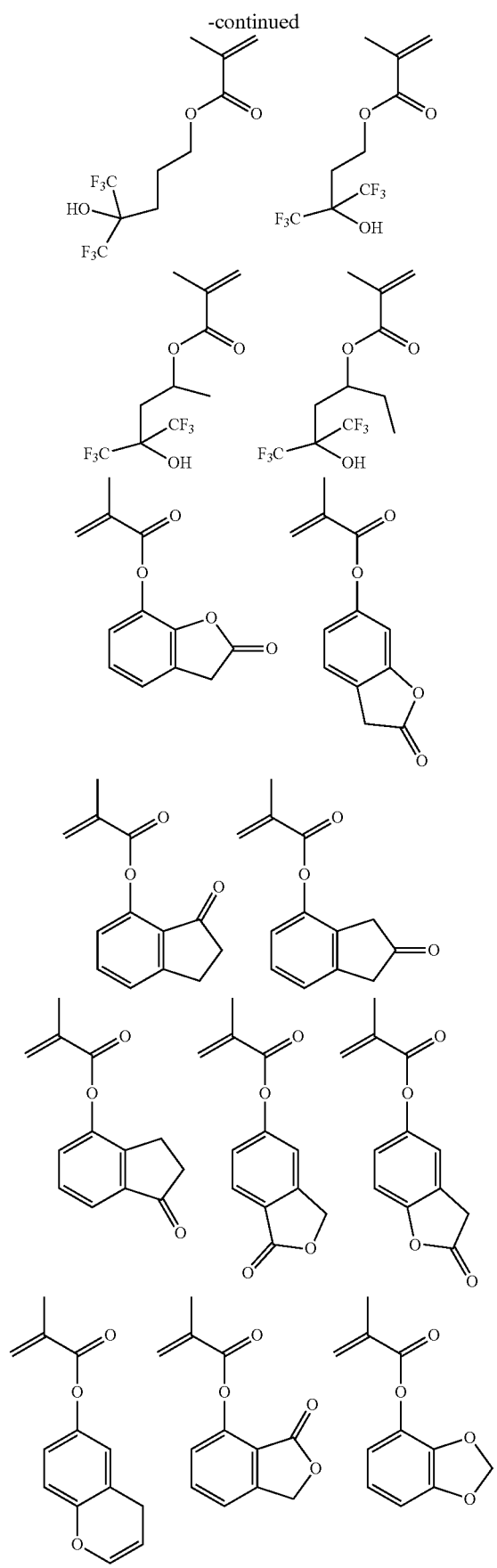
-continued
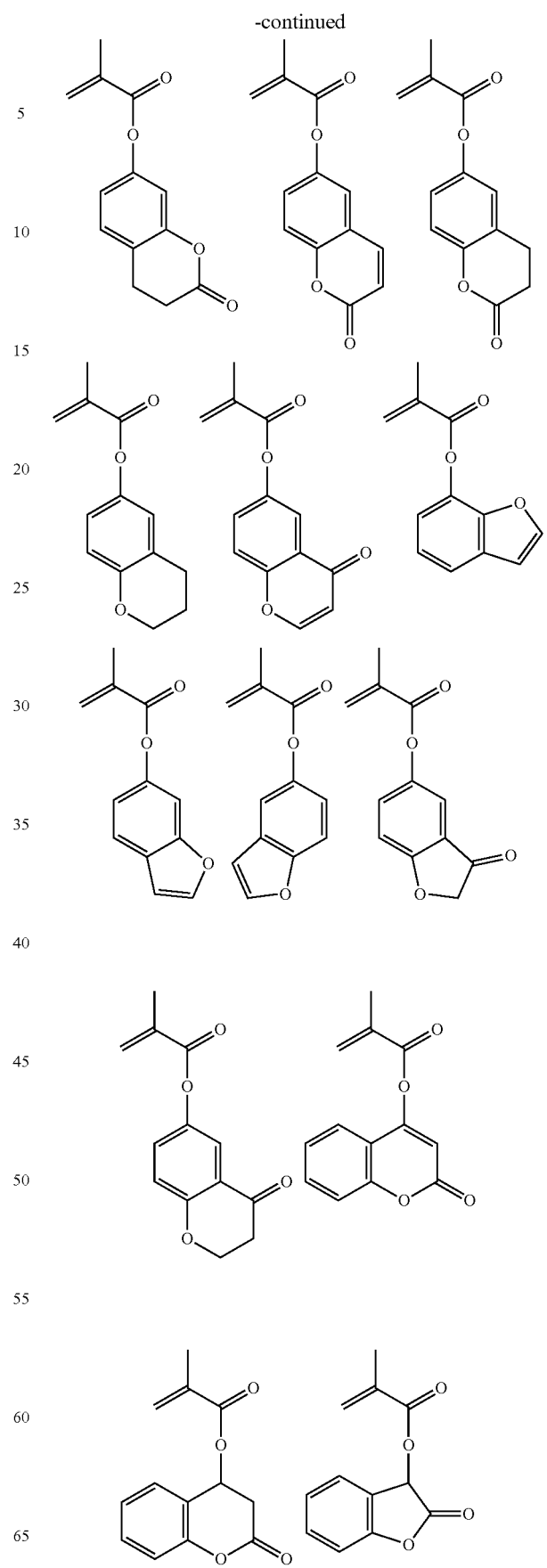

131
-continued
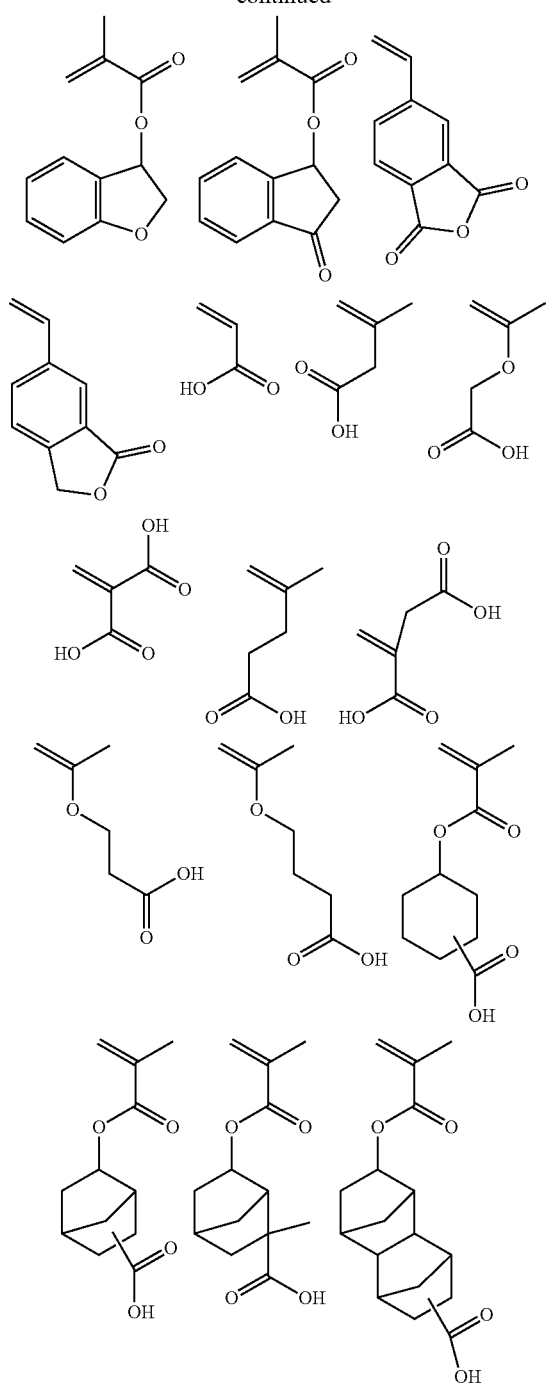
132
-continued
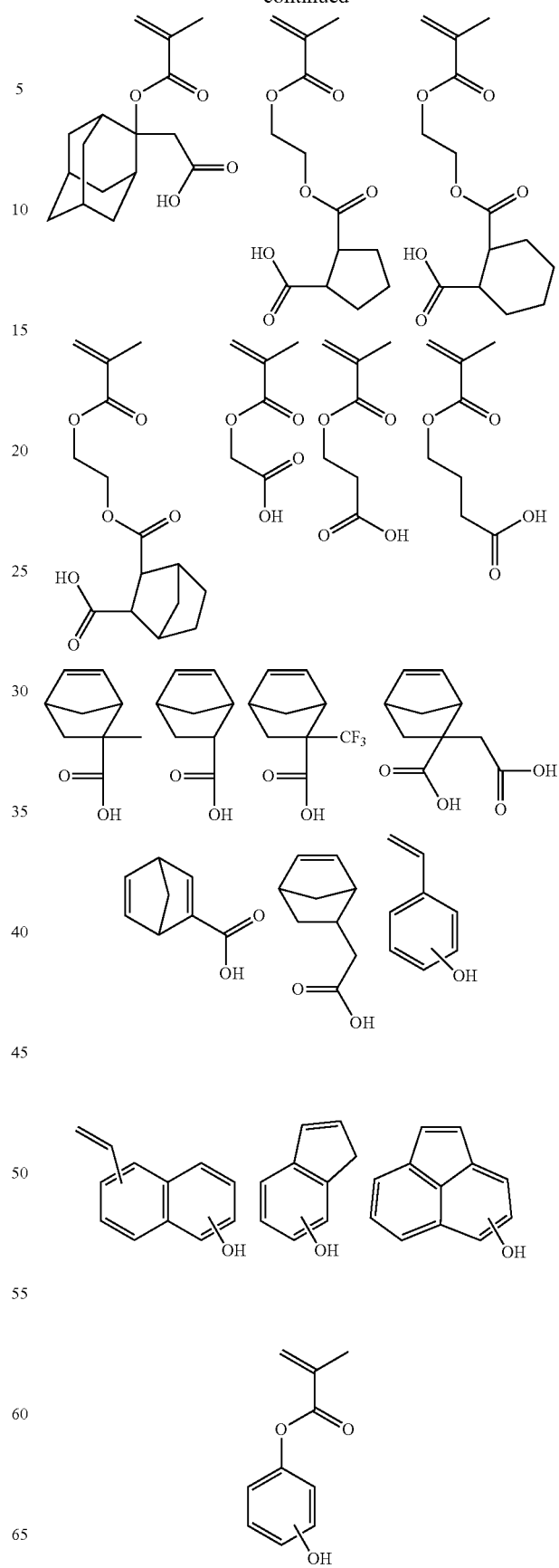

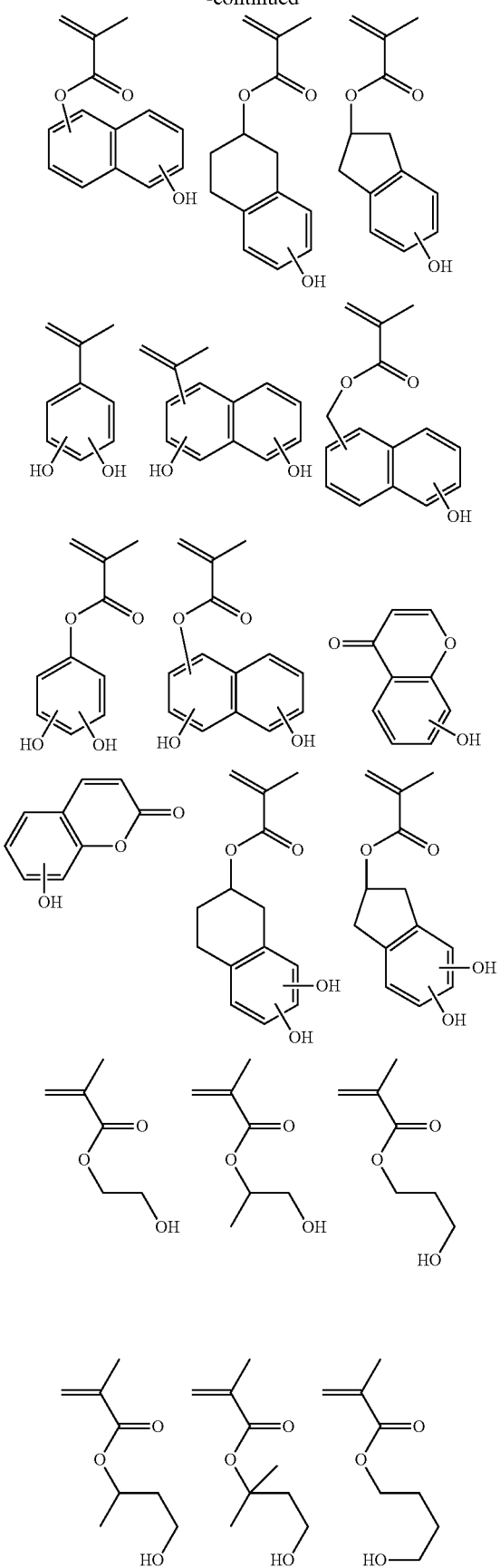
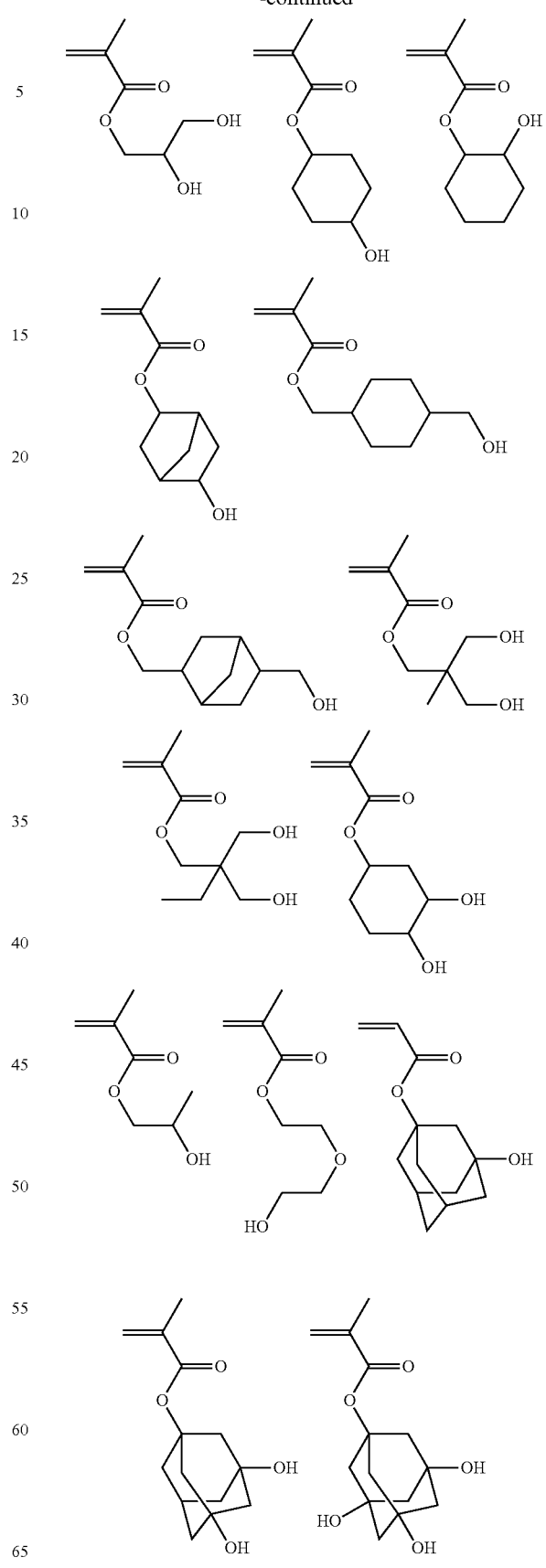

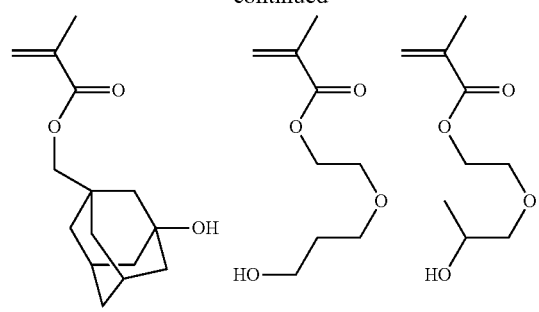
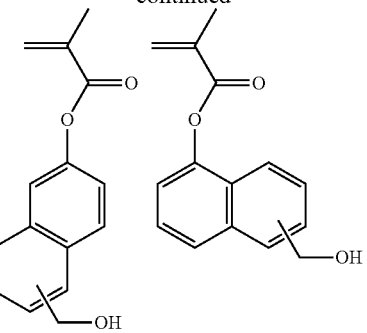
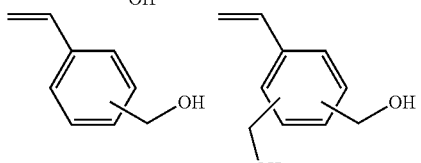
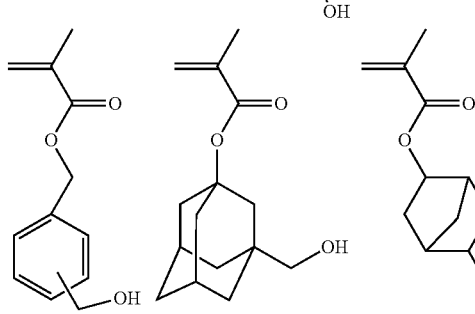
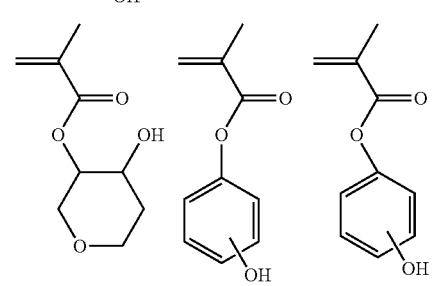
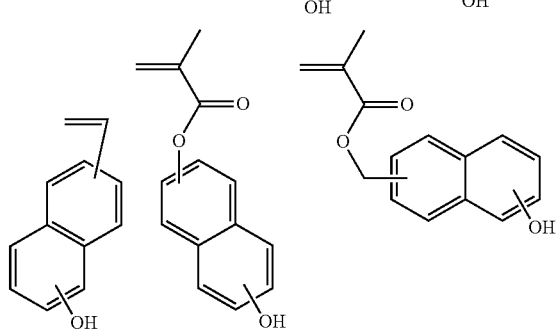
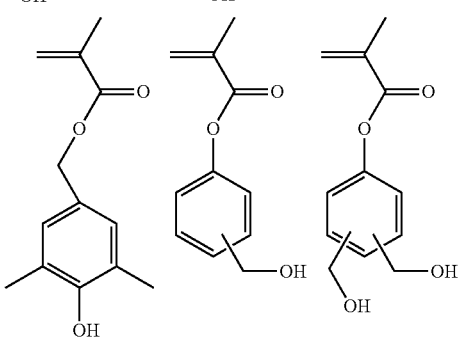

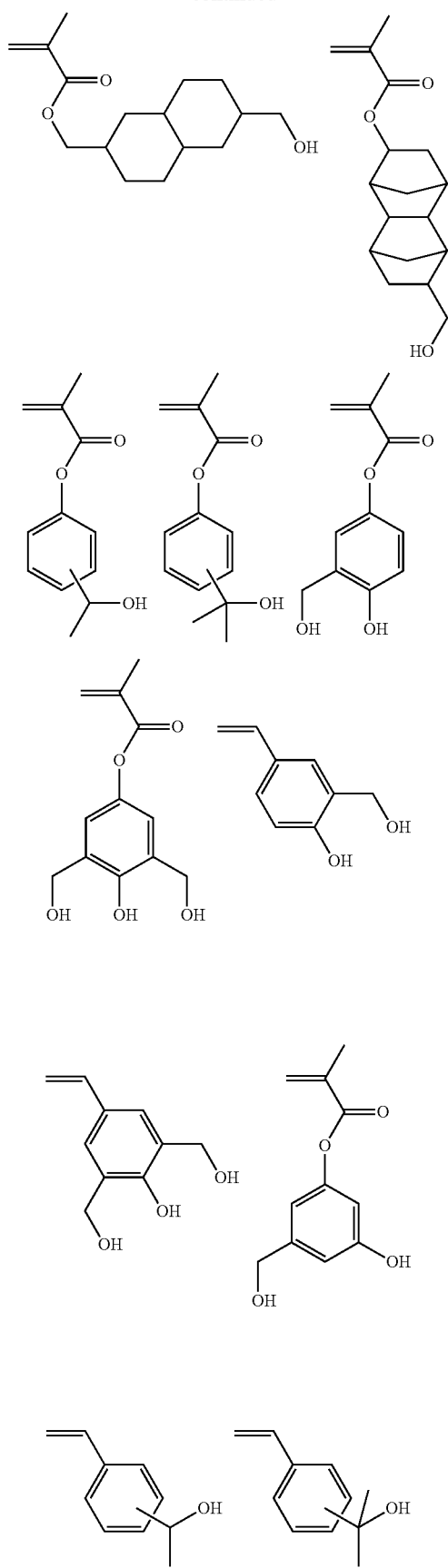
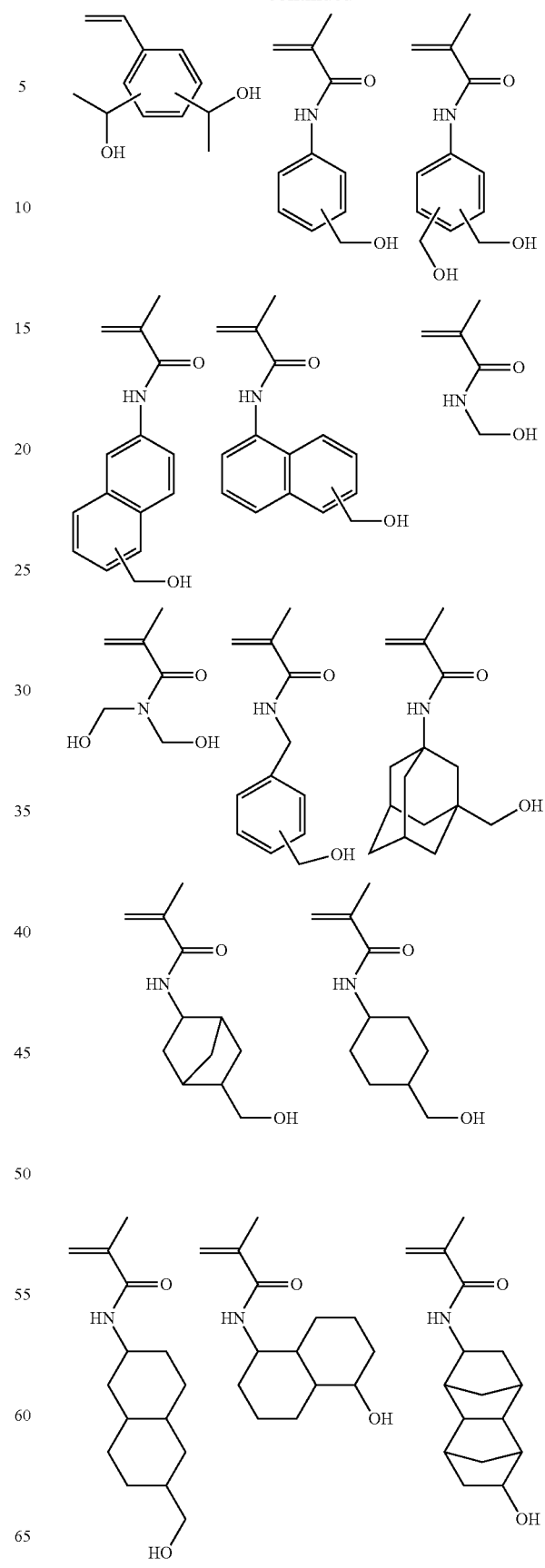

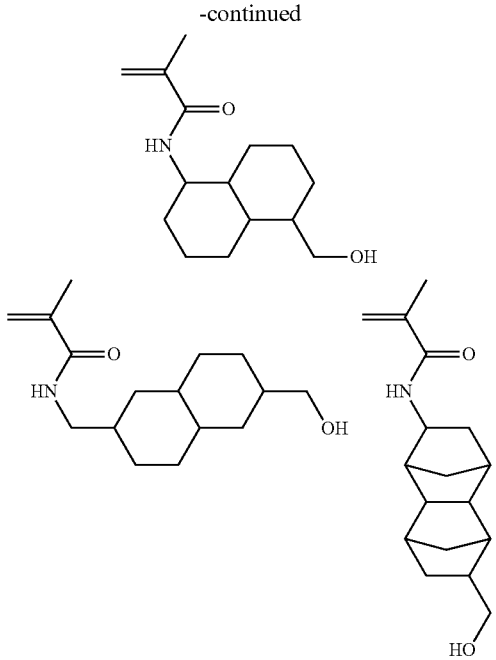

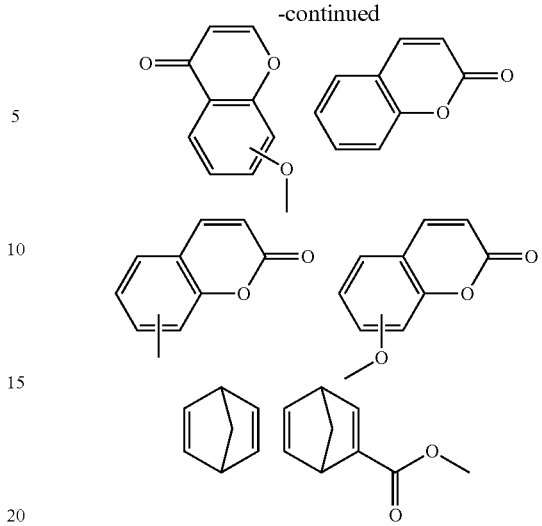

In the case of a monomer having a hydroxyl group, the hydroxyl group may be replaced by an acetal group susceptible to deprotection with acid, typically ethoxyethoxy, prior to polymerization, and the polymerization be followed by deprotection with weak acid and water. Alternatively, the hydroxyl group may be replaced by an acetyl, formyl, pivaloyl or similar group prior to polymerization, and the polymerization be followed by alkaline hydrolysis.

In another preferred embodiment, the polymer may have further copolymerized therein recurring units (d) selected from units derived from indene, benzofuran, benzothiophene, acenaphthylene, chromone, coumarin, norbornadiene, and derivatives thereof. Suitable monomers are exemplified below, but not limited thereto.

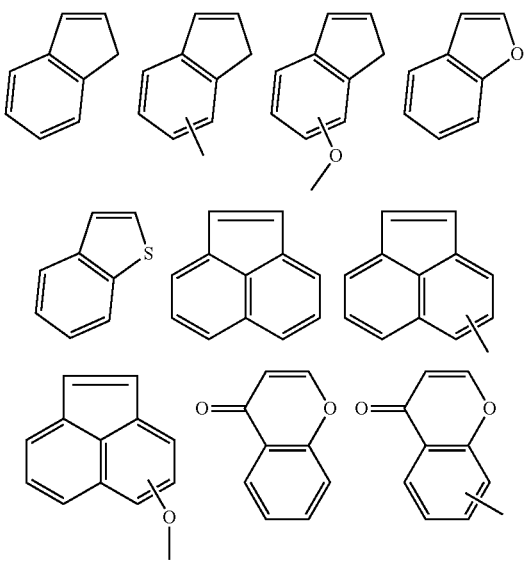

Besides the recurring units described above, further recurring units (e) can be incorporated in the polymer, examples of which include units derived from styrene, vinylnaphthalene, vinylanthracene, vinylpyrene, methyleneindane, vinylpyridine, and vinylcarbazole.

The polymer may be synthesized, for example, by dissolving one or more monomers selected from the monomers corresponding to the recurring units (a1), (a2), (a3), (b1), (b2), (c), (d), and (e) and a compound having formula (A) or (B) in an organic solvent, adding a radical polymerization initiator thereto, and effecting heat polymerization.

The compound having formula (A) or (B) is preferably added in an amount of 0.00001 to 10 moles, more preferably 0.0001 to 1 mole per mole of the total of the monomers corresponding to the recurring units (a1), (a2), (a3), (b1), (b2), (c), (d), and (e).

As the radical polymerization initiator, commercially available reagents may be used. The preferred radical polymerization initiators are azo and peroxide initiators. The initiators may be used alone or in admixture. The amount of the initiator used may be selected in accordance with the desired molecular weight, monomers, and synthesis conditions such as polymerization temperature and polymerization mode.

Of the polymerization initiators, suitable azo initiators include 2,2'-azobisisobutyronitrile (AIBN), 2,2'-azobis(2,4-dimethylvaleronitrile), dimethyl 2,2'-azobis(2-methylpropionate), 2,2'-azobis(4-methoxy-2,4-dimethylvaleronitrile), 2,2'-azobis(cyclohexane-1-carbonitrile), and 4,4'-azobis(4-cyanovaleric acid); and suitable peroxide initiators include benzoyl peroxide, decanoyl peroxide, lauroyl peroxide, succinic acid peroxide, t-butyl peroxy-2-ethylhexanoate, t-butyl peroxypivalate, and 1,1,3,3-tetramethylbutyl peroxy-2-ethylhexanoate.

A chain transfer agent may be used in the polymerization reaction. As the chain transfer agent, thiol compounds are preferred, including well-known primary, secondary and tertiary thiol compounds. The chain transfer agent may be used alone or in admixture. The amount of the chain transfer agent used may be selected in accordance with the desired molecular weight, monomers, and synthesis conditions such as polymerization temperature and polymerization mode. Exemplary chain transfer agents include 1-octanethiol, 2-mercaptoethanol, thiolactic acid, thioglycolic acid, mercaptopropionic acid, cyclohexyl mercaptan, t-dodecyl mercaptan, 1,4-butanedithiol, 1,8-octanedithiol, butanediol bis(thioglycolate), hexanediol bis(thioglycolate), 1,3,5-benzenetrithiol, trimethylolpropane tris(thioglycolate), and pentaerythrythol tetrakis(thioglycolate). These agents are commercially available.

Examples of the organic solvent which can be used for polymerization include toluene, benzene, tetrahydrofuran (THF), diethyl ether, dioxane, cyclohexane, cyclopentane, methyl ethyl ketone, and γ-butyrolactone.

Preferably the polymerization reaction is carried out at a temperature of 50 to 80° C. for 2 to 100 hours, more preferably 5 to 20 hours.

When hydroxystyrene or hydroxyvinylnaphthalene is copolymerized, an alternative method is possible. Specifically, acetoxystyrene or acetoxyvinylnaphthalene is used instead of hydroxystyrene or hydroxyvinylnaphthalene, and after polymerization, the acetoxy group is deprotected by alkaline hydrolysis, for thereby converting the polymer product to polyhydroxystyrene or hydroxypolyvinylnaphthalene. For alkaline hydrolysis, a base such as aqueous ammonia or triethylamine may be used. Preferably the reaction temperature is −20° C. to 100° C., more preferably 0° C. to 60° C., and the reaction time is 0.2 to 100 hours, more preferably 0.5 to 20 hours.

While the polymer comprises recurring units (a1), (a2), (a3), (b1), (b2), (c), (d) and (e) as mentioned above, preferably a proportion of these units is: 0≤a1≤0.8, 0≤a2≤0.8, 0≤a3≤0.8, 0<a1+a2+a3≤0.8, 0≤b1<1.0, 0≤b2<1.0, 0.1≤b1+b2<1.0, 0≤c≤0.9, 0≤d≤0.5, and 0≤e≤0.5;
more preferably 0≤a1≤0.7, 0≤a2≤0.7, 0≤a3≤0.7, 0.01≤a1+a2+a3≤0.7, 0≤b1≤0.8, 0≤b2≤0.8, 0.15≤b1+b2≤0.8, 0.1≤c≤0.8, 0≤d≤0.4, and 0≤e≤0.4; and preferably a1+a2+a3+b1+b2+c+d+e=1.

The polymer should preferably have a weight average molecular weight (Mw) in the range of 1,000 to 500,000, and more preferably 2,000 to 30,000, as measured by GPC versus polystyrene standards using dimethylformamide (DMF) as a solvent. With too low a Mw, the resist composition may become less heat resistant. A polymer with too high a Mw may lose alkaline solubility and give rise to a footing phenomenon after pattern formation.

After the completion of polymerization, a poor solvent in which the polymer is not soluble is added to the polymerization solution causing the polymer to crystallize. Examples of the crystallizing solvent include aliphatic hydrocarbons, alicyclic hydrocarbons, aromatic hydrocarbons, ethers, alcohols, water, and mixtures thereof. Suitable aliphatic hydrocarbons include pentane, hexane, heptane and octane; suitable alicyclic hydrocarbons include cyclohexane and methylcyclohexane; suitable aromatic hydrocarbons include benzene, toluene, and xylene; suitable ethers include diethyl ether, diisopropyl ether, and dimethoxyethane; suitable alcohols include methanol, ethanol, isopropyl alcohol, and butanol. It is the polymer that crystallizes whereas the residual monomers remain dissolved in the polymerization solution. That is, the residual monomers are removed. The solution in which the polymer has crystallized is passed through a filter, after which the polymer is collected in powder form, washed several times with the crystallizing solvent, and dried, obtaining polymer powder. The non-polymerizable compound can be removed by crystallization from the polymer. The procedure is preferably performed until this point of time under illumination conditions where a light fraction of wavelength up to 400 nm is cut off.

This is followed by a dissolving step. After the polymer resulting from polymerization is subjected to precipitation/purification and optionally to drying treatment, it is dissolved in an organic solvent to form a polymer solution. The polymer solution is concentrated, while the low-boiling solvent (i.e., precipitation/purification solvent), if any, may be distilled off at the same time, whereby the solution of the polymer in the organic solvent is adjusted to the desired concentration, typically 5 to 40% by weight. The resulting solution is ready for use as a resist film-forming polymer solution. The organic solvent used for dissolution is not particularly limited as long as the polymer is soluble therein. Glycol, ketone and ester solvents are included. Suitable glycol solvents include propylene glycol monomethyl ether and propylene glycol monomethyl ether acetate (PGMEA). Suitable ketone solvents include acetone, methyl ethyl ketone, methyl isobutyl ketone, cyclopentanone, and cyclohexanone. Suitable ester solvents include ethyl acetate, isopropyl acetate, butyl acetate, and ethyl lactate. The organic solvents may be used alone or in admixture.

Resist Composition

The polymer obtained by the inventive method may be used as a polymer, especially base polymer in semiconductor lithography resist compositions and mask pattern-forming resist compositions. In addition to the polymer, the resist composition may contain an organic solvent, basic compound, dissolution regulator, surfactant, acetylene alcohol, and other additives.

Examples of the organic solvent used herein are described in JP-A 2008-111103, paragraphs [0144] to [0145](U.S. Pat. No. 7,537,880). Exemplary solvents include ketones such as cyclohexanone and methyl-2-n-pentyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone, which may be used alone or in admixture.

Exemplary basic compounds include primary, secondary and tertiary amine compounds, specifically amine compounds having a hydroxyl, ether, ester, lactone ring, cyano or sulfonic acid ester group, as described in JP-A 2008-111103, paragraphs [0146] to [0164]. Exemplary surfactants are described in JP-A 2008-111103, paragraphs [0165] to [0166]. Exemplary dissolution regulators are described in JP-A 2008-122932 (US 2008090172), paragraphs [0155] to [0178], and exemplary acetylene alcohols in paragraphs [0179] to [0182]. Also useful are quenchers of polymer type as described in JP-A 2008-239918. The polymeric quencher segregates at the resist surface after coating and thus enhances the rectangularity of resist pattern. When a protective film is applied in the immersion lithography, the polymeric quencher is also effective for preventing a film thickness loss of resist pattern or rounding of pattern top.

A resist composition comprising the inventive polymer may be used to form a pattern via exposure and development without a need for an acid generator which is otherwise added thereto. However, an acid generator of blend type may be added to the composition if desired. In this case, the acid generator of blend type is preferably added in an amount of 0.01 to 100 parts, more preferably 0.1 to 80 parts by weight per 100 parts by weight of the base polymer. An appropriate amount of the organic solvent used is 50 to 10,000 parts, especially 100 to 5,000 parts. The dissolution regulator may be blended in an amount of 0 to 50 parts, preferably 0 to 40 parts, the basic compound in an amount of 0 to 100 parts, preferably 0.001 to 50 parts, and the surfactant in an amount of 0 to 10 parts, preferably 0.0001 to 5 parts. All amounts are expressed in parts by weight relative to 100 parts by weight of the base polymer.

Process

The resist composition comprising the inventive polymer, typically chemically amplified positive or negative resist composition comprising the inventive polymer, optionally a basic compound and an acid generator, in an organic solvent is used in the fabrication of various integrated circuits. Pattern formation using the resist composition may be performed by well-known lithography processes. The process generally involves coating, prebaking, exposure, and development. If necessary, any additional steps may be added.

The resist composition is first applied onto a substrate on which an integrated circuit is to be formed (e.g., Si, $SiO_2$, SiN, SiON, TiN, WSi, BPSG, SOG, or organic antireflective coating) or a substrate on which a mask circuit is to be formed (e.g., Cr, CrO, CrON, MoSi, or $SiO_2$) by a suitable coating technique such as spin coating, roll coating, flow coating, dipping, spraying or doctor coating. The coating is prebaked on a hot plate preferably at a temperature of 60 to 150° C. for 10 seconds to 30 minutes, more preferably at 80 to 120° C. for 30 seconds to 20 minutes. The resulting resist film is generally 0.1 to 2.0 m thick.

The resist film is then exposed to a desired pattern of high-energy radiation such as UV, deep-UV, EB, EUV, soft x-ray, x-ray, excimer laser light, γ-ray, or synchrotron radiation, directly or through a mask. The exposure dose is preferably about 1 to 200 $mJ/cm^2$, more preferably about 10 to 100 $mJ/cm^2$, or about 0.1 to 100 $\mu C/cm^2$, more preferably about 0.5 to 50 $\mu C/cm^2$. The resist film is further baked (PEB) on a hot plate preferably at 60 to 150° C. for 10 seconds to 30 minutes, more preferably at 80 to 120° C. for 30 seconds to 20 minutes.

Thereafter the resist film is developed in an alkaline developer for 3 seconds to 3 minutes, preferably 5 seconds to 2 minutes by conventional techniques such as dip, puddle and spray techniques. A typical developer is a 0.1 to 10 wt %, preferably 2 to 10 wt %, more preferably 2 to 8 wt % aqueous solution of tetramethylammonium hydroxide (TMAH), tetraethylammonium hydroxide (TEAH), tetrapropylamonium hydroxide (TPAH), or tetrabutylammonium hydroxide (TBAH). The resist film in the exposed area is dissolved in the developer whereas the resist film in the unexposed area is not dissolved. In this way, the desired positive pattern is formed on the substrate. Inversely in the case of negative resist, the exposed area of resist film is insolubilized and the unexposed area is dissolved in the developer. It is appreciated that the resist composition of the invention is best suited for micro-patterning using such high-energy radiation as KrF and ArF excimer laser, EB, EUV, soft x-ray, x-ray, γ-ray and synchrotron radiation.

Although TMAH aqueous solution is generally used as the developer, TEAH, TPAH and TBAH having a longer alkyl chain are effective in inhibiting the resist film from being swollen during development and thus preventing pattern collapse. JP 3429592 describes an example using an aqueous TBAH solution for the development of a polymer comprising recurring units having an alicyclic structure such as adamantane methacrylate and recurring units having an acid labile group such as tert-butyl methacrylate, the polymer being water repellent due to the absence of hydrophilic groups.

The TMAH developer is most often used as 2.38 wt % aqueous solution, which corresponds to 0.26N. The TEAH, TPAH, and TBAH aqueous solutions should preferably have an equivalent normality. The concentration of TEAH, TPAH, and TBAH that corresponds to 0.26N is 3.84 wt %, 5.31 wt %, and 6.78 wt %, respectively.

When a pattern with a line size of 32 nm or less is resolved by the EB and EUV lithography, there arises a phenomenon that lines become wavy, lines merge together, and merged lines collapse. It is believed that this phenomenon occurs because lines are swollen in the developer and the thus expanded lines merge together. Since the swollen lines containing liquid developer are as soft as sponge, they readily collapse under the stress of rinsing. For this reason, the developer using a long-chain alkyl developing agent is effective for preventing film swell and hence, pattern collapse.

In an alternative embodiment, a negative pattern may be formed via organic solvent development. The developer used herein is preferably an organic solvent selected from among 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, pentyl acetate, butenyl acetate, isopentyl acetate, propyl formate, butyl formate, isobutyl formate, pentyl formate, isopentyl formate, methyl valerate, methyl pentenoate, methyl crotonate, ethyl crotonate, methyl propionate, ethyl propionate, ethyl 3-ethoxypropionate, methyl lactate, ethyl lactate, propyl lactate, butyl lactate, isobutyl lactate, pentyl lactate, isopentyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate, and mixtures thereof.

At the end of development, the resist film is rinsed. As the rinsing liquid, a solvent which is miscible with the developer and does not dissolve the resist film is preferred. Suitable solvents include alcohols of 3 to 10 carbon atoms, ether compounds of 8 to 12 carbon atoms, alkanes, alkenes, and alkynes of 6 to 12 carbon atoms, and aromatic solvents. Specifically, suitable alcohols of 3 to 10 carbon atoms include n-propyl alcohol, isopropyl alcohol, 1-butyl alcohol, 2-butyl alcohol, isobutyl alcohol, tert-butyl alcohol, 1-pentanol, 2-pentanol, 3-pentanol, tert-pentyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, and 1-octanol. Suitable ether compounds of 8 to 12 carbon atoms include di-n-butyl ether, diisobutyl ether, di-sec-butyl ether, di-n-pentyl ether, diisopentyl ether, di-sec-pentyl ether, di-tert-pentyl ether, and di-n-hexyl ether. Suitable alkanes of 6 to 12 carbon atoms include hexane, heptane, octane, nonane, decane, undecane, dodecane, methylcyclopentane, dimethylcyclopentane, cyclohexane, methylcyclohexane, dimethylcyclohexane, cycloheptane, cyclooctane, and cyclononane. Suitable alkenes of 6 to 12 carbon atoms include hexene, heptene, octene, cyclohexene, methylcyclohexene, dimethylcyclohexene, cycloheptene, and cyclooctene. Suitable alkynes of 6 to 12 carbon atoms include hexyne, heptyne, and octyne. Suitable aromatic solvents include toluene, xylene, ethylbenzene, isopropylbenzene, tert-butylbenzene and mesitylene. The solvents may be used alone or in admixture.

EXAMPLE

Examples of the invention are given below by way of illustration and not by way of limitation. The abbreviation "pbw" is parts by weight. For all polymers, Mw and Mn are determined by GPC versus polystyrene standards, and dispersity Mw/Mn is computed therefrom.

PAG Monomers 1 to 6 and Monomers 1, 2 used in Examples and Comparative Examples are identified below.

PAG Monomer 1

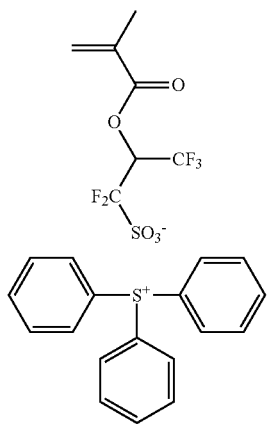

PAG Monomer 2

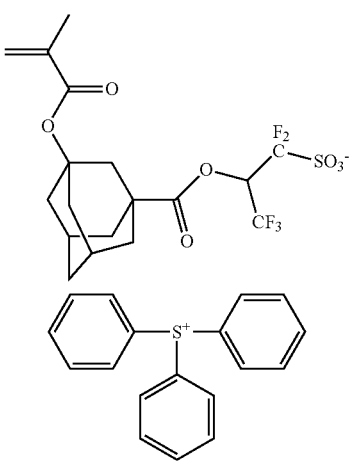

PAG Monomer 3

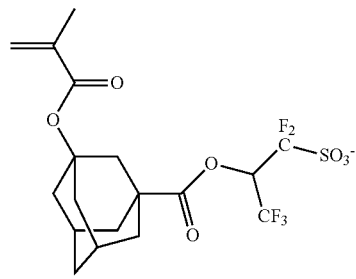

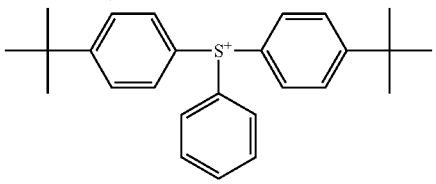

PAG Monomer 4

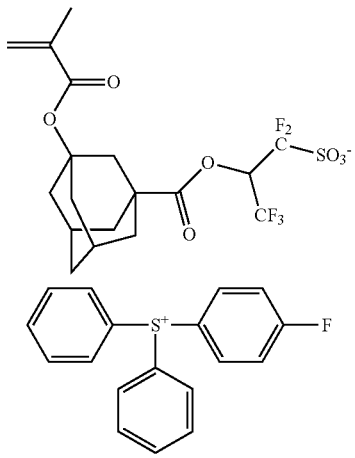

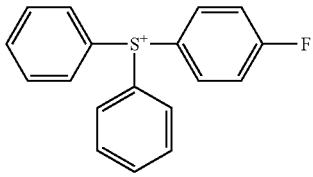

PAG Monomer 5

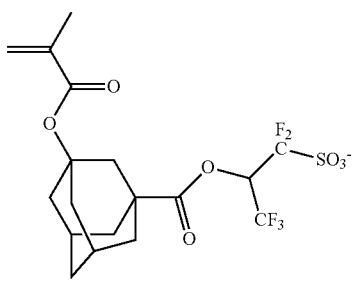

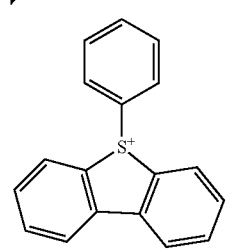

PAG Monomer 6

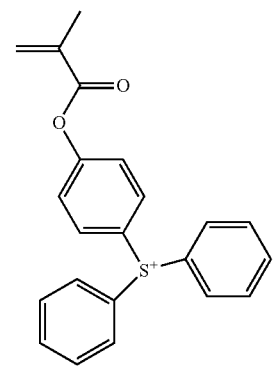

Monomer 1

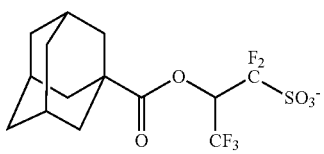

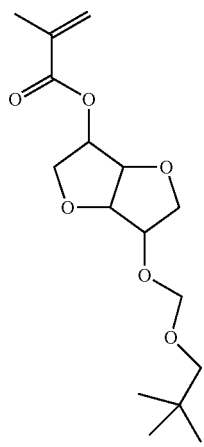

Monomer 2

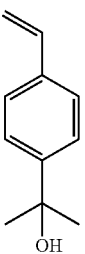

The LED lamp used in Examples is a LED lighting Tino4000NY by Intexs Corp. This lamp produces such illumination that a light fraction of wavelength up to 400 nm is cut off, specifically the quantity of light with wavelength 365 nm is less than 0.001 mW/cm$^2$, which is approximately equal to that of a yellow fluorescent lamp. The lamp used in Comparative Examples is a white fluorescent lamp which produces such illumination that the quantity of light with wavelength 365 nm is 0.1 mW/cm$^2$.

[1] Synthesis of Polymers

Example 1

Under illumination of Tino4000NY, a 2-L flask was charged with 8.2 g of 3-ethyl-3-exo-tetracyclo[4.4.0.1$^{2,5}$.1$^{7,10}$]-dodecanyl methacrylate, 3.6 g of 4-hydroxyphenyl methacrylate, 9.0 g of 3-oxo-2,7-dioxatricyclo[4.2.1.0$^{4,8}$]nonan-9-yl methacrylate, 5.6 g of PAG Monomer 1, 0.1 g of 1-(t-pentyloxycarbonyl)-4-morpholine, and 40 g of tetrahydrofuran (THF) as solvent. Under nitrogen atmosphere, the reactor was cooled to −70° C., after which vacuum pumping and nitrogen blow were repeated three times. The reactor was warmed up to room temperature, whereupon 1.2 g of 2,2'-azobisisobutyronitrile (AIBN) was added as polymerization initiator. The reactor was heated at 60° C., whereupon reaction run for 15 hours. The reaction solution was poured into 1 L of isopropyl alcohol for precipitation. The resulting white solid was filtered and vacuum dried at 60° C., obtaining a white polymer designated Polymer 1. The polymer was analyzed by $^{13}$C-NMR and $^1$H-NMR spectroscopy and GPC, with the results shown below.

Copolymer Compositional Ratio (Molar Ratio)

3-ethyl-3-exo-tetracyclo[4.4.0.1$^{2,5}$.1$^{7,10}$]dodecanyl methacrylate:4-hydroxyphenyl methacrylate:3-oxo-2,7-dioxatricyclo[4.2.1.0$^{4,8}$]nonan-9-yl methacrylate:PAG Monomer 1=0.30:0.20:0.40:0.10

Mw=7,600

Mw/Mn=1.82

Polymer 1

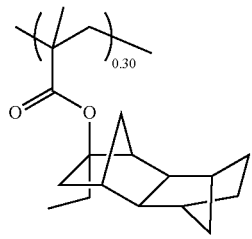

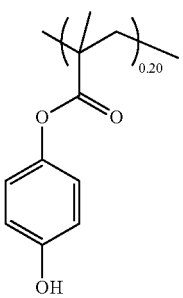

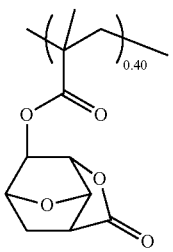

-continued

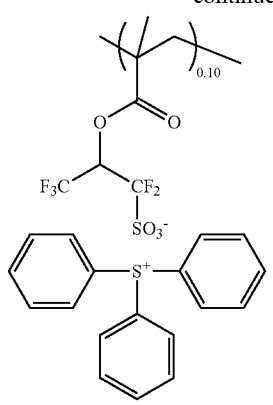

Example 2

Under illumination of Tino4000NY, a 2-L flask was charged with 9.8 g of 3-isopropyl-3-cyclopentyl methacrylate, 9.9 g of β-methacryloxy-β,γ-dimethyl-γ-butyrolactone, 3.7 g of PAG Monomer 2, 0.1 g of 1-(t-butoxycarbonyl)-4-piperidinone, and 40 g of THF solvent. Under nitrogen atmosphere, the reactor was cooled to −70° C., after which vacuum pumping and nitrogen blow were repeated three times. The reactor was warmed up to room temperature, whereupon 1.2 g of AIBN was added as polymerization initiator. The reactor was heated at 60° C., whereupon reaction run for 15 hours. The reaction solution was poured into 1 L of isopropyl alcohol for precipitation. The resulting white solid was filtered and vacuum dried at 60° C., obtaining a white polymer designated Polymer 2. The polymer was analyzed by $^{13}$C-NMR and $^{1}$H-NMR spectroscopy and GPC, with the results shown below.

Copolymer Compositional Ratio (Molar Ratio)

3-isopropyl-3-cyclopentyl methacrylate:β-methacryloxy-β,γ-dimethyl-γ-butyrolactone:PAG Monomer 2=0.48:0.47:0.05

Mw=7,900

Mw/Mn=1.73

-continued

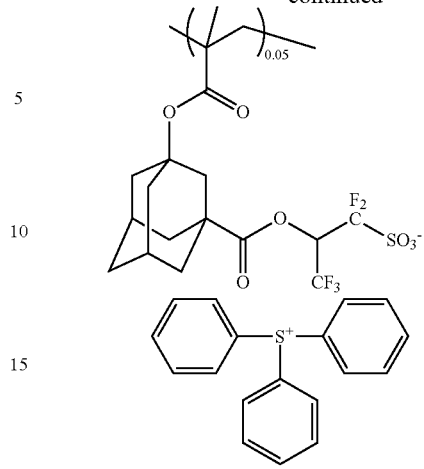

Example 3

Under illumination of Tino4000NY, a 2-L flask was charged with 10.5 g of 3-t-butyl-3-cyclopentyl methacrylate, 2.5 g of 3-hydroxy-1-adamantyl methacrylate, 6.1 g of tetrahydro-2-oxofuran-3-yl methacrylate, 3.9 g of PAG Monomer 4, 0.5 g of 1-(t-butoxycarbonyl)-2-piperidone, and 40 g of THF solvent. Under nitrogen atmosphere, the reactor was cooled to −70° C., after which vacuum pumping and nitrogen blow were repeated three times. The reactor was warmed up to room temperature, whereupon 1.2 g of AIBN was added as polymerization initiator. The reactor was heated at 60° C., whereupon reaction run for 15 hours. The reaction solution was poured into 1 L of isopropyl alcohol for precipitation. The resulting white solid was filtered and vacuum dried at 60° C., obtaining a white polymer designated Polymer 3. The polymer was analyzed by $^{13}$C-NMR and $^{1}$H-NMR spectroscopy and GPC, with the results shown below.

Copolymer Compositional Ratio (Molar Ratio)

3-t-butyl-3-cyclopentyl methacrylate:3-hydroxy-1-adamantyl methacrylate:tetrahydro-2-oxofuran-3-yl methacrylate:PAG Monomer 4=0.45:0.11:0.39:0.05

Mw=7,800

Mw/Mn=1.87

Polymer 2

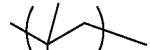

Polymer 3

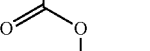
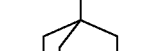

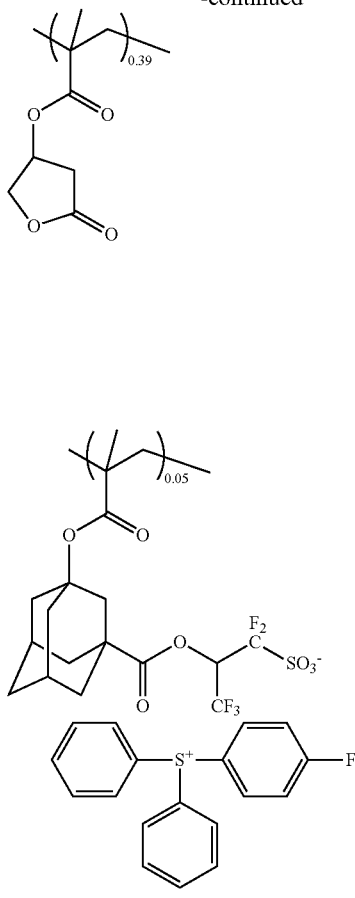

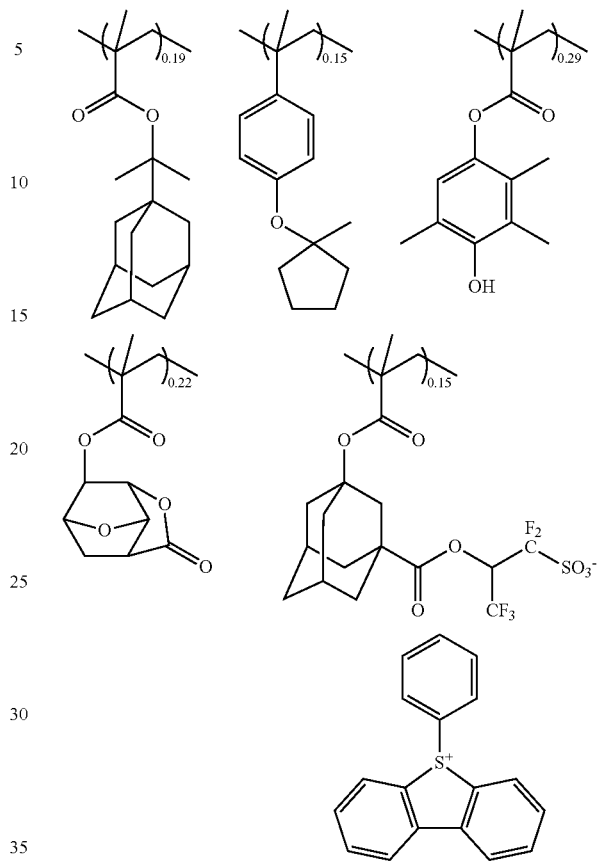

Polymer 4

Example 4

Under illumination of Tino4000NY, a 2-L flask was charged with 5.2 g of 1-(adamantan-1-yl)-1-methylethyl methacrylate, 3.0 g of 4-methylcyclopentyloxystyrene, 6.6 g of 4-hydroxy-2,3,5-trimethylphenyl methacrylate, 4.5 g of 3-oxo-2,7-dioxatricyclo[4.2.1.0$^{4,8}$]nonan-9-yl methacrylate, 11.0 g of PAG Monomer 5, 0.2 g of 1-(t-butoxycarbonyl)-1-azacycloheptan-2-one, and 40 g of THF solvent. Under nitrogen atmosphere, the reactor was cooled to −70° C., after which vacuum pumping and nitrogen blow were repeated three times. The reactor was warmed up to room temperature, whereupon 1.2 g of AIBN was added as polymerization initiator. The reactor was heated at 60° C., whereupon reaction run for 15 hours. The reaction solution was poured into 1 L of isopropyl alcohol for precipitation. The resulting white solid was filtered and vacuum dried at 60° C., obtaining a white polymer designated Polymer 4. The polymer was analyzed by $^{13}$C-NMR and $^{1}$H-NMR spectroscopy and GPC, with the results shown below.

Copolymer Compositional Ratio (Molar Ratio)

1-(adamantan-1-yl)-1-methylethyl methacrylate:4-methyl-cyclopentyloxystyrene:4-hydroxy-2,3,5-trimethylphenyl methacrylate:3-oxo-2,7-dioxatricyclo[4.2.1.0$^{4,8}$]-nonan-9-yl methacrylate:PAG Monomer 5=0.19:0.15:0.29:0.22:0.15

Mw=9,900

Mw/Mn=1.71

Example 5

Under illumination of Tino4000NY, a 2-L flask was charged with 9.0 g of 3-vinyl-3-cyclopentyl methacrylate, 2.4 g of 3-hydroxy-1-adamantyl methacrylate, 5.1 g of tetrahydro-2-oxofuran-3-yl methacrylate, 7.3 g of PAG Monomer 6, 1.0 g of 1-(t-butoxycarbonyl)-2-pyrrolidinone, and 40 g of THF solvent. Under nitrogen atmosphere, the reactor was cooled to −70° C., after which vacuum pumping and nitrogen blow were repeated three times. The reactor was warmed up to room temperature, whereupon 1.2 g of AIBN was added as polymerization initiator. The reactor was heated at 60° C., whereupon reaction run for 15 hours. The reaction solution was poured into 1 L of isopropyl alcohol for precipitation. The resulting white solid was filtered and vacuum dried at 60° C., obtaining a white polymer designated Polymer 5. The polymer was analyzed by $^{13}$C-NMR and $^{1}$H-NMR spectroscopy and GPC, with the results shown below.

Copolymer Compositional Ratio (Molar Ratio)

3-vinyl-3-cyclopentyl methacrylate:3-hydroxy-1-adamantyl methacrylate:tetrahydro-2-oxofuran-3-yl methacrylate:PAG Monomer 6=0.48:0.10:0.32:0.10

Mw=7,600

Mw/Mn=1.92

Polymer 5

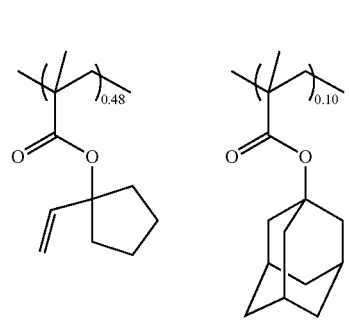

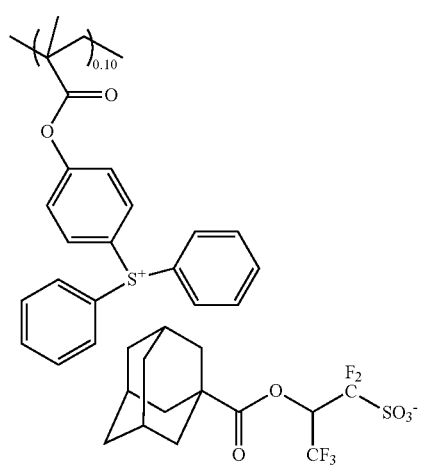

Polymer 6

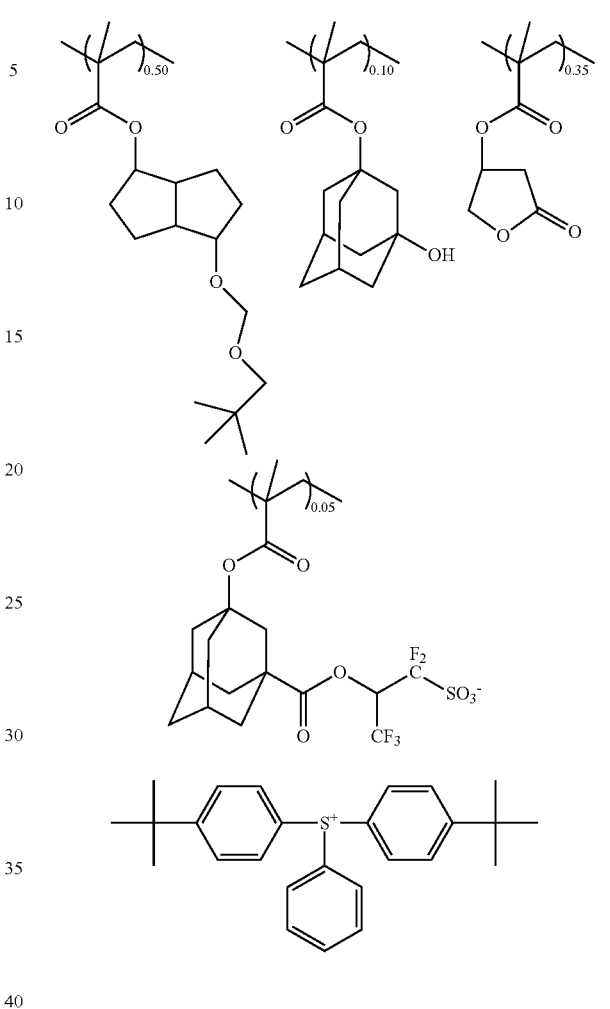

Example 6

Under illumination of Tino4000NY, a 2-L flask was charged with 15.7 g of Monomer 1, 2.4 g of 3-hydroxy-1-adamantyl methacrylate, 6.0 g of tetrahydro-2-oxofuran-3-yl methacrylate, 4.3 g of PAG Monomer 3, 0.4 g of N-(t-butoxycarbonyloxy)succinimide, and 40 g of THF solvent. Under nitrogen atmosphere, the reactor was cooled to −70° C., after which vacuum pumping and nitrogen blow were repeated three times. The reactor was warmed up to room temperature, whereupon 1.2 g of AIBN was added as polymerization initiator. The reactor was heated at 60° C., whereupon reaction run for 15 hours. The reaction solution was poured into 1 L of isopropyl alcohol for precipitation. The resulting white solid was filtered and vacuum dried at 60° C., obtaining a white polymer designated Polymer 6. The polymer was analyzed by $^{13}$C-NMR and $^1$H-NMR spectroscopy and GPC, with the results shown below.

Copolymer Compositional Ratio (Molar Ratio)

Monomer 1:3-hydroxy-1-adamantyl methacrylate:tetrahydro-2-oxofuran-3-yl methacrylate:PAG Monomer 3=0.50:0.10:0.35:0.05

Mw=7,800

Mw/Mn=1.77

Example 7

Under illumination of Tino4000NY, a 2-L flask was charged with 8.1 g of Monomer 2, 2.4 g of 3-hydroxy-1-adamantyl methacrylate, 5.3 g of 4-hydroxyphenyl methacrylate, 5.6 g of PAG Monomer 1, 0.3 g of N-(t-butoxycarbonyl)glycine, and 40 g of THF solvent. Under nitrogen atmosphere, the reactor was cooled to −70° C., after which vacuum pumping and nitrogen blow were repeated three times. The reactor was warmed up to room temperature, whereupon 1.2 g of AIBN was added as polymerization initiator. The reactor was heated at 60° C., whereupon reaction run for 15 hours. The reaction solution was poured into 1 L of isopropyl alcohol for precipitation. The resulting white solid was filtered and vacuum dried at 60° C., obtaining a white polymer designated Polymer 7. The polymer was analyzed by $^{13}$C-NMR and $^1$H-NMR spectroscopy and GPC, with the results shown below.

Copolymer Compositional Ratio (Molar Ratio)

Monomer 2:3-hydroxy-1-adamantyl methacrylate 4-hydroxyphenyl methacrylate:PAG Monomer 1=0.48:0.10:0.32:0.10

Mw=6,900

Mw/Mn=1.55

Polymer 7

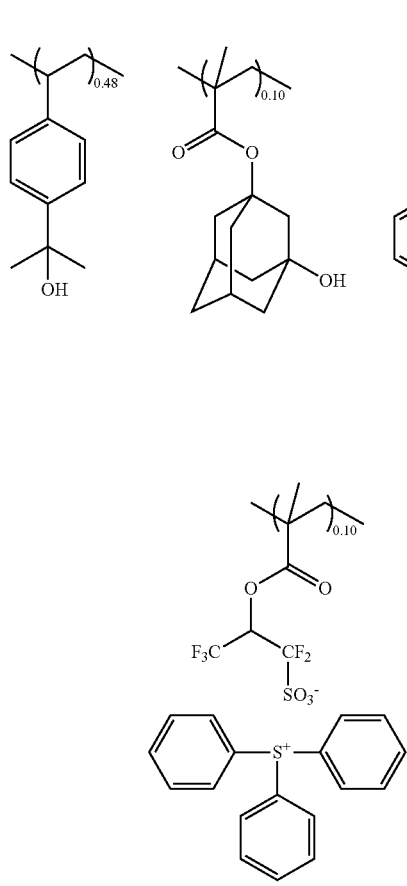

Polymer 8

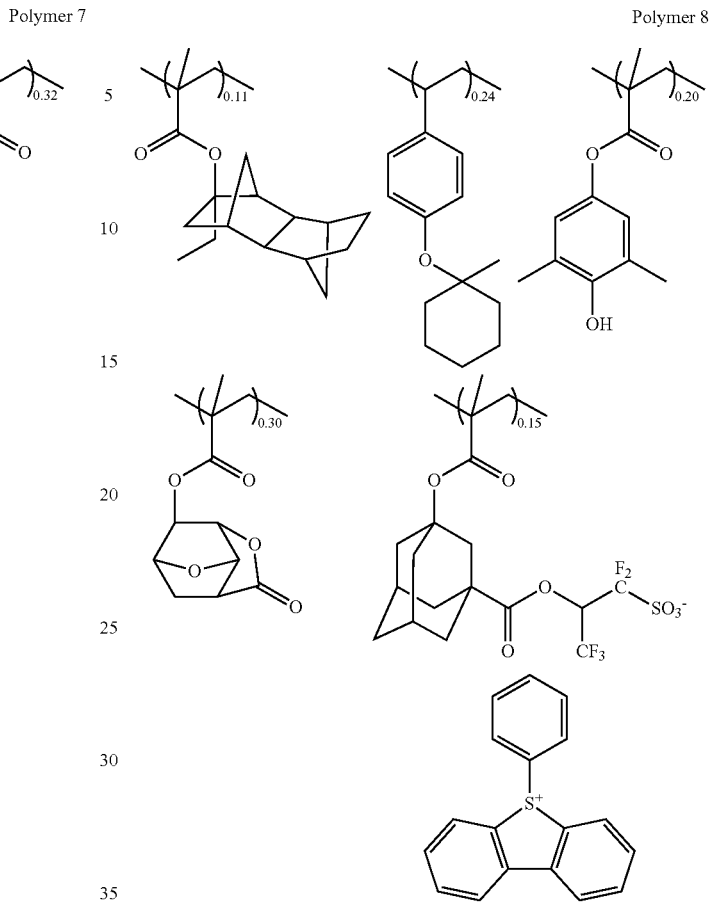

Example 8

Under illumination of Tino4000NY, a 2-L flask was charged with 2.7 g of 3-ethyl-3-exotetracyclo[4.4.0.1$^{2,5}$.1$^{7,10}$]-dodecanyl methacrylate, 5.4 g of 4-methylcyclohexyloxystyrene, 4.1 g of 4-hydroxy-3,5-dimethylphenyl methacrylate, 4.5 g of 3-oxo-2,7-dioxatricyclo[4.2.1.0$^{4,8}$]nonan-9-yl methacrylate, 11.0 g of PAG Monomer 5, 0.2 g of 4-(t-butoxycarbonylamino)-butyric acid, and 40 g of THF solvent. Under nitrogen atmosphere, the reactor was cooled to −70° C., after which vacuum pumping and nitrogen blow were repeated three times. The reactor was warmed up to room temperature, whereupon 1.2 g of AIBN was added as polymerization initiator. The reactor was heated at 60° C., whereupon reaction run for 15 hours. The reaction solution was poured into 1 L of isopropyl alcohol for precipitation. The resulting white solid was filtered and vacuum dried at 60° C., obtaining a white polymer designated Polymer 8. The polymer was analyzed by $^{13}$C-NMR and $^{1}$H-NMR spectroscopy and GPC, with the results shown below.

Copolymer Compositional Ratio (Molar Ratio)

3-ethyl-3-exotetracyclo[4.4.0.1$^{2,5}$.1$^{7,10}$]dodecanyl methacrylate:4-methylcyclohexyloxystyrene:4-hydroxy-3,5-dimethylphenyl methacrylate:3-oxo-2,7-dioxatricyclo-[4.2.1.0$^{6,8}$]nonan-9-yl methacrylate:PAG Monomer 5=0.11:0.24:0.20:0.30:0.15

Mw=9,200

Mw/Mn=1.68

Example 9

Under illumination of Tino4000NY, a 2-L flask was charged with 2.7 g of 3-ethyl-3-exotetracyclo[4.4.0.1$^{2,5}$.1$^{7,10}$]-dodecanyl methacrylate, 6.1 g of 4-methylcyclohexyloxystyrene, 4.1 g of 4-hydroxy-3,5-dimethylphenyl methacrylate, 5.0 g of β-methacryloxy-β,γ-dimethyl-γ-butyrolactone, 11.0 g of PAG Monomer 5, 0.2 g of 1-(t-butoxycarbonyl)-4-methanesulfonyl-oxypiperidine, and 40 g of THF solvent. Under nitrogen atmosphere, the reactor was cooled to −70° C., after which vacuum pumping and nitrogen blow were repeated three times. The reactor was warmed up to room temperature, whereupon 1.2 g of AIBN was added as polymerization initiator. The reactor was heated at 60° C., whereupon reaction run for 15 hours. The reaction solution was poured into 1 L of isopropyl alcohol for precipitation. The resulting white solid was filtered and vacuum dried at 60° C., obtaining a white polymer designated Polymer 9. The polymer was analyzed by $^{13}$C-NMR and $^{1}$H-NMR spectroscopy and GPC, with the results shown below.

Copolymer Compositional Ratio (Molar Ratio)

3-ethyl-3-exotetracyclo[4.4.0.1$^{2,5}$.1$^{7,10}$]dodecanyl methacrylate:4-methylcyclohexyloxystyrene:4-hydroxy-3,5-dimethylphenyl methacrylate:β-methacryloxy-β,γ-dimethyl-γ-butyrolactone:PAG Monomer 5=0.11:0.29:0.20:0.25:0.15

Mw=9,600

Mw/Mn=1.61

Polymer 9

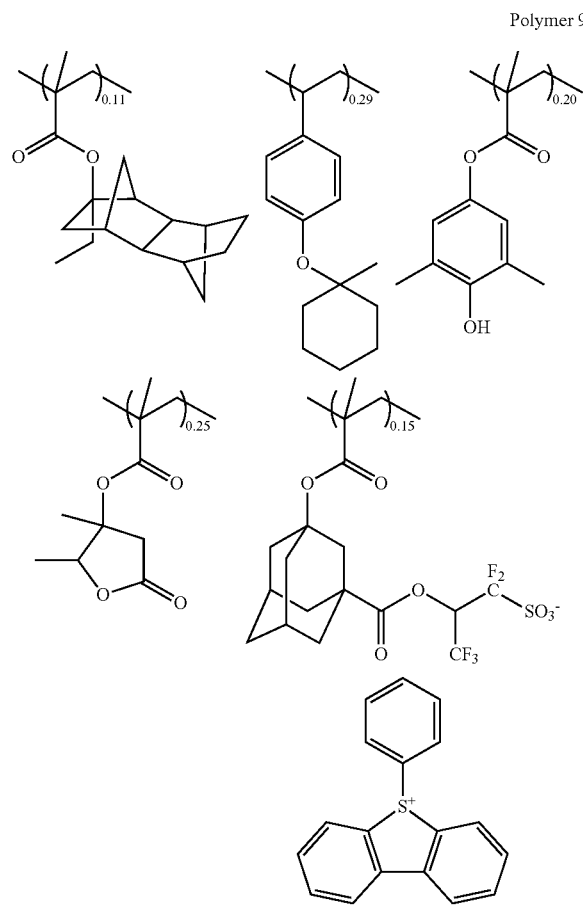

Polymer 10

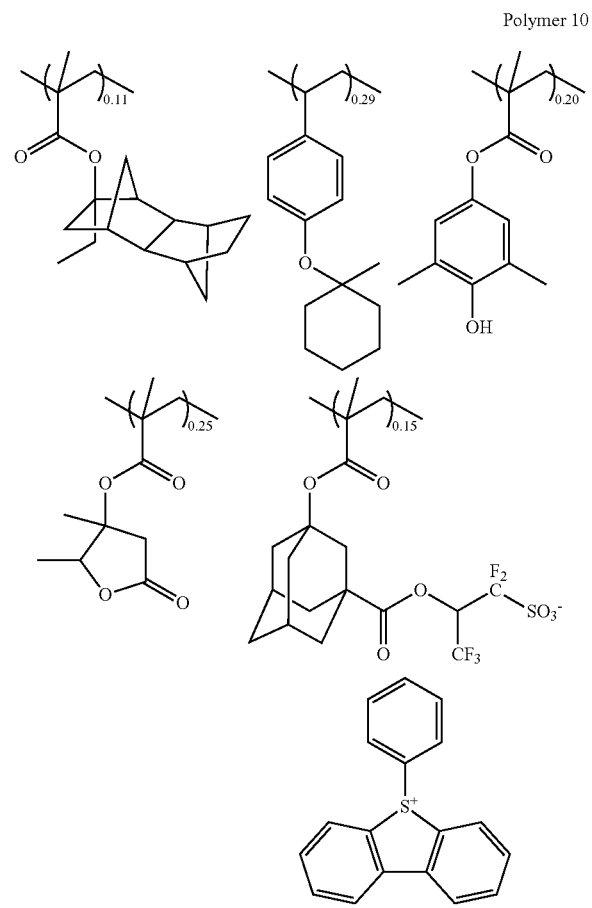

Example 10

Under illumination of Tino4000NY, a 2-L flask was charged with 2.7 g of 3-ethyl-3-exotetracyclo[4.4.0.1$^{2,5}$.1$^{7,10}$]-dodecanyl methacrylate, 6.1 g of 4-methylcyclohexyloxystyrene, 4.1 g of 4-hydroxy-3,5-dimethylphenyl methacrylate, 5.0 g of β-methacryloxy-β,γ-dimethyl-γ-butyrolactone, 11.0 g of PAG Monomer 5, 0.1 g of N-(t-butoxycarbonyl)-DL-alanine, and 40 g of THF solvent. Under nitrogen atmosphere, the reactor was cooled to −70° C., after which vacuum pumping and nitrogen blow were repeated three times. The reactor was warmed up to room temperature, whereupon 1.2 g of AIBN was added as polymerization initiator. The reactor was heated at 60° C., whereupon reaction run for 15 hours. The reaction solution was poured into 1 L of isopropyl alcohol for precipitation. The resulting white solid was filtered and vacuum dried at 60° C., obtaining a white polymer designated Polymer 10. The polymer was analyzed by $^{13}$C-NMR and $^1$H-NMR spectroscopy and GPC, with the results shown below.

Copolymer Compositional Ratio (Molar Ratio)

- 3-ethyl-3-exotetracyclo[4.4.0.1$^{2,5}$.1$^{7,10}$]dodecanyl methacrylate:4-methylcyclohexyloxystyrene:4-hydroxy-3,5-dimethylphenyl methacrylate:β-methacryloxy-β,γ-dimethyl-γ-butyrolactone:PAG Monomer 5=0.11:0.29:0.20:0.25:0.15
- Mw=9,800
- Mw/Mn=1.60

Example 11

Under illumination of Tino4000NY, a 2-L flask was charged with 2.7 g of 3-ethyl-3-exotetracyclo[4.4.0.1$^{2,5}$.1$^{7,10}$]-dodecanyl methacrylate, 6.1 g of 4-methylcyclohexyloxystyrene, 4.1 g of 4-hydroxy-3,5-dimethylphenyl methacrylate, 5.0 g of β-methacryloxy-β,γ-dimethyl-γ-butyrolactone, 11.0 g of PAG Monomer 5, 0.2 g of 4-(t-butoxycarbonylamino)-1-butanol, and 40 g of THF solvent. Under nitrogen atmosphere, the reactor was cooled to −70° C., after which vacuum pumping and nitrogen blow were repeated three times. The reactor was warmed up to room temperature, whereupon 1.2 g of AIBN was added as polymerization initiator. The reactor was heated at 60° C., whereupon reaction run for 15 hours. The reaction solution was poured into 1 L of isopropyl alcohol for precipitation. The resulting white solid was filtered and vacuum dried at 60° C., obtaining a white polymer designated Polymer 11. The polymer was analyzed by $^{13}$C-NMR and $^1$H-NMR spectroscopy and GPC, with the results shown below.

Copolymer Compositional Ratio (Molar Ratio)

- 3-ethyl-3-exotetracyclo[4.4.0.1$^{2,5}$.1$^{7,10}$]dodecanyl methacrylate:4-methylcyclohexyloxystyrene:4-hydroxy-3,5-dimethylphenyl methacrylate:β-methacryloxy-β,γ-dimethyl-γ-butyrolactone:PAG Monomer 5=0.12:0.28:0.20:0.25:0.15
- Mw=9,300
- Mw/Mn=1.59

Polymer 11

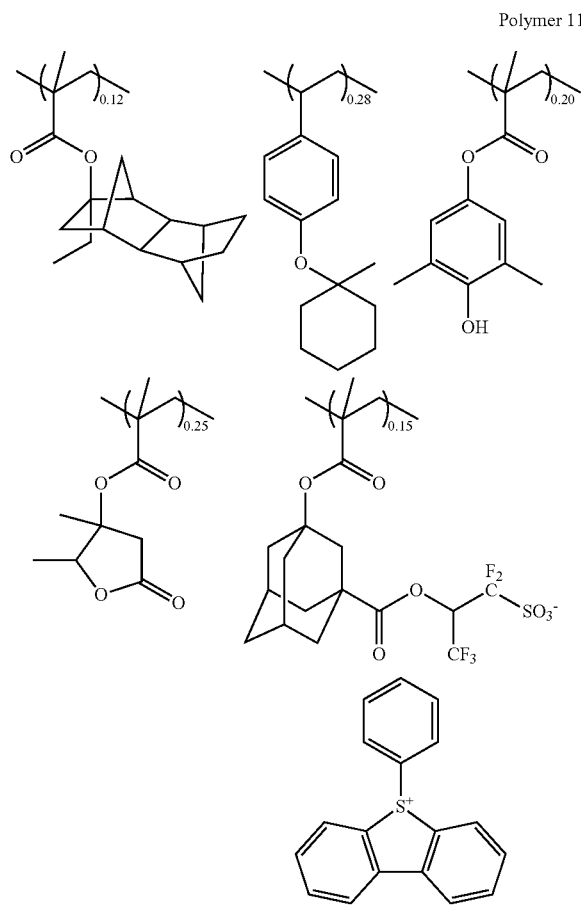

Polymer 12

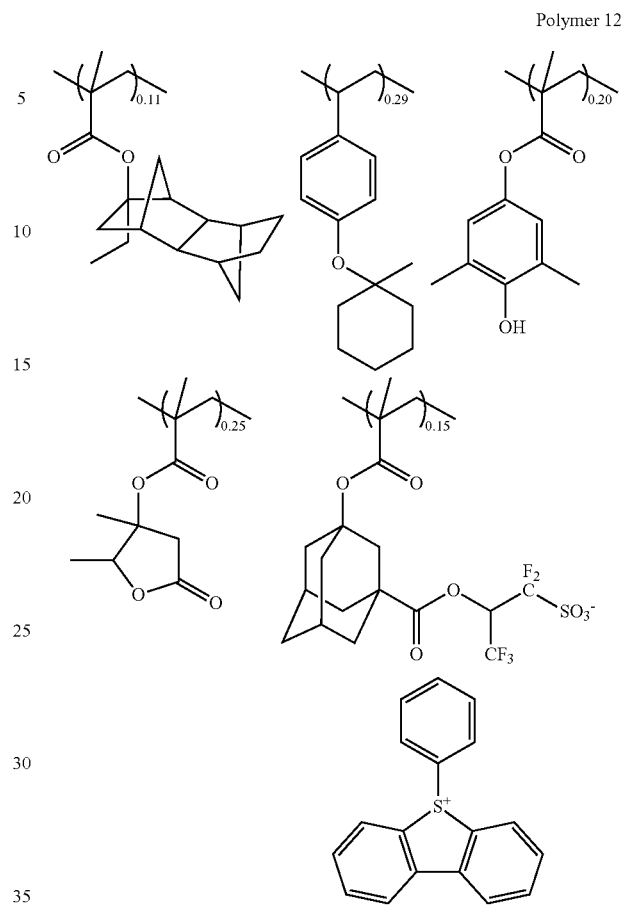

Example 12

Under illumination of Tino4000NY, a 2-L flask was charged with 2.7 g of 3-ethyl-3-exotetracyclo[4.4.0.1$^{2,5}$.1$^{7,10}$]-dodecanyl methacrylate, 6.1 g of 4-methylcyclohexyloxystyrene, 4.1 g of 4-hydroxy-3,5-dimethylphenyl methacrylate, 5.0 g of β-methacryloxy-β,γ-dimethyl-γ-butyrolactone, 11.0 g of PAG Monomer 5, 0.2 g of 4-[(t-butoxycarbonylamino)methyl]pyridine, and 40 g of THF solvent. Under nitrogen atmosphere, the reactor was cooled to −70° C., after which vacuum pumping and nitrogen blow were repeated three times. The reactor was warmed up to room temperature, whereupon 1.2 g of AIBN was added as polymerization initiator. The reactor was heated at 60° C., whereupon reaction run for 15 hours. The reaction solution was poured into 1 L of isopropyl alcohol for precipitation. The resulting white solid was filtered and vacuum dried at 60° C., obtaining a white polymer designated Polymer 12. The polymer was analyzed by $^{13}$C-NMR and H-NMR spectroscopy and GPC, with the results shown below.

Copolymer Compositional Ratio (Molar Ratio)

3-ethyl-3-exotetracyclo[4.4.0.1$^{2,5}$.1$^{7,10}$]dodecanyl methacrylate:4-methylcyclohexyloxystyrene:4-hydroxy-3,5-dimethylphenyl methacrylate:β-methacryloxy-β,γ-dimethyl-γ-butyrolactone:PAG Monomer 5=0.11:0.29:0.20:0.25:0.15

Mw=9,300

Mw/Mn=1.59

Example 13

Under illumination of Tino4000NY, a 2-L flask was charged with 2.7 g of 3-ethyl-3-exotetracyclo[4.4.0.1$^{2,5}$.1$^{7,10}$]-dodecanyl methacrylate, 6.1 g of 4-methylcyclohexyloxystyrene, 4.1 g of 4-hydroxy-3,5-dimethylphenyl methacrylate, 5.0 g of β-methacryloxy-β,γ-dimethyl-γ-butyrolactone, 11.0 g of PAG Monomer 5, 0.15 g of 2-(t-butoxycarbonylamino)isobutyric acid, and 40 g of THF solvent. Under nitrogen atmosphere, the reactor was cooled to −70° C., after which vacuum pumping and nitrogen blow were repeated three times. The reactor was warmed up to room temperature, whereupon 1.2 g of AIBN was added as polymerization initiator. The reactor was heated at 60° C., whereupon reaction run for 15 hours. The reaction solution was poured into 1 L of isopropyl alcohol for precipitation. The resulting white solid was filtered and vacuum dried at 60° C., obtaining a white polymer designated Polymer 13. The polymer was analyzed by $^{13}$C-NMR and $^{1}$H-NMR spectroscopy and GPC, with the results shown below.

Copolymer Compositional Ratio (Molar Ratio)

3-ethyl-3-exotetracyclo[4.4.0.1$^{2,5}$.1$^{7,10}$]dodecanyl methacrylate:4-methylcyclohexyloxystyrene:4-hydroxy-3,5-dimethylphenyl methacrylate:β-methacryloxy-β,γ-dimethyl-γ-butyrolactone:PAG Monomer 5=0.11:0.29:0.19:0.26:0.15

Mw=9,100

Mw/Mn=1.82

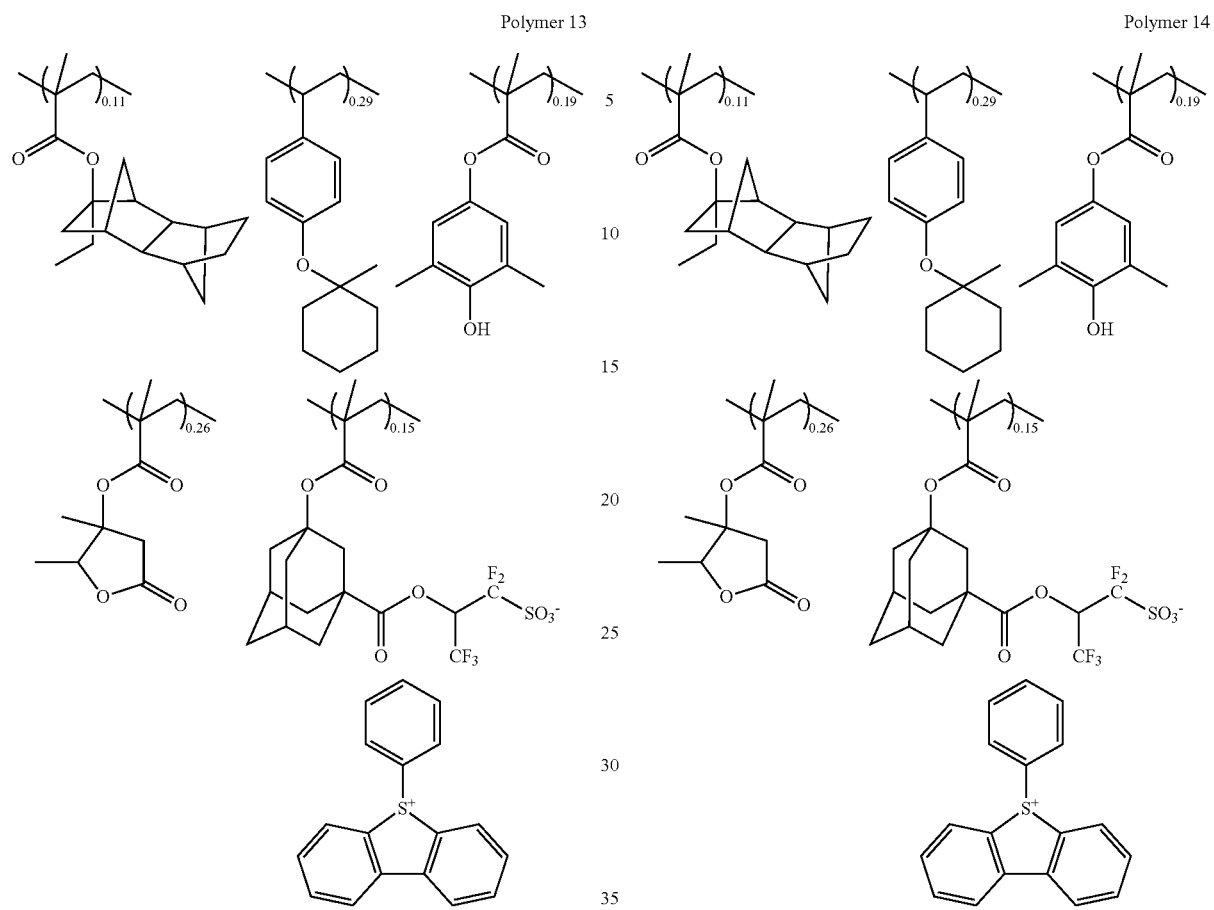

Example 14

Under illumination of Tino4000NY, a 2-L flask was charged with 2.7 g of 3-ethyl-3-exotetracyclo[4.4.0.1$^{2,5}$.1$^{7,10}$]-dodecanyl methacrylate, 6.1 g of 4-methylcyclohexyloxystyrene, 4.1 g of 4-hydroxy-3,5-dimethylphenyl methacrylate, 5.0 g of β-methacryloxy-β,γ-dimethyl-γ-butyrolactone, 11.0 g of PAG Monomer 5, 0.25 g of N-(t-pentyloxycarbonyl)carbazole, and 40 g of THF solvent. Under nitrogen atmosphere, the reactor was cooled to −70° C., after which vacuum pumping and nitrogen blow were repeated three times. The reactor was warmed up to room temperature, whereupon 1.2 g of AIBN was added as polymerization initiator. The reactor was heated at 60° C., whereupon reaction run for 15 hours. The reaction solution was poured into 1 L of isopropyl alcohol for precipitation. The resulting white solid was filtered and vacuum dried at 60° C., obtaining a white polymer designated Polymer 14. The polymer was analyzed by $^{13}$C-NMR and $^{1}$H-NMR spectroscopy and GPC, with the results shown below.

Copolymer Compositional Ratio (Molar Ratio)

3-ethyl-3-exotetracyclo[4.4.0.1$^{2,5}$.1$^{7,10}$.]dodecanyl methacrylate:4-methylcyclohexyloxystyrene:4-hydroxy-3,5-dimethylphenyl methacrylate:β-methacryloxy-β,γ-dimethyl-γ-butyrolactone:PAG Monomer 5=0.11:0.29:0.19:0.26:0.15

Mw=9,400

Mw/Mn=1.84

Example 15

Under illumination of Tino4000NY, a 2-L flask was charged with 2.7 g of 3-ethyl-3-exotetracyclo[4.4.0.1$^{2,5}$.1$^{7,10}$]-dodecanyl methacrylate, 6.1 g of 4-methylcyclohexyloxystyrene, 4.1 g of 4-hydroxy-3,5-dimethylphenyl methacrylate, 5.0 g of β-methacryloxy-β,γ-dimethyl-γ-butyrolactone, 11.0 g of PAG Monomer 5, 0.2 g of N-(t-butoxycarbonyl)-2,3-dihydroindole, and 40 g of THF solvent. Under nitrogen atmosphere, the reactor was cooled to −70° C., after which vacuum pumping and nitrogen blow were repeated three times. The reactor was warmed up to roam temperature, whereupon 1.2 g of AIBN was added as polymerization initiator. The reactor was heated at 60° C., whereupon reaction run for 15 hours. The reaction solution was poured into 1 L of isopropyl alcohol for precipitation. The resulting white solid was filtered and vacuum dried at 60° C., obtaining a white polymer designated Polymer 15. The polymer was analyzed by $^{13}$C-NMR and $^{1}$H-NMR spectroscopy and GPC, with the results shown below.

Copolymer Compositional Ratio (Molar Ratio)

3-ethyl-3-exotetracyclo[4.4.0.1$^{2,5}$.1$^{7,10}$]dodecanyl methacrylate:4-methylcyclohexyloxystyrene:4-hydroxy-3,5-dimethylphenyl methacrylate:β-methacryloxy-β,γ-dimethyl-γ-butyrolactone:PAG Monomer 5=0.11:0.29:0.19:0.26:0.15

Mw=9,200

Mw/Mn=1.69

Polymer 15

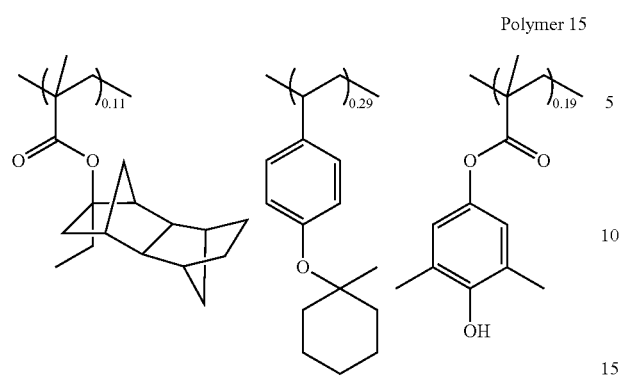

Comparative Polymer 1

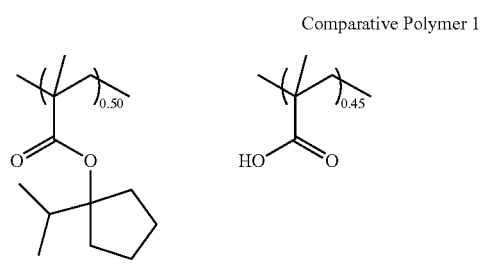

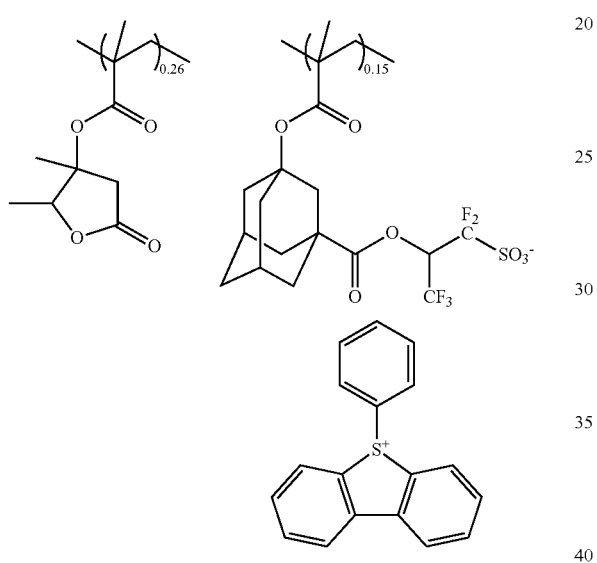

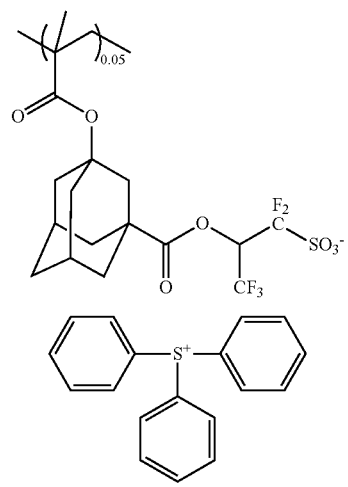

Comparative Example 2

Comparative Example 1

Under illumination of Tino4000NY, a 2-L flask was charged with 9.8 g of 3-isopropyl-3-cyclopentyl methacrylate, 9.9 g of β-methacryloxy-β,γ-dimethyl-γ-butyrolactone, 3.7 g of PAG Monomer 2, 1.0 g of triethylamine, and 40 g of THF solvent. Under nitrogen atmosphere, the reactor was cooled to −70° C., after which vacuum pumping and nitrogen blow were repeated three times. The reactor was warmed up to room temperature, whereupon 1.2 g of AIBN was added as polymerization initiator. The reactor was heated at 60° C., whereupon reaction run for 15 hours. The reaction solution was poured into 1 L of isopropyl alcohol for precipitation. The resulting white solid was filtered and vacuum dried at 60° C., obtaining a white polymer designated Comparative Polymer 1. The polymer was analyzed by $^{13}$C-NMR and $^1$H-NMR spectroscopy and GPC, with the results shown below.

Copolymer Compositional Ratio (Molar Ratio)

3-isopropyl-3-cyclopentyl methacrylate:methacrylic acid: PAG Monomer 2=0.50:0.45:0.05

Mw=7,100

Mw/Mn=1.98

Under illumination of Tino4000NY, a 2-L flask was charged with 10.5 g of 3-t-butyl-3-cyclopentyl methacrylate, 2.5 g of 3-hydroxy-1-adamantyl methacrylate, 6.1 g of tetrahydro-2-oxofuran-3-yl methacrylate, 3.9 g of PAG Monomer 4, and 40 g of THF solvent. Under nitrogen atmosphere, the reactor was cooled to −70° C., after which vacuum pumping and nitrogen blow were repeated three times. The reactor was warmed up to room temperature, whereupon 1.2 g of AIBN was added as polymerization initiator. The reactor was heated at 60° C., whereupon reaction run for 15 hours. The reaction solution was poured into 1 L of isopropyl alcohol for precipitation. The resulting white solid was filtered and vacuum dried at 60° C., obtaining a white polymer designated Comparative Polymer 2. The polymer was analyzed by $^{13}$C-NMR and $^1$H-NMR spectroscopy and GPC, with the results shown below.

Copolymer Compositional Ratio (Molar Ratio)

3-t-butyl-3-cyclopentyl methacrylate:methacrylic acid:3-hydroxy-1-adamantyl methacrylate:tetrahydro-2-oxofuran-3-yl methacrylate:PAG Monomer 4=0.41:0.05:0.11:0.39:0.04

Mw=7,100

Mw/Mn=1.98

Comparative Polymer 2

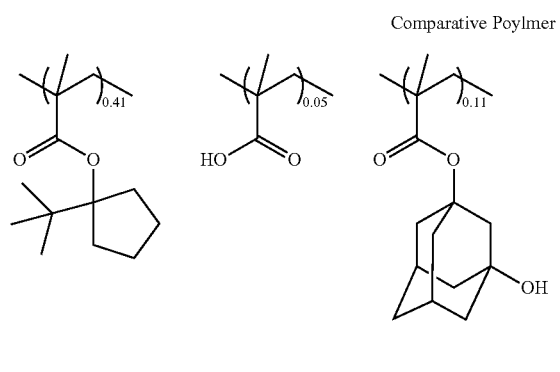

Comparative Polymer 3

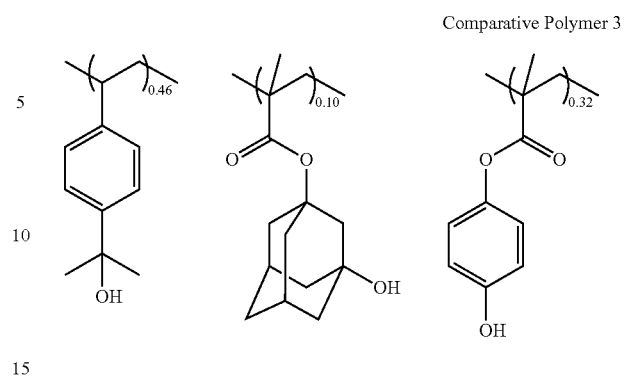

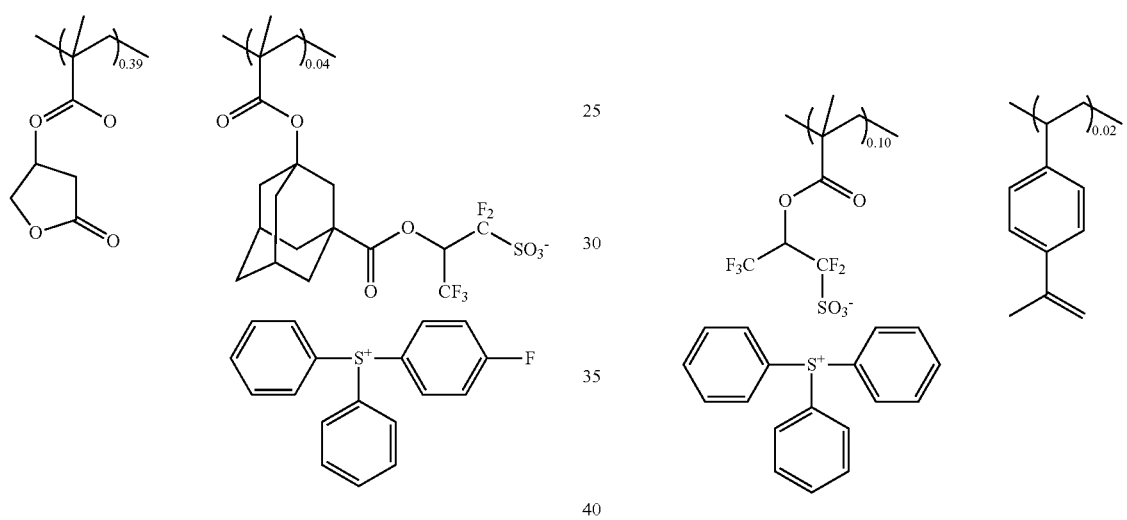

Comparative Example 3

Under illumination of a white fluorescent lamp, a 2-L flask was charged with 8.1 g of Monomer 2, 2.4 g of 3-hydroxy-1-adamantyl methacrylate, 5.3 g of 4-hydroxyphenyl methacrylate, 5.6 g of PAG Monomer 1, and 40 g of THF solvent. Under nitrogen atmosphere, the reactor was cooled to −70° C., after which vacuum pumping and nitrogen blow were repeated three times. The reactor was warmed up to room temperature, whereupon 1.2 g of AIBN was added as polymerization initiator. The reactor was heated at 60° C., whereupon reaction run for 15 hours. The reaction solution was poured into 1 L of isopropyl alcohol for precipitation. The resulting white solid was filtered and vacuum dried at 60° C., obtaining a white polymer designated Comparative Polymer 3. The polymer was analyzed by $^{13}$C-NMR and $^1$H-NMR spectroscopy and GPC, with the results shown below.

Copolymer Compositional Ratio (Molar Ratio)
  Monomer 2:3-hydroxy-1-adamantyl methacrylate 4-hydroxyphenyl methacrylate:PAG Monomer 1:4-isopropenylstyrene=0.46:0.10:0.32:0.10:0.02
  Mw=20,600
  Mw/Mn=2.32

[2] EUV Exposure Test

Examples 16 to 33 & Comparative Examples 4 to 6

A positive resist composition was prepared by dissolving a polymer and other components in a solvent in accordance with the recipe shown in Tables 1 and 2, adding 100 ppm of surfactant FC-4430 (3M) thereto, and filtering through a filter with a pore size of 0.2 μm.

The components in Tables 1 and 2 are identified below.
Polymers 1 to 15: Polymers obtained in Examples 1 to 15
Comparative Polymers 1 to 3:
  Polymers obtained in Comparative Examples 1 to 3
Organic solvent:
  PGMEA=propylene glycol monomethyl ether acetate
  PGME=propylene glycol monomethyl ether
  CyH=cyclohexanone
  EL=ethyl lactate
Acid generator: PAG1 to PAG3 of the structural formula below
Basic compound: Amines 1 and 2 of the structural formula below

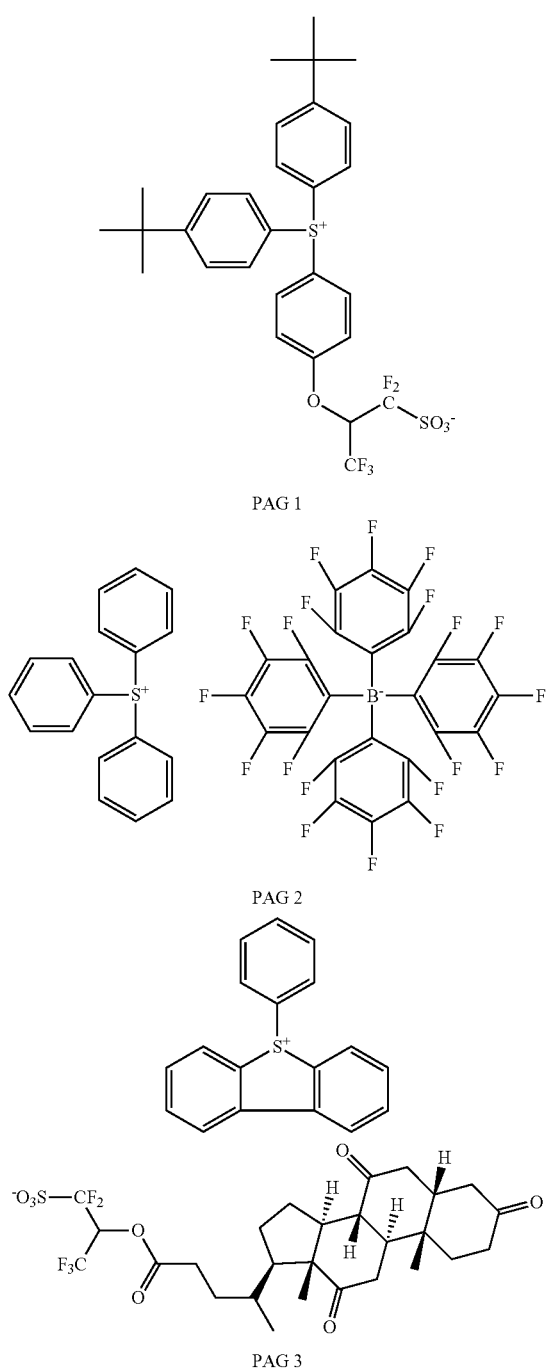

PAG 1

PAG 2

PAG 3

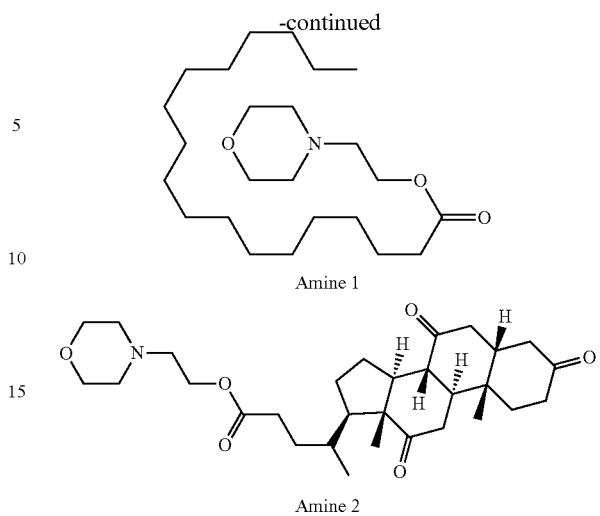

Amine 1

Amine 2

Examples 16, 19, 23 to 30, Comparative Examples 4 and 6 used a substrate which had been prepared by coating a silicon substrate of 4-inch diameter with a silicon-containing underlying film SHB-A940 (Shin-Etsu Chemical Co., Ltd.) and heating at 220° C. for 60 seconds to form a resist underlying film of 35 nm thick. Other Examples used a substrate which had been prepared by coating a silicon substrate of 4-inch diameter with a silicon-containing underlying film SHB-N04 (Shin-Etsu Chemical Co., Ltd.) and heating at 220° C. for 60 seconds to form a resist underlying film of 35 nm thick. The resist composition was spin coated onto the substrate and prebaked on a hot plate at 110° C. for 60 seconds to form a resist film of 30 nm thick. Using an EUV exposure tool (NA 0.3), the resist film was exposed to EUV through a pseudo-phase shift mask.

The resist film was immediately baked (PEB) on a hot plate at the temperature shown in Tables 1 and 2 for 60 seconds. The resist film was puddle developed in a 2.38 wt % TMAH aqueous solution for 20 seconds to form a positive pattern in Examples 16, 19, 23 to 30 and Comparative Example 4 or a negative pattern in Example 22 and Comparative Example 6. In Example 17, 18, 20, 21, 31-33 and Comparative Example 5, the resist film was puddle developed in n-butyl acetate for 20 seconds to form a negative pattern.

The resulting resist pattern was evaluated as follows. Sensitivity is the optimum dose (mJ/cm²) that provides a 1:1 resolution of a 20-nm line-and-space pattern. Resolution is a minimum size at the optimum dose. The 20-nm L/S pattern was measured for edge roughness (LWR) under SEM. The sensitivity, resolution and LWR on EUV lithography are shown in Tables 1 and 2 together with the formulation of resist composition.

TABLE 1

|  |  | Polymer (pbw) | Acid generator (pbw) | Basic compound (pbw) | Organic solvent (pbw) | PEB temp. (° C.) | Sensitivity (mJ/cm$^2$) | Resolution (nm) | LWR (nm) |
|---|---|---|---|---|---|---|---|---|---|
| Example | 16 | Polymer 1 (100) | — | Amine 1 (1.4) | PGMEA (1,000) CyH (2,000) PGME (500) | 85 | 32 | 18 | 3.7 |
|  | 17 | Polymer 2 (100) | — | Amine 1 (1.4) | PGMEA (1,000) CyH (2,000) PGME (500) | 80 | 29 | 18 | 3.2 |

TABLE 1-continued

| | | Polymer (pbw) | Acid generator (pbw) | Basic compound (pbw) | Organic solvent (pbw) | PEB temp. (° C.) | Sensitivity (mJ/cm$^2$) | Resolution (nm) | LWR (nm) |
|---|---|---|---|---|---|---|---|---|---|
| | 18 | Polymer 3 (100) | — | Amine 1 (1.4) | PGMEA (1,000) CyH (2,000) PGME (500) | 80 | 25 | 19 | 3.3 |
| | 19 | Polymer 4 (100) | — | Amine 1 (1.4) | PGMEA (1,000) CyH (2,000) PGME (500) | 85 | 27 | 18 | 3.1 |
| | 20 | Polymer 5 (100) | — | Amine 1 (1.4) | PGMEA (1,000) CyH (2,000) PGME (500) | 75 | 33 | 19 | 3.6 |
| | 21 | Polymer 6 (100) | — | Amine 2 (2.0) | PGMEA (1,000) CyH (2,000) PGME (500) | 75 | 32 | 19 | 3.8 |
| | 22 | Polymer 7 (100) | — | Amine 1 (1.4) | PGMEA (1,000) EL (2,000) | 110 | 36 | 19 | 4.2 |
| | 23 | Polymer 8 (100) | — | Amine 1 (1.4) | PGMEA (1,000) CyH (2,000) PGME (500) | 80 | 31 | 17 | 3.0 |
| | 24 | Polymer 9 (100) | — | Amine 1 (1.4) | PGMEA (1,000) CyH (2,000) PGME (500) | 75 | 35 | 17 | 2.9 |
| | 25 | Polymer 10 (100) | — | Amine 1 (1.4) | PGMEA (1,000) CyH (2,000) PGME (500) | 75 | 36 | 17 | 2.9 |
| | 26 | Polymer 11 (100) | — | Amine 1 (1.4) | PGMEA (1,000) CyH (2,000) PGME (500) | 75 | 34 | 17 | 2.7 |
| | 27 | Polymer 12 (100) | — | Amine 2 (2.0) | PGMEA (1,000) CyH (2,000) PGME (500) | 75 | 36 | 17 | 2.8 |
| | 28 | Polymer 13 (100) | — | Amine 1 (1.4) | PGMEA (1,000) EL (2,000) | 75 | 35 | 17 | 2.8 |

TABLE 2

| | | Polymer (pbw) | Acid generator (pbw) | Basic compound (pbw) | Organic solvent (pbw) | PEB temp. (° C.) | Sensitivity (mJ/cm$^2$) | Resolution (nm) | LWR (nm) |
|---|---|---|---|---|---|---|---|---|---|
| Example | 29 | Polymer 14 (100) | — | Amine 1 (1.4) | PGMEA (1,000) CyH (2,000) PGME (500) | 75 | 32 | 17 | 3.0 |
| | 30 | Polymer 15 (100) | — | Amine 1 (1.4) | PGMEA (1,000) CyH (2,000) PGME (500) | 70 | 33 | 17 | 2.9 |
| | 31 | Polymer 3 (100) | PAG 1 (5) | Amine 2 (2.4) | PGMEA (1,000) CyH (2,000) PGME (500) | 75 | 35 | 17 | 3.0 |
| | 32 | Polymer 3 (100) | PAG 2 (5) | Amine 2 (2.4) | PGMEA (1,000) CyH (2,000) PGME (500) | 75 | 30 | 18 | 3.1 |
| | 33 | Polymer 3 (100) | PAG 3 (5) | Amine 2 (2.4) | PGMEA (1,000) CyH (2,000) PGME (500) | 75 | 29 | 18 | 3.2 |
| Comparative Example | 4 | Comparative Polymer 1 (100) | — | Amine 1 (1.4) | PGMEA (1,000) CyH (2,000) PGME (500) | 85 | no pattern formed | — | — |
| | 5 | Comparative Polymer 2 (100) | — | Amine 1 (1.4) | PGMEA (1,000) CyH (2,000) PGME (500) | 80 | 27 | 20 | 4.5 |
| | 6 | Comparative Polymer 3 (100) | — | Amine 1 (1.4) | PGMEA (1,000) EL (2,000) | 110 | 34 | 20 | 5.0 |

Polymers 1 to 15 which were polymerized in a solution containing a non-polymerizable compound containing at least one nitrogen atom to which an acid labile group is bound could be polymerized to the polymerization ratio just as designed. In Comparative Polymer 1 which was polymerized in a solution containing an amine compound which is not protected with an acid labile group, decomposition of lactone ring occurred. A resist composition using Comparative Polymer 1 failed to form a pattern. In Comparative Polymers 2 and 3, decomposition of the acid generator occurred to a slight extent which was as trace as being undetectable by NMR analysis, the acid was accordingly generated. In Comparative Polymer 2, deprotection of the acid labile group was induced by the heat of polymerization temperature. This accounts for the observation of methacrylic acid generated. In Comparative Polymer 3, formation of olefin from Monomer 2 via dehydration reaction and a molecular weight buildup due to crosslinking reaction occurred, failing in polymerization just as designed. For these reasons, the resist compositions using Comparative Polymers show a lower resolution and a more LWR than the resist compositions of Examples.

Japanese Patent Application No. 2015-021331 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A method for producing a polymer comprising recurring units having an acid generator bound to the backbone, comprising
polymerizing monomers corresponding to the recurring units in a solution of a non-polymerizable compound containing at least one nitrogen atom to which at least one acid labile group is bound.

2. The method of claim 1 wherein the non-polymerizable compound has the formula (A) or (B):

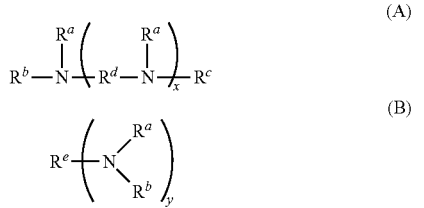
(A)

(B)

wherein $R^a$ is an acid labile group, $R^b$ and $R^c$ are each independently hydrogen, an acid labile group, hydroxyl, a straight, branched or cyclic $C_1$-$C_{20}$ alkoxy, straight, branched or cyclic $C_2$-$C_{20}$ alkoxycarbonyl, straight, branched or cyclic $C_1$-$C_{20}$ alkyl, $C_6$-$C_{20}$ aryl, $C_2$-$C_{20}$ heterocyclic, or straight, branched or cyclic $C_2$-$C_{20}$ alkenyl group, wherein in $R^b$ and $R^c$, at least one carbon-bonded hydrogen atom may be substituted by halogen, hydroxyl, carboxyl, alkoxy, alkoxycarbonyl, acyl, acyloxy, thiol, carbonyl, amino, sulfone, sulfonamide, glycidyl, isocyanate, thioisocyanate, lactone ring, lactam ring, acid anhydride or substituted or unsubstituted boronic acid, and at least one carbon atom may be replaced by an ester, ether, thioether, amide or sulfonyl group, or $R^b$ and $R^e$ may bond together to form a ring, $R^d$ is a single bond or divalent organic group, $R^e$ is a y-valent organic group, x is an integer of 0 to 4, and y is 3 or 4.

3. The method of claim 1 wherein the recurring units having an acid generator bound to the backbone are units of at least one selected from recurring units having the formulae (1) to (3):

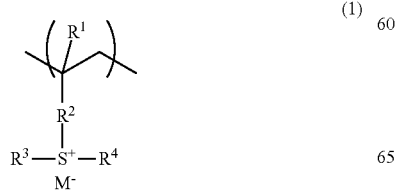
(1)

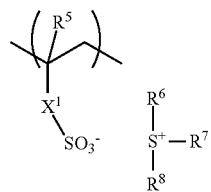
(2)

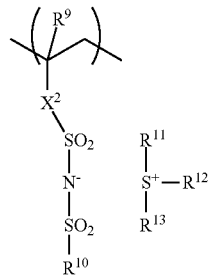
(3)

wherein $R^1$, $R^5$ and $R^9$ are each independently hydrogen or methyl, $R^2$ is a single bond, phenylene, —O—R— or —C(=O)—$Y^0$—R—, $Y^0$ is oxygen or NH, R is a straight, branched or cyclic $C_1$-$C_6$ alkylene, straight, branched or cyclic $C_2$-$C_6$ alkenylene, or phenylene group, wherein R may contain a carbonyl (—CO—), ester (—COO—), ether (—O—), sulfonic acid ester (—OS(O$_2$)—), —NH—S(O$_2$)— or hydroxyl moiety, $R^3$, $R^4$, $R^6$, $R^7$, $R^8$, $R^{11}$, $R^{12}$ and $R^{13}$ are each independently a straight, branched or cyclic $C_1$-$C_{12}$ alkyl group, or a $C_6$-$C_{12}$ aryl, $C_7$-$C_{20}$ aralkyl, or thiophenyl group, wherein the straight, branched or cyclic $C_1$-$C_{12}$ alkyl group may contain a carbonyl, ester or ether moiety, $X^1$ and $X^2$ are each independently a single bond, methylene, ethylene, phenylene, —O—R—, or —C(=O)—$Z^1$—$R^{14}$—, $Z^1$ fluorinated phenylene, 14 is oxygen or NH, $R^{14}$ is a straight, branched or cyclic $C_1$-$C_6$ alkylene, alkenylene, or phenylene group, wherein $R^{14}$ may contain a carbonyl, ester, ether, sulfonic acid ester, sulfonamide or hydroxyl moiety, or which may be fluorinated, $R^{10}$ is a $C_1$-$C_4$ fluoroalkyl or $C_6$-$C_{10}$ fluoroaryl group, and $M^-$ is a non-nucleophilic counter ion.

4. The method of claim 1 wherein the polymer further comprises recurring units of at least one selected from recurring units having a carboxyl group optionally substituted with an acid labile group and recurring units having a hydroxyl group optionally substituted with an acid labile group.

5. The method of claim 4 wherein the recurring units having a carboxyl group optionally substituted with an acid labile group and the recurring units having a hydroxyl group optionally substituted with an acid labile group have the following formulae (4) and (5), respectively,

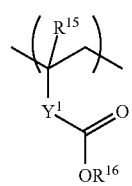
(4)

-continued

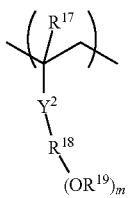

(5)

wherein $R^{15}$ and $R^{17}$ are each independently hydrogen or methyl,
$R^{16}$ and $R^{19}$ are each independently hydrogen or an acid labile group,
$Y^1$ is a single bond, phenylene, naphthylene or —C(=O)—O—$R^{20}$—, $R^{20}$ is a straight, branched or cyclic $C_1$-$C_{10}$ alkylene group, phenylene or naphthylene group, wherein the straight, branched or cyclic $C_1$-$C_{10}$ alkylene group may contain an ether, ester, lactone ring or hydroxyl moiety,
$Y^2$ is a single bond, a phenylene or naphthylene group, or —C(=O)—O—$R^{21}$—, —C(=O)—NH—$R^{21}$—, —O—$R^{21}$—, or —S—$R^{21}$—, wherein the phenylene or naphthylene group may have a nitro, cyano or halogen moiety, $R^{21}$ is a straight, branched or cyclic $C_1$-$C_{10}$ alkylene group, or a phenylene or naphthylene group, wherein the straight, branched or cyclic $C_1$-$C_{10}$ alkylene group may contain an ether, ester, lactone ring or hydroxyl moiety, and wherein the phenylene or naphthylene group may contain a straight, branched or cyclic $C_1$-$C_6$ alkyl, $C_2$-$C_6$ alkenyl, $C_6$-$C_{10}$ aryl, alkoxy, acyl, acyloxy, alkoxycarbonyl, nitro, cyano or halogen moiety,
$R^{18}$ is a single bond, or a straight, branched or cyclic, $C_1$-$C_{16}$, di- to pentavalent, aliphatic hydrocarbon group or phenylene group, wherein $R^{18}$ may contain an ether or ester moiety, and m is an integer of 1 to 4.

6. The method of claim 1 wherein the polymerization is carried out under such illumination that the quantity of light of wavelength up to 400 nm is 0.05 mW/cm² or less.

7. The method of claim 6 wherein the illumination is provided by yellow lamps, LED lamps or organic EL lamps.

* * * * *